US012563879B2

(12) United States Patent
Oh et al.

(10) Patent No.: US 12,563,879 B2
(45) Date of Patent: Feb. 24, 2026

(54) DISPLAY DEVICE

(71) Applicant: SAMSUNG DISPLAY CO., LTD.,
Yongin-si (KR)

(72) Inventors: Won Sik Oh, Yongin-si (KR); Su Mi Moon, Yongin-si (KR); Hyun Min Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 859 days.

(21) Appl. No.: 17/640,311

(22) PCT Filed: Aug. 19, 2020

(86) PCT No.: PCT/KR2020/011060
§ 371 (c)(1),
(2) Date: Aug. 1, 2022

(87) PCT Pub. No.: WO2021/045413
PCT Pub. Date: Mar. 11, 2021

(65) Prior Publication Data
US 2022/0392947 A1      Dec. 8, 2022

(30) Foreign Application Priority Data

Sep. 4, 2019     (KR) ........................ 10-2019-0109595

(51) Int. Cl.
*H10H 29/14*       (2025.01)
*G09G 3/3233*     (2016.01)
(Continued)

(52) U.S. Cl.
CPC ......... *H10H 29/142* (2025.01); *G09G 3/3233* (2013.01); *H10H 20/821* (2025.01);
(Continued)

(58) Field of Classification Search
CPC .. H10H 29/142; H10H 20/821; H10H 20/831; H10H 20/84; H10H 20/857;
(Continued)

(56) References Cited

U.S. PATENT DOCUMENTS 7,894,030 B2     2/2011  Han et al.
9,570,425 B2     2/2017  Do
(Continued)

FOREIGN PATENT DOCUMENTS

CN          101055393 A      10/2007
CN          105378552 A       3/2016
(Continued)

OTHER PUBLICATIONS

International Search Report issued in corresponding Application No. PCT/KR2020/011060 dated Nov. 27, 2020, with English Translation 3pp.
(Continued)

*Primary Examiner* — Robert G Bachner
(74) *Attorney, Agent, or Firm* — Womble Bond Dickinson (US) LLP

(57) ABSTRACT

A display device includes: a first power line configured to transmit a first power supply; a second power line configured to transmit a second power supply; a first connection electrode extending in a first direction and electrically connected to the first power line; a second connection electrode spaced apart from the first connection electrode and electrically connected to the second power line; a first electrode extending from the first connection electrode; a second electrode extending from the second connection electrode and parallel to the first electrode with a distance therebetween; and a plurality of light emitting elements. Each of the plurality of light emitting elements has a first end electrically connected to the first electrode and a second end (Continued)

electrically connected to the second electrode, and each of the first electrode and the second electrode has a bent portion.

20 Claims, 40 Drawing Sheets

(51) Int. Cl.
  *H10H 20/821*       (2025.01)
  *H10H 20/831*       (2025.01)
  *H10H 20/84*        (2025.01)
(52) U.S. Cl.
  CPC .......... *H10H 20/831* (2025.01); *H10H 20/84* (2025.01); *G09G 2300/0426* (2013.01); *G09G 2300/0819* (2013.01); *G09G 2300/0842* (2013.01); *G09G 2330/021* (2013.01)
(58) Field of Classification Search
  CPC .. H10H 20/042; H10H 20/833; G09G 3/3233; G09G 2300/0426; G09G 2300/0819; G09G 2300/0842; G09G 2330/021; H01L 25/0753; G09F 9/33; H10D 86/441; H10D 86/60
  See application file for complete search history.

(56) References Cited

U.S. PATENT DOCUMENTS

| | | | |
|---|---|---|---|
| 9,773,761 | B2 | 9/2017 | Do |
| 10,026,777 | B2 | 7/2018 | Kang et al. |
| 10,249,603 | B2 | 4/2019 | Cho et al. |
| 10,289,252 | B2 | 5/2019 | Cok |
| 10,672,946 | B2 | 6/2020 | Cho et al. |
| 10,797,212 | B2 | 10/2020 | Im et al. |
| 10,949,004 | B2 | 3/2021 | Weber et al. |
| 2016/0211245 | A1* | 7/2016 | Do .......................... H10H 20/84 |
| 2017/0358563 | A1 | 12/2017 | Cho et al. |
| 2019/0012957 | A1 | 1/2019 | Liu et al. |
| 2021/0288220 | A1 | 9/2021 | Oh et al. |

FOREIGN PATENT DOCUMENTS

| | | | |
|---|---|---|---|
| CN | 107509284 | A | 12/2017 |
| CN | 107801416 | A | 3/2018 |
| EP | 2 733 751 | A1 | 5/2014 |
| EP | 3 264 241 | A1 | 1/2018 |
| KR | 10-1436123 | B1 | 11/2014 |
| KR | 10-1490758 | B1 | 2/2015 |
| KR | 10-2017-0141305 | A | 12/2017 |
| KR | 10-2018-0007376 | A | 1/2018 |
| KR | 10-2018-0071465 | A | 6/2018 |
| KR | 10-2019-0042130 | A | 4/2019 |
| KR | 10-2020-0010701 | A | 1/2020 |
| KR | 10-2020-0062458 | A | 6/2020 |
| KR | 10-2020-0105598 | A | 9/2020 |

OTHER PUBLICATIONS

Written Opinion issued in corresponding Application No. PCT/KR2020/011060 dated Nov. 27, 2020, and English Translation, 7pp.

* cited by examiner

FIG. 1A
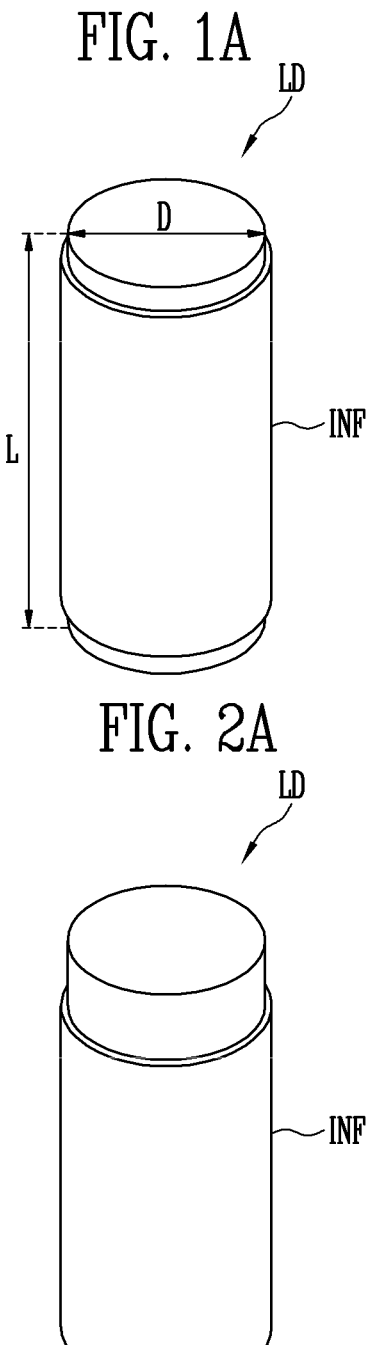
FIG. 1B
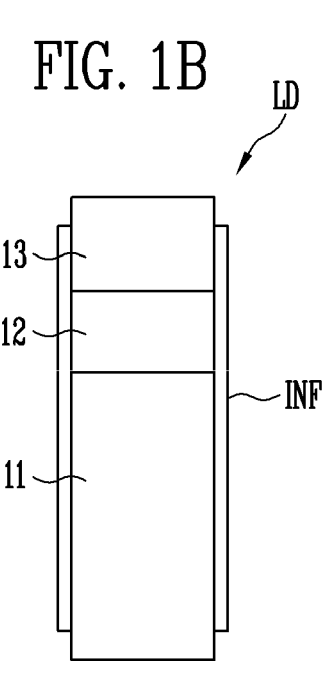
FIG. 2A
FIG. 2B
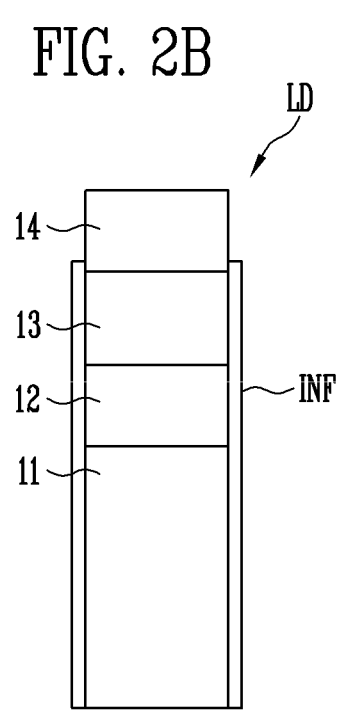

LD

INF

LD

14

13

12

11

INF

SPX1(SPA1)

CH   PW1   CNE1

CNL1

LD
CNE2
PW2

EMA1

CNL2

Figure 23:
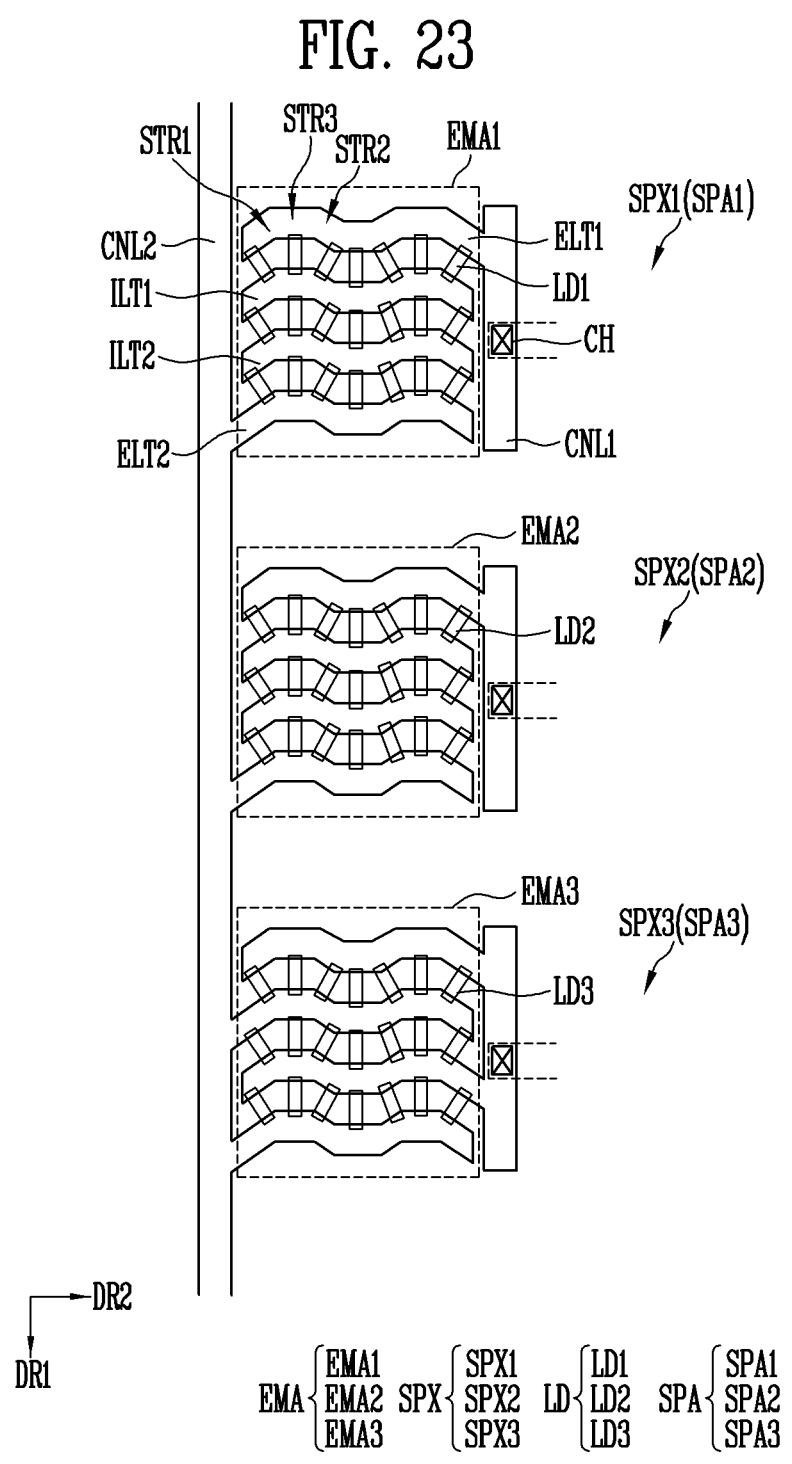

DISPLAY DEVICE

CROSS-REFERENCE TO RELATED APPLICATIONS

This application is a U.S. National Phase Patent Application of International Patent Application Number PCT/KR2020/011060, filed on Aug. 19, 2020, which claims priority to Korean Patent Application Number 10-2019-0109595, filed on Sep. 4, 2019, the entire content of all of which is incorporated herein by reference.

BACKGROUND

1. Field

Aspects of embodiments of the present disclosure relate to a display device.

2. Description of the Related Art

Recently, a technique of manufacturing a subminiature light emitting element using a material having a reliable inorganic crystal structure and manufacturing a light emitting device using the light emitting element has been developed. For example, a technique of providing a light source of a light emitting device by using subminiature light emitting elements having a small size in a range from a nanoscale size to a microscale size has been developed. Such a light emitting device may be used in various electronic devices, such as a display device and a lighting device.

To use a subminiature light emitting element in a lighting device, a display device, etc., the subminiature light emitting element and an electrode configured to apply a power voltage to the subminiature light emitting element need to be connected to each other. Various studies on a disposition relationship between the subminiature light emitting element and the electrode with regard to purposes of application, a reduction in space for the electrode, or a fabrication method have been carried out.

Methods of disposing the subminiature light emitting element and the electrode may be classified into a method of directly growing the subminiature light emitting element on the electrode and a method of separately independently growing the subminiature light emitting element and then disposing the subminiature light emitting element on the electrode. In the latter case, when a light emitting element has a normal size, the light emitting element may be stood vertically and connected to the electrode. However, when the light emitting element is a nanoscale subminiature light emitting element, it is difficult to stand the light emitting element vertically on the electrode.

SUMMARY

Aspects and features of the present disclosure provide a display device having improved alignment of subminiature light emitting elements.

Other aspects and features of the present disclosure provide a display device having an improved view angle.

The present disclosure is not limited to the above-described aspect and features, and other aspect and features will be clearly understood by those skilled in the art from the following description.

A display device according to an embodiment of the present disclosure includes: a first power line configured to transmit a first power supply; a second power line configured to transmit a second power supply; a first connection electrode extending in a first direction and electrically connected to the first power line; a second connection electrode spaced apart from the first connection electrode and electrically connected to the second power line; a first electrode extending from the first connection electrode; a second electrode extending from the second connection electrode and parallel to the first electrode with a distance therebetween; and a plurality of light emitting elements. Each of the plurality of light emitting elements has a first end electrically connected to the first electrode and a second end electrically connected to the second electrode, and each of the first electrode and the second electrode has a bent portion.

The first electrode and the second electrode may extend from the first connection electrode and the second connection electrode, respectively, in a second direction. The second direction may cross the first direction.

The bent portion may have a shape protruding in the first direction.

Each of the first electrode and the second electrode may have a curved shape or a zigzag shape.

Each of the first electrode and the second electrode may have a shape formed by connecting a plurality of quadrant arcs.

Each of the first electrode and the second electrode may have a connection portion having a shape formed by connecting a plurality of quadrant arcs, and an inflection point may be in the connection portion.

Each of the light emitting elements may include a rod-shaped light emitting diode having a size ranging from a nanoscale to a microscale.

At least some of the plurality of light emitting elements may be aligned such that a longitudinal direction thereof corresponds to a normal direction with respect to a direction in which the first electrode and the second electrode extend.

The first electrode or the second electrode may have a portion having a different width.

The display device may further include an island electrode between the first electrode and the second electrode spaced apart from the first connection electrode and the second connection electrode.

Some of the plurality of light emitting elements may be between the first electrode and the island electrode, and others of the plurality of light emitting elements may be between the second electrode and the island electrode.

The island electrode may be parallel to the first electrode and the second electrode and may be spaced apart from the first electrode and the second electrode.

The island electrode may have a bent portion.

The plurality of light emitting elements may be connected to each other in series and parallel.

Each of the first electrode and the second electrode may have a linear portion extending in a second direction. The second direction may cross the first direction.

A display device according to an embodiment of the present disclosure includes: a substrate having an emission area; a first electrode in the emission area of the substrate; a second electrode in the emission area of the substrate on a same layer as the first electrode, facing the first electrode, and spaced apart from the first electrode; and a plurality of light emitting elements between the first electrode and the second electrode in a plan view. Each of the first electrode and the second electrode has a bent portion in a plan view.

The display device may further include: a first contact electrode connecting a first end of each of the light emitting elements to the first electrode; and a second contact electrode connecting a second end of each of the light emitting elements to the second electrode.

The display device may further include a first island electrode and a second island electrode between the first electrode and the second electrode. Distances between the first electrode, the first island electrode, the second island electrode, and the second electrode may be equal to each other.

The first electrode, the first island electrode, the second island electrode, and the second electrode may be parallel with each other.

Each of the first island electrode and the second island electrode may have a bent portion.

Additional details of various embodiments are included in the detailed descriptions and drawings.

In a display device according to embodiments of the present disclosure, alignment of subminiature light emitting elements may be improved and a viewing angle may be improved.

The aspects and features of the present disclosure are not limited by the foregoing and other various aspects and features are described herein or would be understood by one of ordinary skill in the relevant art.

BRIEF DESCRIPTION OF THE DRAWINGS

FIGS. 1A and 1B are, respectively, a perspective view and a sectional view illustrating a light emitting element according to an embodiment of the present disclosure.

FIGS. 2A and 2B are, respectively, a perspective view and a sectional view illustrating a light emitting element according to an embodiment of the present disclosure.

FIGS. 6A to 6D are circuit diagrams illustrating examples of a unit pixel included in the sub-pixel shown in FIG. 5.

FIGS. 9A to 9D are sectional views illustrating examples of the unit pixel taken along the line I-I' of FIG. 8.

FIG. 10 is a plan view illustrating an example of the sub-pixel included in the display device shown in FIG. 4.

Figure 20B:
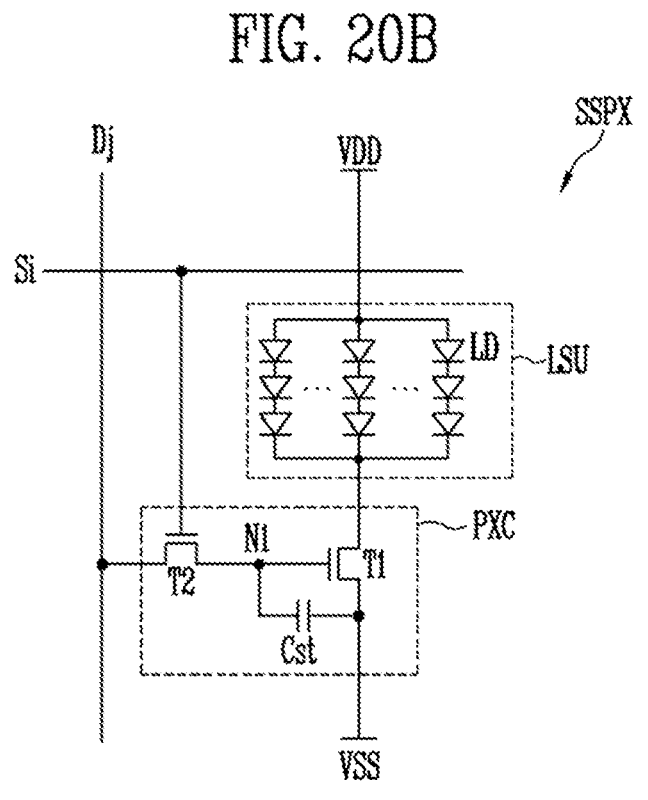

FIGS. 20A to 20D are circuit diagrams illustrating an example of the unit pixel included in the sub-pixel shown in FIG. 5.

FIGS. 21 to 30 are plan views illustrating various examples of the sub-pixel (or the unit pixel) to which the examples shown in FIGS. 20a to 20d may be applied.

DETAILED DESCRIPTION

Figure 3A:
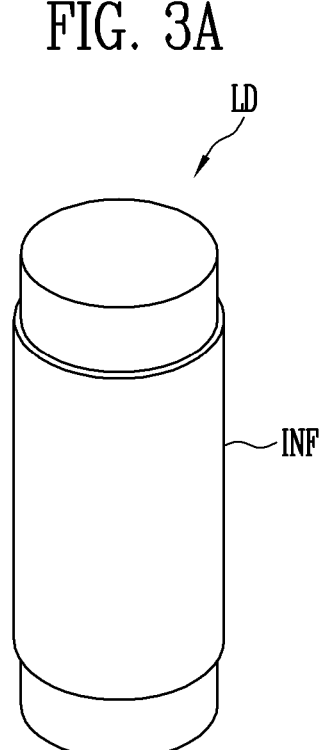
FIGS. 3A and 3B are, respectively, a perspective view and a sectional view illustrating a light emitting element according to an embodiment of the present disclosure.

Aspects and features of the present disclosure, and methods for achieving the same, will be described with reference to embodiments described in detail together with the accompanying drawings. The present disclosure may, however, be embodied in many different forms and should not be construed as being limited to the embodiments set forth herein. Rather, these embodiments are provided so that this disclosure will be thorough and complete and will fully convey the present disclosure to those skilled in the art. The present disclosure shall be defined by the appended claims and their equivalents.

It will be understood that when an element or layer is referred to as being "on" another element or layer, it can be directly on, connected to, or coupled to the other element or layer or one or more intervening elements or layers may be present. Like reference numerals refer to like elements throughout.

In the figures, dimensions of the various elements, layers, etc. may be exaggerated for clarity of illustration. As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present disclosure.

The terminology used herein is for the purpose of describing particular example embodiments of the present disclosure and is not intended to be limiting of the described example embodiments of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Hereinafter, embodiments of the present disclosure will be described in detail with reference to the accompanying drawings.

FIGS. 1A and 1B are, respectively, a perspective view and a sectional view illustrating a light emitting element according to an embodiment of the present disclosure. Although a rod-type light emitting element LD having a cylindrical shape is illustrated in FIGS. 1A and 1B, the type and/or shape of the light emitting element LD according to the present disclosure are not limited thereto.

Referring to FIGS. 1A and 1B, the light emitting element LD may include a first conductive semiconductor layer 11, a second conductive semiconductor layer 13, and an active layer 12 interposed between the first and second conductive semiconductor layers 11 and 13. For example, the light emitting element LD may be configured as a stacked body formed by successively stacking the first conductive semiconductor layer 11, the active layer 12, and the second conductive semiconductor layer 13 in one direction.

In an embodiment, the light emitting element LD may be provided in the form of a rod extending in one direction. The light emitting element LD may have one end and a remaining end (e.g., an opposite end) with respect to the one direction.

In an embodiment, one of the first and second conductive semiconductor layers 11 and 13 may be disposed on the one end of the light emitting element LD, and the other of the first and second conductive semiconductor layers 11 and 13 may be disposed on the remaining end of the light emitting element LD.

In an embodiment, the light emitting element LD may be a rod-type light emitting diode manufactured in the form of a rod. Here, the term "rod-like shape" may indicate a rod-like shape and a bar-like shape, such as a cylindrical shape and a prismatic shape that is longer in a longitudinal direction than in a width direction (i.e., having an aspect ratio greater than 1), and the cross-sectional shape thereof is not limited to a particular shape. For example, the length L of the light emitting element LD may be greater than a diameter D thereof (or a width of the cross-section thereof).

In an embodiment, the light emitting element LD may have a small size ranging from the nanoscale to the microscale, for example, may have a diameter D and/or a length L ranging from the nanoscale to the microscale. However, the size of the light emitting element LD is not limited to this. For example, the size of the light emitting element LD may be changed in various ways depending on design conditions of various devices, such as a display device that employs, as a light source, a light emitting device using a light emitting element LD.

The first conductive semiconductor layer 11 may include at least one n-type semiconductor layer. For instance, the first conductive semiconductor layer 11 may include an n-type semiconductor layer including one semiconductor material of InAlGaN, GaN, AlGaN, InGaN, AlN, and InN and that is doped with a first conductive dopant, such as Si, Ge, or Sn. However, the material of (or for forming) the first conductive semiconductor layer 11 is not limited to these examples, and various other suitable materials may be used to form the first conductive semiconductor layer 11.

The active layer 12 may be disposed on the first conductive semiconductor layer 11 and may have a single or multiple quantum well structure. In an embodiment, a cladding layer doped with a conductive dopant may be formed over and/or under the active layer 12. For example, the cladding layer may be an AlGaN layer or an InAlGaN layer. In an embodiment, a material such as AlGaN or AlInGaN may be used to form the active layer 12, but various other suitable materials may be used to form the active layer 12.

If a voltage of a threshold voltage or more is applied to the opposite ends of the light emitting element LD, the light emitting element LD may emit light by the coupling of electron-hole pairs in the active layer 12. Because light emission of the light emitting element LD can be controlled based on the foregoing principle, the light emitting element LD may be used as a light source of various light emitting devices, as well as a pixel of the display device.

The second conductive semiconductor layer 13 may be disposed on the active layer 12 and may include a semiconductor layer having a type different from that of the first conductive semiconductor layer 11. For example, the second conductive semiconductor layer 13 may include at least one p-type semiconductor layer. For instance, the second conductive semiconductor layer 13 may include a p-type semiconductor layer including any one semiconductor material of InAlGaN, GaN, AlGaN, InGaN, AlN, and InN and that is doped with a second conductive dopant, such as Mg. However, the material of (or for forming) the second conductive semiconductor layer 13 is not limited to these examples, and the second conductive semiconductor layer 13 may be formed of various other suitable materials.

In an embodiment, the light emitting element LD may further include an insulating film INF provided on the surface of the light emitting element LD. The insulating film INF may be formed on the surface of the light emitting element LD to enclose an outer circumferential surface of at least the active layer 12 and may further enclose one area of each the first and second conductive semiconductor layers 11 and 13. The insulating film INF may allow the opposite ends of the light emitting element LD, which have different polarities, to be exposed to the outside. For example, the insulating film INF may expose one end of each of the first and second conductive semiconductor layers 11 and 13 that are disposed on the respective opposite ends of the light emitting element LD with respect to the longitudinal direction (e.g., may expose two surfaces, such as. upper and lower surfaces, of the cylindrical light emitting element LD rather than covering them).

In an embodiment, the insulating film INF may include at least one insulating material of silicon dioxide ($SiO_2$), silicon nitride ($Si_3N_4$), aluminum oxide ($Al_2O_3$), and titanium dioxide ($TiO_2$), but it is not limited thereto. For example, the material that forms the insulating film INF is not limited to a particular material, and the insulating film INF may be formed of other well-known, suitable insulating materials.

In an embodiment, the light emitting element LD may further include additional other components as well as the first conductive semiconductor layer 11, the active layer 12, the second conductive semiconductor layer 13, and/or the insulating film INF. For example, the light emitting element LD may further include one or more fluorescent layers, one or more active layers, one or more semiconductor layers, and/or one or more electrode layers disposed on one end of the first conductive semiconductor layer 11, the active layer 12, and/or the second conductive semiconductor layer 13.

Figure 3B:
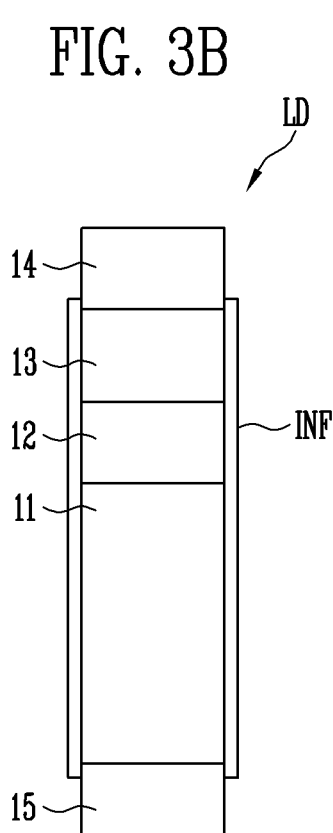

FIGS. 2A and 2B are, respectively, a perspective view and a sectional view illustrating a light emitting element according to an embodiment of the present disclosure. FIGS. 3A and 3B are, respectively, a perspective view and a sectional view illustrating a light emitting element according to an embodiment of the present disclosure.

Referring to FIGS. 2A and 2B, the light emitting element LD may further include at least one electrode layer 14 disposed on one end of the second conductive semiconductor layer 13.

Referring to FIGS. 3A and 3B, the light emitting element LD may further include at least one electrode layer 15 disposed on one end of the first conductive semiconductor layer 11.

Each of the electrode layers 14 and 15 may be an ohmic contact electrode, but they are not limited thereto. Furthermore, each of the electrode layers 14 and 15 may include metal or conductive metal oxide. For example, each of the electrode layers 14 and 15 may be formed of transparent electrode materials, such as chromium (Cr), titanium (Ti), aluminum (Al), gold (Au), nickel (Ni), oxides, or alloys thereof, indium tin oxide (ITO), indium zinc oxide (IZO), zinc oxide (ZnO), or indium tin zinc oxide (ITZO), alone or in combination. The electrode layers 14 and 15 may be substantially transparent or semitransparent. Thereby, light generated from the light emitting element LD may be emitted to the outside after passing through the electrode layers 14 and 15.

In an embodiment, the insulating film INF may at least partially enclose (e.g., may at least partially surround or extend around) the outer surfaces of the electrode layers 14 and 15 or may not enclose them. For example, the insulating film INF may be selectively formed on the surfaces of the electrode layers 14 and 15. Furthermore, the insulating film INF may be formed to expose the opposite ends of the light emitting element LD that have different polarities, for example, may expose at least one area of each of the electrode layers 14 and 15. However, the present disclosure is not limited thereto, and the insulating film INF may be omitted.

When the insulating film INF is provided on the surface of the light emitting element LD, for example, on the surface of the active layer 12, the active layer 12 may be prevented from short-circuiting with an electrode, such as at least one contact electrode from among contact electrodes connected to the opposite ends of the light emitting element LD, etc. Consequently, the electrical stability of the light emitting element LD may be secured.

Furthermore, the insulating film INF may be formed on the surface of the light emitting element LD, thus reducing or minimizing surface defects in the light emitting element LD and improving the lifespan and efficiency of the light emitting element LD. Moreover, the insulating film INF may be formed on the light emitting element LD, thus preventing an undesired short circuit between the light emitting elements LD from occurring even when multiple light emitting elements LD are arranged in close proximity to each other.

In an embodiment, the light emitting element LD may be manufactured through a surface treatment process (e.g., coating). For example, when the plurality of light emitting elements LD are mixed with fluid solution (or solvent) to be supplied to each light emitting area (e.g., the light emitting area of each pixel), the light emitting elements LD may be uniformly dispersed without being non-uniformly aggregated in the solution. The light emitting area is an area in which light is emitted by the light emitting elements LD. The light emitting area may be distinguished from a non-emission area in which light is not emitted.

In some embodiments, the insulating film INF itself may be a hydrophobic film including (or using) hydrophobic material or an additional hydrophobic film formed of the hydrophobic material may be formed on the insulating film INF. In an embodiment, the hydrophobic material may be a material including (or containing) fluorine to exhibit hydrophobicity. In an embodiment, the hydrophobic material may be applied to the light emitting elements LD in the form of a self-assembled monolayer (SAM). In such an embodiment, the hydrophobic material may include octadecyl trichlorosilane, fluoroalkyl trichlorosilane, perfluoroalkyl triethoxysilane, etc. Furthermore, the hydrophobic material may be a commercially available fluorine containing material, such as Teflon™ (a registered trademark of The Chemours Company FC, LLC), Cytop™ (a registered trademark of Cytec Technology Corp.), or a corresponding material.

A light emitting device including the light emitting element LD described above may be used in various devices, including a display device which includes a light source. For instance, at least one subminiature light emitting element LD having (e.g., a plurality of subminiature light emitting elements LD each having) a size ranging from the nanoscale to the microscale may be disposed in each pixel area of the display panel to form a light source (or a light source unit) of the corresponding pixel by using the subminiature light emitting elements LD. Furthermore, the field of application of the light emitting element LD according to the present disclosure is not limited to a display device. For example, the light emitting element LD may also be used in other types of devices, such as a lighting device that includes a light source.

Figure 4:
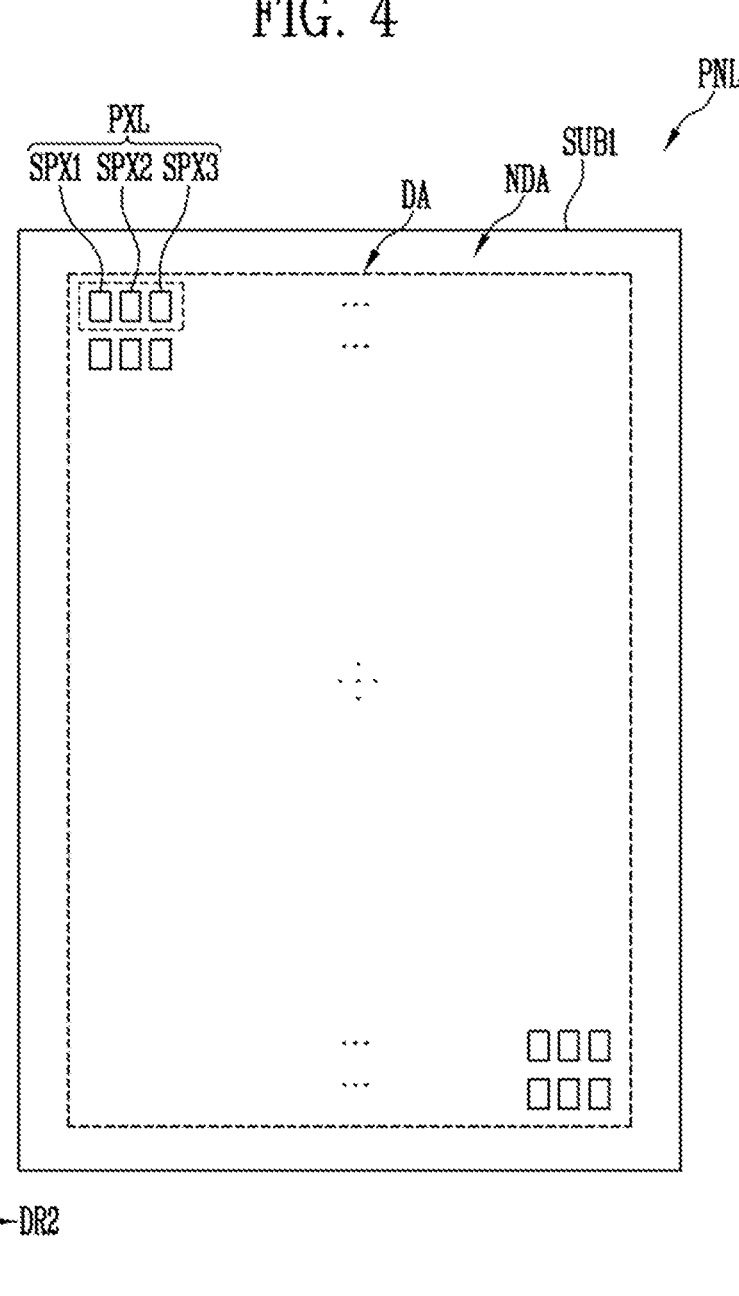
FIG. 4 is a plan view illustrating a display device according to an embodiment of the present disclosure.

FIG. 4 is a plan view illustrating a display device according to an embodiment of the present disclosure. FIG. 4 illustrates a display device and a display panel PNL provided in the display device as an example of a device which may use, as a light source, the light emitting elements LD described with reference to FIGS. 1A to 3B. The embodiment illustrated in FIG. 4, however, illustrates the structure of the display panel PNL with particular focus on a display area DA thereof. In some embodiments, at least one driving circuit component (e.g., at least one of a scan driver and a data driver) and/or a plurality of lines may be further provided on the display panel PNL.

Referring to FIG. 4, the display panel PNL may include a base layer (or substrate) SUB1 and a pixel PXL disposed on the base layer SUB1. For example, the display panel PNL and the base layer SUB1 may have a display area DA configured to display an image and a non-display area NDA other than the display area DA.

In an embodiment, the display area DA may be disposed in a central area of the display panel PNL, and the non-display area NDA may be disposed along a border of the display panel PNL in such a way as to enclose (e.g., to surround a periphery of) the display area DA. The locations of the display area DA and the non-display area NDA are not limited to this, and the locations thereof may be changed.

The base layer SUB1 may form a base of the display panel PNL. For example, the base layer SUB1 may form a base of a lower panel (e.g., a lower plate of the display panel PNL).

In an embodiment, the base layer SUB1 may be a rigid or flexible substrate, and the material or properties thereof are not particularly limited. For example, the base layer SUB1 may be a rigid substrate including (or made of) glass or reinforced glass or a flexible substrate formed of a thin film including (or made of) plastic or metal. Furthermore, the base layer SUB1 may be a transparent substrate, but it is not limited thereto. For instance, the base layer SUB1 may be a translucent substrate, an opaque substrate, or a reflective substrate.

An area of the base layer SUB1 is defined as the display area DA in which the pixels PXL are disposed, and the other area thereof is defined as the non-display area NDA. For example, the base layer SUB1 may include the display area DA including a plurality of pixel areas on which the pixels PXL are formed and the non-display area NDA disposed around the display area DA. Various lines and/or internal circuits, which are connected to the pixels PXL in the display area DA, may be disposed in the non-display area NDA.

The pixel PXL may include at least one light emitting element LD (e.g., at least one rod-type light emitting diode) according to any one of embodiments shown in FIGS. 1A to 3B, which is driven by a corresponding scan signal and a corresponding data signal. For example, the pixel PXL may include a plurality of rod-type light emitting diodes, each of which has a small size ranging from the nanoscale to the microscale and which are connected parallel to each other. The plurality of rod-type light emitting diodes may form a light source of the pixel PXL.

Furthermore, the pixel PXL may include a plurality of sub-pixels. For example, the pixel PXL may include a first sub-pixel SPX1, a second sub-pixel SPX2, and a third sub-pixel SPX3. In an embodiment, the first, second, and third sub-pixels SPX1, SPX2, and SPX3 may emit different color light. For instance, the first sub-pixel SPX1 may be a red sub-pixel for emitting red light, the second sub-pixel SPX2 may be a green sub-pixel for emitting green light, and the third sub-pixel SPX3 may be a blue sub-pixel for emitting blue light. However, the colors, types, and/or number of sub-pixels forming each pixel PXL are not particularly limited. For example, the color of light emitted from each sub-pixel may be changed in various suitable ways. Although the embodiment illustrated in FIG. 4 includes the pixels PXL arranged in the display area DA in a stripe shape, the present disclosure is not limited thereto. For example, the pixels PX may be arranged in various known pixel array forms.

In embodiments, each of the sub-pixels SPX1, SPX2, and SPX3 may include a plurality of unit pixels.

Figure 5:
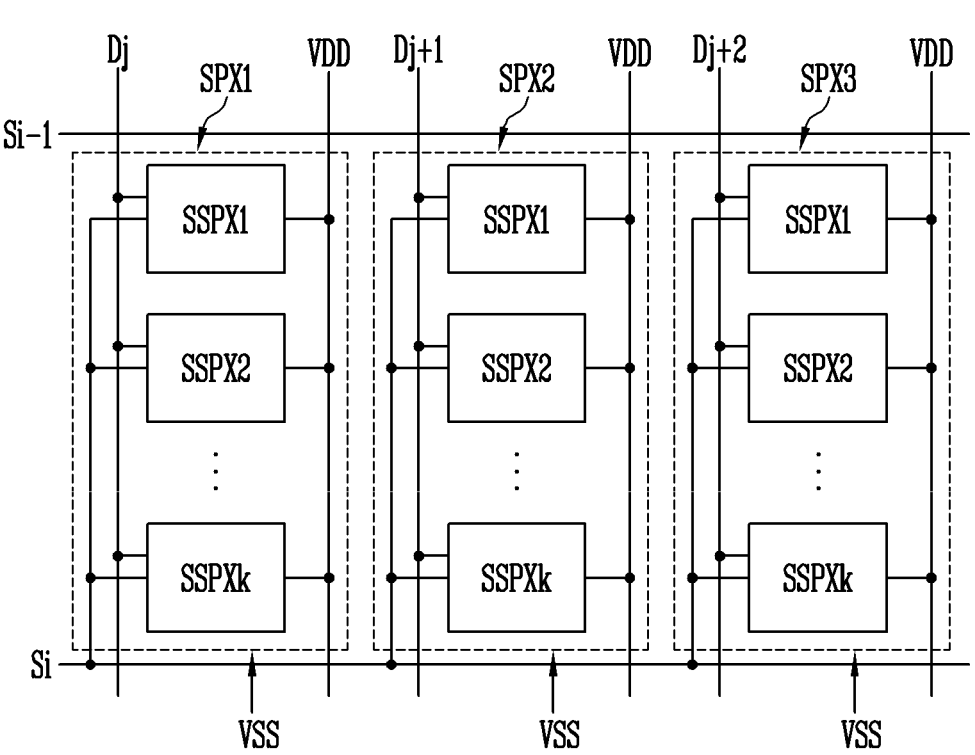
FIG. 5 is a circuit diagram illustrating an example of a sub-pixel included in the display device shown in FIG. 4.

FIG. 5 is a circuit diagram illustrating an example of a sub-pixel included in the display device of FIG. 4. FIG. 5 illustrates the first to third sub-pixels SPX1, SPX2, and SPX3 included in the display device shown in FIG. 4. Because the first to third sub-pixels SPX1, SPX2, and SPX3 are substantially equal to each other than that the first to third sub-pixels SPX1, SPX2, and SPX3 are connected to corresponding data lines Dj, Dj+1, and Dj+2, respectively, the first to third sub-pixels SPX1, SPX2, and SPX3 will be described based on the first sub-pixel SPX1.

The first to third sub-pixels SPX1, SPX2, and SPX3 may be disposed in areas, respectively, which are partitioned by scan lines Si−1 and Si (i is a positive integer) and data lines Dj, Dj+1, and Dj+2 (j is a positive integer). For example, the first sub-pixel SPX1 may be disposed in an area defined by i−1-th and i-th scan lines Si−1 and Si and j-th and j+1-th data lines Dj and Dj+1. However, the arrangement of the first to third sub-pixels SPX1, SPX2, and SPX3 is not limited thereto.

The first sub-pixel SPX1 may be connected to the scan line Si and the data line Dj and may also be connected to a first power line and a second power line. A first power supply VDD may be applied to the first power line, and a second power supply VSS may be applied to the second power line. Each of the first and second power lines may be a common line connected to the plurality of sub-pixels. The first and second power supplies VDD and VSS may have different potentials to allow the first sub-pixel SPX1 to emit light. The first power supply VDD may have a voltage level higher than that of the second power supply VSS.

In embodiments, the first sub-pixel SPX1 may include at least one unit pixel SSPX1 to SSPXk (k is a natural number).

Each of the unit pixel SSPX1 to SSPXk may be connected to the scan line Si and the data line Dj and may also be connected to the first power line and the second power line. Each of the unit pixels SSPX1 to SSPXk may emit light having a luminance corresponding to a data signal transmitted through the data line Dj in response to a scan signal transmitted through the scan line Si. The unit pixels SSPX1 to SSPXk may include substantially the same pixel structure or pixel circuit.

For example, the first sub-pixel SPX1 may include unit pixels SSPX1 to SSPXk that independently emit light in response to one scan signal and one data signal.

In an embodiment, each of the unit pixels SSPX1 to SSPXk (or the sub-pixels SPX1 to SPX3) may be formed of an active pixel. However, the types, structures, and/or driving schemes of the unit pixels capable of being applied to the display device according to the present disclosure are not particularly limited. For example, the unit pixel may be formed of a pixel of the display device having various suitable passive or active structures.

FIGS. 6A to 6D are circuit diagrams illustrating an example of the unit pixel included in the sub-pixel shown in FIG. 5.

Figure 6A:
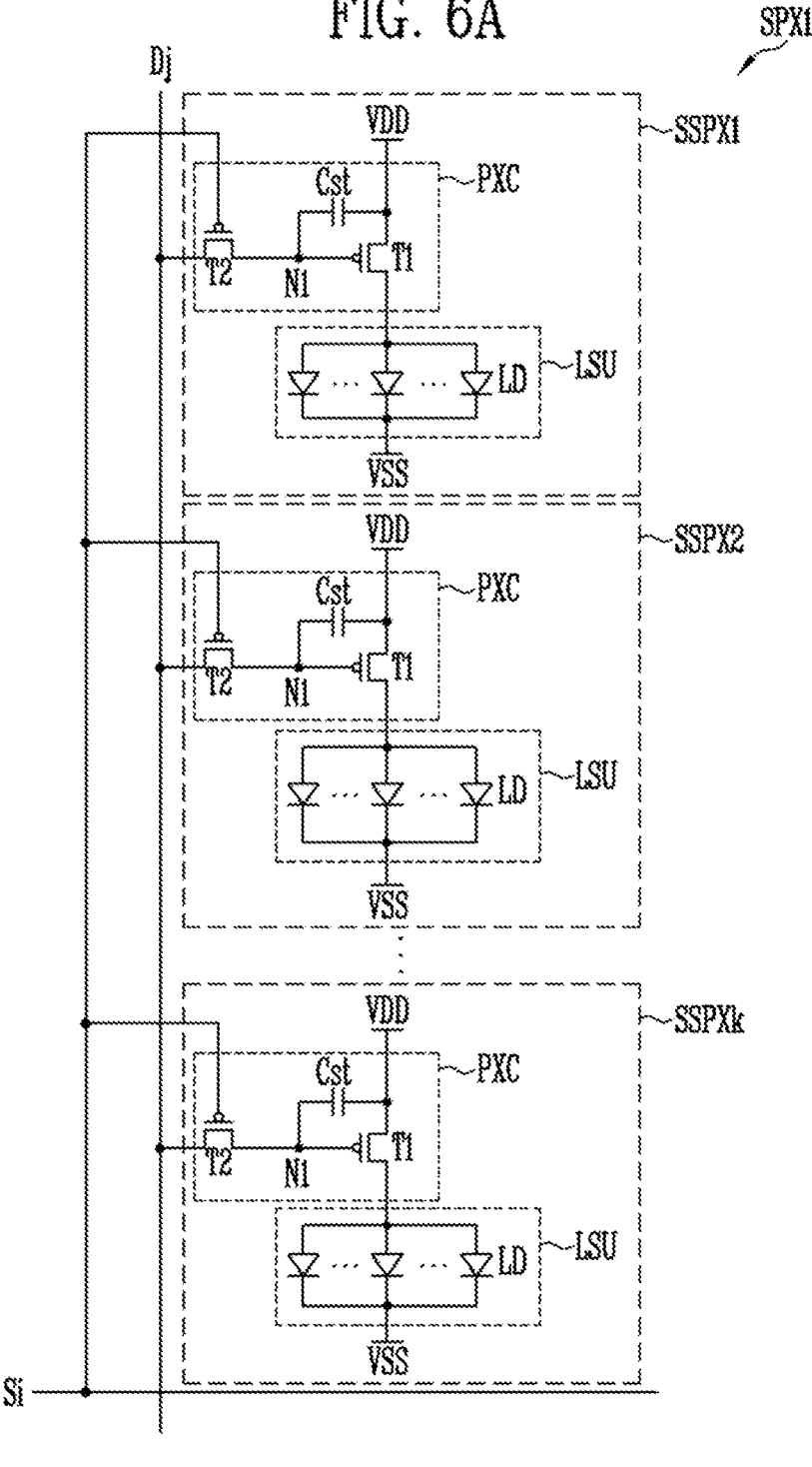

The first to k-th unit pixels SSPX1 to SSPXk shown in FIG. 6A may have a substantially identical or similar structure. The unit pixel SSPX shown in FIGS. 6B to 6D may be any one of the first to k-th unit pixels SSPX1 to SSPXk provided in the first sub-pixel SPX1 shown in FIG. 6A. Therefore, in descriptions of FIGS. 6A to 6D, the first to k-th unit pixels SSPX1 to SSPXk will be collectively referred to as the "unit pixel SSPX".

First, referring to FIG. 6A, the unit pixel SSPX may include a light source unit LSU that emits light having a luminance corresponding to a data signal. The unit pixel SSPX may further include (e.g., may selectively further include) a pixel circuit PXC configured to drive the light source unit LSU.

In an embodiment, the light source unit LSU may include a plurality of light emitting elements LD that are electrically connected to each other between the first power supply VDD and the second power supply VSS. In an embodiment, the light emitting elements LD may be connected to each other in parallel, but the present disclosure is not limited thereto. For example, a plurality of light emitting elements LD may be connected to each other in a series/parallel combination structure between the first power supply VDD and the second power supply VSS.

The first and second power supplies VDD and VSS may have different potentials to allow the light emitting elements LD to emit light. For example, the first power supply VDD may be set as a high-potential power supply, and the second power supply VSS may be set as a low-potential power supply. A difference in potential between the first and second power supplies VDD and VSS may be (e.g., may be set to)

a threshold voltage of the light emitting elements LD or more at least during a light emitting period of the unit pixel SSPX (or of the first sub-pixel SPX1).

Although the embodiment illustrated in FIG. 6A shows that the light emitting elements LD are connected in parallel in the same direction (e.g., in a forward direction) between the first power supply VDD and the second power supply VSS, the present disclosure is not limited thereto. For example, some of the light emitting elements LD may be connected to each other in the forward direction between the first and second power supplies VDD and VSS to provide respective valid (e.g., operable) light sources, and the other light emitting elements LD may be connected to each other in the reverse direction. In other embodiments, the unit pixel SSPX may include only a single light emitting element LD (e.g., a single valid light source connected in the forward direction between the first and second power supplies VDD and VSS).

According to an embodiment, one end of each of the light emitting elements LD may be connected in common to a corresponding pixel circuit PXC through a first electrode and may be connected to the first power supply VDD through the pixel circuit PXC and the first power line. A remaining end (e.g., the opposite end) of each of the light emitting elements LD may be connected in common to the second power supply VSS through a second electrode and the second power supply line.

The light source unit LSU may emit light having a luminance corresponding to driving current supplied thereto through the corresponding pixel circuit PXC. Hence, an image (e.g., a predetermined image) may be displayed on the display area DA (see, e.g., FIG. 4).

The pixel circuit PXC may be connected to the scan line Si and the data line Dj of the corresponding sub-pixel (e.g., the first sub-pixel SPX1). For example, when the first sub-pixel SPX1 is disposed on an i-th row and a j-th column in the display area DA, the pixel circuit PXC of the unit pixel SSPX may be connected to the i-th scan line Si and the j-th data line Dj in the display area DA.

The pixel circuit PXC may include first and second transistors T1 and T2 and a storage capacitor Cst.

The first transistor (or driving transistor) T1 may be connected between the first power supply VDD and the light source unit LSU. A gate electrode of the first transistor T1 may be connected to a first node N1. The first transistor T1 may control driving current to be supplied to the light source unit LSU in response to a voltage of the first node N1.

The second transistor (or switching transistor) T2 may be connected between the data line Dj and the first node N1. A gate electrode of the second transistor T2 may be connected to the scan line Si.

In response to a scan signal of a gate-on voltage (e.g., a low voltage) supplied from the scan line Si, the second transistor T2 may be turned on to electrically connect the first node N1 to the data line Dj.

During each frame period, a data signal of a corresponding frame may be supplied to the data line Dj. The data signal may be transmitted to the first node N1 via the second transistor T2. Thereby, a voltage corresponding to the data signal may be charged to the storage capacitor Cst.

A first electrode of the storage capacitor Cst may be connected to the first power supply VDD, and a second electrode thereof may be connected to the first node N1. The storage capacitor Cst may charge a voltage corresponding to a data signal supplied to the first node N1 during each frame period and may maintain the charged voltage until a data signal of a subsequent frame is supplied.

Although the embodiment shown in FIG. 6A has all of the transistors (e.g., the first and second transistors T1 and T2) in the pixel circuit PXC being P-type transistors, the present disclosure is not limited to this. For example, at least one of the first and second transistors T1 and T2 may be changed to an N-type transistor.

Figure 6B:
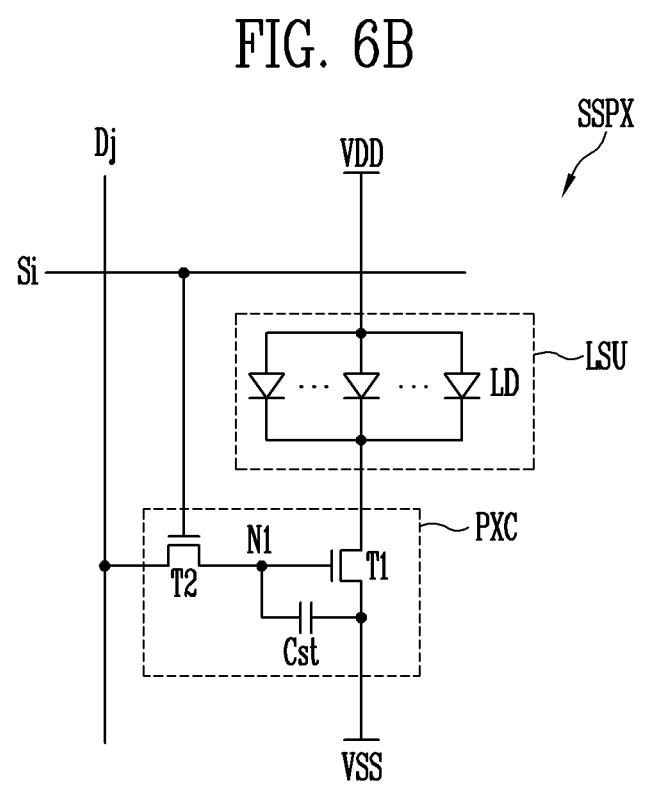

For instance, as shown in FIG. 6B, both the first and second transistors T1 and T2 may be formed of N-type transistors. In such an embodiment, during each frame period, a gate-on voltage of a scan signal for writing a data signal supplied to the data line Dj in the unit pixel SSPX may be a high level voltage. Similarly, a voltage of a data signal for turning on the first transistor T1 may be a voltage having a waveform opposite to that of the embodiment shown in FIG. 6A. For example, in the embodiment shown in FIG. 6B, as a gray scale value to be expressed increases, the voltage level of a data signal to be supplied may increase.

The unit pixel SSPX illustrated in FIG. 6B is substantially similar in configuration and operation to the unit pixel SSPX shown in FIG. 6A except that the connection positions of some circuit elements and the voltage levels of control signals (e.g., a scan signal and a data signal) are changed according to a change in type of the transistor. Therefore, detailed descriptions of the unit pixel SSPX shown in FIG. 6B will be omitted.

The structure of the pixel circuit PXC is not limited to the embodiments illustrated in FIGS. 6A and 6B. For example, the pixel circuit PXC may be formed of a well-known pixel circuit and may have various structures and/or may be operated by various driving schemes. For example, the pixel circuit PXC may be configured in the same manner as that of an embodiment illustrated in FIG. 6C, described below.

Figure 6C:
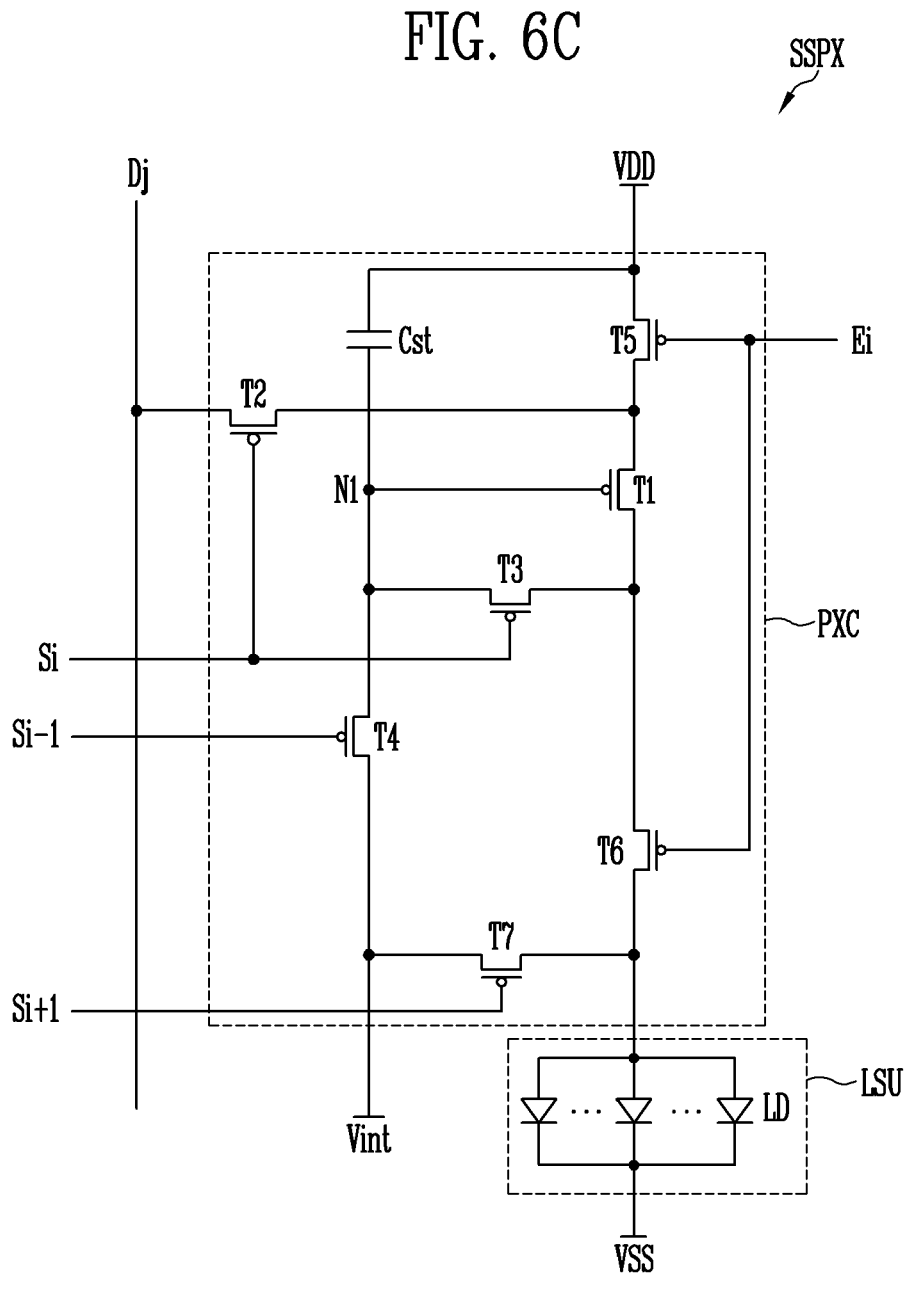

Referring to FIG. 6C, the pixel circuit PXC may be connected not only to a corresponding scan line Si but also to at least another scan line (or a control line). For example, the pixel circuit PXC of the sub-pixel SPX (or of the unit pixel SSPX included therein) disposed on the i-th row in the display area DA may be further connected to an i−1-th scan line Si−1 and/or an i+1-th scan line Si+1. In an embodiment, the pixel circuit PXC may be connected not only to the first and second power supplies VDD and VSS but also to other power supplies. For example, the pixel circuit PXC may also be connected to an initialization power supply Vint.

In an embodiment, the pixel circuit PXC may include first to seventh transistors T1 to T7 and a storage capacitor Cst.

The first transistor T1 may be connected between the first power supply VDD and the light source unit LSU. A first electrode (e.g., a source electrode) of the first transistor T1 may be connected to the first power supply VDD through the fifth transistor T5, and a second electrode (e.g., a drain electrode) of the first transistor T1 may be connected via the sixth transistor T6 to one electrode of the light source unit LSU (e.g., the first electrode of the corresponding sub-pixel SPX). A gate electrode of the first transistor T1 may be connected to the first node N1. The first transistor T1 may control driving current to be supplied to the light source unit LSU in response to a voltage of the first node N1.

The second transistor T2 may be connected between the data line Dj and the first electrode of the first transistor T1. A gate electrode of the second transistor T2 may be connected to the corresponding scan line Si. When a scan signal having a gate-on voltage is supplied from the scan line Si, the second transistor T2 may be turned on to electrically connect the data line Dj to the first electrode of the first transistor T1. When the second transistor T2 is turned on, a data signal supplied from the data line Dj may be transmitted to the first transistor T1.

The third transistor T3 may be connected between the second electrode (e.g., the drain electrode) of the first transistor T1 and the first node N1. A gate electrode of the third transistor T3 may be connected to the corresponding scan line Si. When a scan signal of a gate-on voltage is supplied from the scan line Si, the third transistor T3 may be turned on to connect the first transistor T1 in the form of a diode.

The fourth transistor T4 may be connected between first node N1 and an initialization power supply Vint. A gate electrode of the fourth transistor T4 may be connected to a previous scan line (e.g., an i−1-th scan line Si−1). When a scan signal of a gate-on voltage is supplied to the i−1-th scan line Si−1, the fourth transistor T4 may be turned on so that the voltage of the initialization power supply Vint may be transmitted to the first node N1. The voltage of the initialization power supply Vint may be a minimum voltage of a data signal or less.

The fifth transistor T5 may be connected between the first power supply VDD and the first transistor T1. A gate electrode of the fifth transistor T5 may be connected to a corresponding emission control line (e.g., an i-th emission control line Ei). The fifth transistor T5 may be turned off when an emission control signal having a gate-off voltage (e.g., a high voltage) is supplied to the emission control line Ei and may be turned on in other cases.

The sixth transistor T6 may be connected between the first transistor T1 and the first electrode of the light source unit LSU. A gate electrode of the sixth transistor T6 may be connected to a corresponding emission control line (e.g., the i-th emission control line Ei). The sixth transistor T6 may be turned off when an emission control signal of a gate-off voltage is supplied to the emission control line Ei and may be turned on in other cases.

The seventh transistor T7 may be connected between the first electrode of the light source unit LSU and the initialization power supply Vint (or a third power line configured to transmit initialization power). A gate electrode of the seventh transistor T7 may be connected to any one of scan lines of a subsequent stage (e.g., to the i+1-th scan line Si+1). When a scan signal of a gate-on voltage is supplied to the i+1-th scan line Si+1, the seventh transistor T7 may be turned on so that the voltage of the initialization power supply Vint may be supplied to the first electrode of the light source unit LSU. In such an embodiment, during each initialization period in which the voltage of the initialization power supply Vint is transmitted to the light source unit LSU, the voltage of the first electrode of the light source unit LSU may be initialized.

The control signal for controlling the operation of the seventh transistor T7 may be variously changed. For example, the gate electrode of the seventh transistor T7 may be connected to a scan line of a corresponding horizontal line (e.g., an i-th scan line Si). When a scan signal having a gate-on voltage is supplied to the i-th scan line Si, the seventh transistor T7 may be turned on so that the voltage of the initialization power supply Vint may be supplied to the first electrode of the light source unit LSU.

The storage capacitor Cst may be connected between the first power supply VDD and the first node N1. The storage capacitor Cst may store a voltage corresponding both to the data signal applied to the first node N1 during each frame period and to the threshold voltage of the first transistor T1.

Although the embodiment illustrated in FIG. 6C shows that the transistors included in the pixel circuit PXC (e.g., the first to seventh transistors T1 to T7) are P-type transistors, the present disclosure is not limited to this. For example, at least one of the first to seventh transistors T1 to T7 may be changed to an N-type transistor.

In an embodiment, the pixel circuit PXC may be further connected to another line as well as the data line Dj.

Figure 6D:
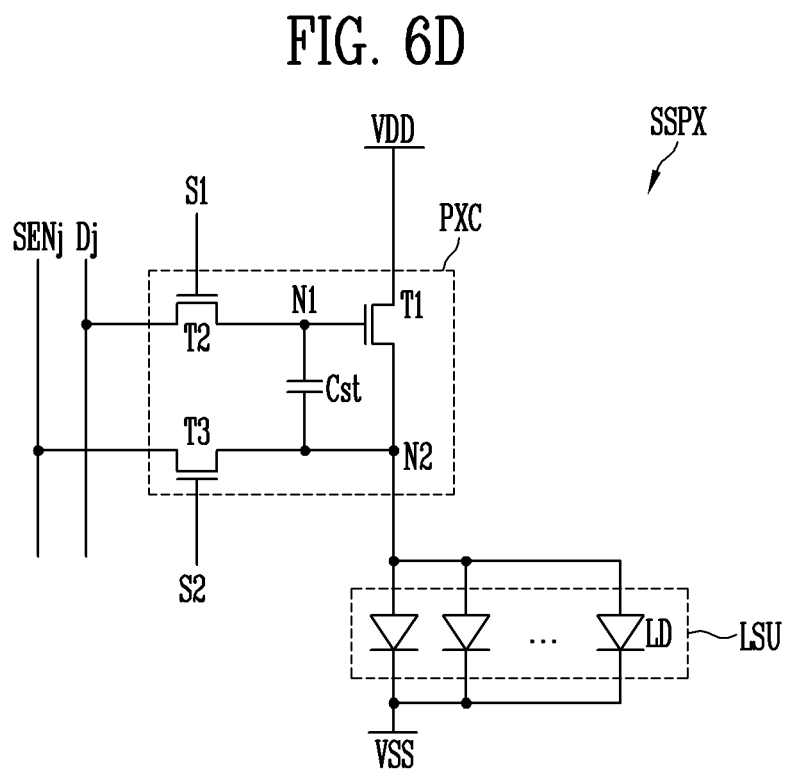

Referring to FIG. 6D, the pixel circuit PXC may be connected to a sensing line SENj. The pixel circuit PXC may include first to third transistors T1 to T3 and a storage capacitor Cst. Because the first and second transistors T1 and T2 and the storage capacitor Cst are substantially equal or similar to the first and second transistors T1 and T2 and the storage capacitor Cst described above with reference to FIG. 6B, repetitive explanation thereof will be omitted.

The third transistor T3 may be connected between the sensing line SENj and the second node N2. The gate electrode of the third transistor T3 may be connected to the first scan line S1 and a second scan line S2 (e.g., a j-th scan line Sj and a j+1-th scan line Sj+i).

The light source unit LSU may be connected between the second node N2 and the second power supply line (e.g., the power supply line to which the second power supply VSS is applied).

The third transistor T3 may be turned on in response to the scan signal of the gate-on voltage transmitted from the second scan line S2 to electrically connect the sensing line SENj to the second node N2.

For example, in an embodiment in which the third transistor T3 is turned on with driving current corresponding to reference voltage flowing in the first transistor T1, the driving current flowing through the first transistor T1 may be provided to an external sensing device through the third transistor T3 and the sensing line SENj, and a signal corresponding to the characteristics of the first transistor T1 (e.g., Vth) based on the driving current may be output through the sensing line SENj to an external device.

Furthermore, the structure of the unit pixel SSPX, which may be applied to the present disclosure, is not limited to the embodiments shown in FIGS. 6A to 6D, and the unit pixel SSPX may have various well-known structures. For example, the pixel circuit PXC included in the unit pixel SSPX may be formed of a well-known pixel circuit, which may have various structures and/or may be operated by various driving schemes. The unit pixel SSPX may be formed in a passive light emitting display panel or the like. In such an embodiment, the pixel circuit PXC may be omitted, and each of the first and second electrodes of the light source unit LSU may be directly connected to the scan line Si, the data line Dj, a power line, and/or the control line.

Figure 7:
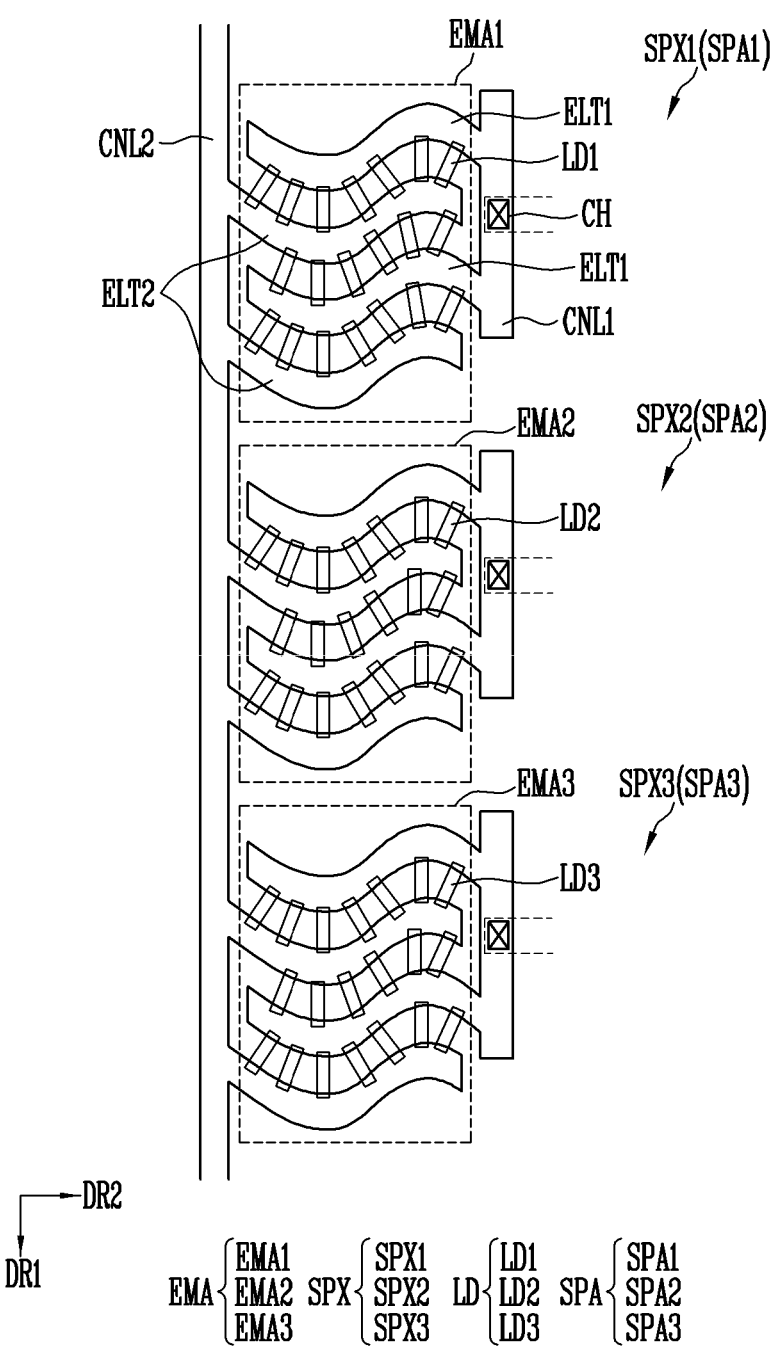
FIG. 7 is a plan view illustrating an example of sub-pixels included in the display device shown in FIG. 4.
Figure 8:
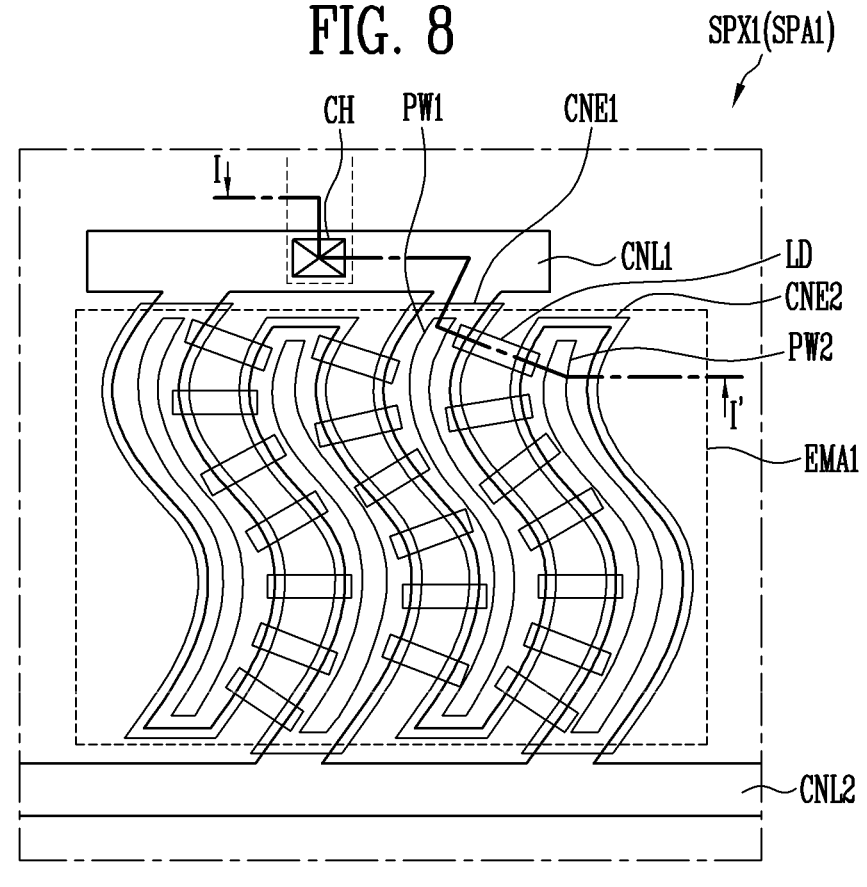
FIG. 8 is a plan view illustrating an example of a first sub-pixel of the sub-pixels shown in FIG. 7.
Figure 8:

FIG. 7 is a plan view illustrating an example of sub-pixels included in the display device shown in FIG. 4. FIG. 8 is a plan view illustrating an example of a first sub-pixel of the sub-pixels shown in FIG. 7. FIG. 7 illustrates the structure of sub-pixels SPX1 to SPX3 based on a light source unit LSU (see, e.g., FIGS. 6A to 6D) (or a light emitting element layer) included in the sub-pixels SPX1 to SPX3. Because the first to third sub-pixels SPX1 to SPX3 are substantially equal to each other, the light source unit LSU will be described based on the first sub-pixel SPX1. Furthermore, unit pixels in each sub-pixel may receive the same electrical signal(s). Therefore, in the present embodiment, there will be described an example in which each of the sub-pixels includes one unit pixel.

Referring to FIGS. 7 and 8, the first sub-pixel SPX1 may include a first electrode ELT1 and a second electrode ELT2 disposed at positions spaced apart from each other in the first sub-pixel area SPA1, and at least one light emitting element LD connected between the first and second electrodes ELT1 and ELT2.

In an embodiment, the first, second, and third light emitting elements LD1, LD2, and LD3 included in each of the first to third sub-pixels SPX1 to SPX3 may emit light having the same color or different colors. For example, each first light emitting element LD1 may be a red light emitting diode configured to emit red light. Each second light emitting element LD2 may be a green light emitting diode configured to emit green light. Each third light emitting element LD3 may be a blue light emitting diode configured to emit blue light.

For example, all of the first, second, and third light emitting elements LD1, LD2, and LD3 may be formed of blue light emitting diodes configured to emit blue light. In such an embodiment, to form a full-color pixel PXL, a light conversion layer and/or a color filter for converting the color of light emitted from the corresponding sub-pixel SPX may be disposed on at least some of the first to third unit pixels SPX1, SPX2, and SPX3.

In an embodiment, the first electrode ELT1 and the second electrode ELT2 may be disposed at positions spaced apart from each other in the first sub-pixel area SPA1 such that at least some areas thereof face each other. For example, the first and second electrodes ELT1 and ELT2 may generally extend in a first direction DR1 and may be spaced apart from each other by a distance (e.g., a predetermined distance) and disposed in parallel to each other.

In embodiments, one emission area may be defined by each sub-pixel area. The light emitting area may be distinguished by the non-light-emitting area. Although not clearly illustrated, a pixel defining layer (or a bank, a light block pattern) for preventing light emitted from the light emitting element LD from being transmitted to another area may be disposed in the non-light-emitting area to overlap therewith.

In an embodiment, the first electrode ELT1 may be connected to a first connection electrode CNL1. The first electrode ELT1 may be integrally connected to (or integrally formed with) the first connection electrode CNL1. For example, the first electrode ELT1 may be formed of at least one branch diverging from the first connection electrode CNL1. In other words, the first electrode ELT1 may extend from the first connection electrode CNL1 (or a first connection line). When the first electrode ELT1 and the first connection electrode CNL1 are formed integrally with each other, the first connection electrode CNL1 may be regarded as one area of the first electrode ELT1. However, the present disclosure is not limited thereto.

The first connection electrode CNL1 may be connected to the first power line (e.g., the power line to which the first power supply VDD is applied) that is described above with reference to FIGS. 6A, 6C, and 6D.

In an embodiment, the second electrode ELT2 may be connected to a second connection electrode CNL2. The second electrode ELT2 may be integrally connected to (e.g., integrally formed with) the second connection electrode CNL2. For example, the second electrode ELT2 may be formed of at least one branch diverging from the second connection electrode CNL2. In other words, the second electrode ELT2 may extend from the second connection electrode CNL2 (or a second connection line) extending in a second direction DR2. When the second electrode ELT2 and the second connection electrode CNL2 are formed integrally with each other, the second connection electrode CNL2 may be regarded as one area of the second electrode ELT2.

The second connection electrode CNL2 may be connected to the second power line (e.g., the power line to which the second power supply VSS is applied) that is described above with reference to FIGS. 6A, 6C, and 6D.

The first connection electrode CNL1 and the second connection electrode CNL2 may be spaced apart from each other by a distance (e.g., a predetermined distance). The first electrode ELT1 and the second electrode ELT2 may be formed between the first connection electrode CNL1 and the second connection electrode CNL2.

The first connection electrode CNL1 may be connected to the pixel circuit PXC (or the first transistor T1). For example, the first connection electrode CNL1 may be connected to the pixel circuit PXC (or the first transistor T1) through a contact hole (e.g., a contact opening) CH.

In an embodiment, each of the first and second electrodes ELT1 and ELT2 may have a single-layer or multi-layer structure. For example, the first electrode ELT1 may have a multi-layer structure including a first reflective electrode and a first conductive capping layer, and the second electrode may have a multi-layer structure including a second reflective electrode and a second conductive capping layer.

The first electrode ELT1 and the second electrode ELT2 may each have a bent shape. For example, when the first connection electrode CNL1 and the second electrode CNL2 each have a shape extending in the first direction DR1, the first electrode ELT1 and the second electrode ELT2 may generally extend in the second direction DR intersecting the first direction DR1 and be bent in the first direction. The first electrode ELT1 and the second electrode ELT2 may each have a curved shape (e.g., a 'U' shaped or 'S' shape) or a zigzag shape (e.g., a 'V' shape or 'W' shape). For example, rather than having a linear shape extending in only one direction (e.g., the second direction DR2), each of the first electrode ELD1 and the second electrode ELT2 may generally extend in only one direction (e.g., the second direction DR2) and may have a bent portion which protrudes from at least a portion thereof in a direction (e.g., the first direction DR1) crossing (or intersecting) the extension direction. The bent portion may be formed of a curved line or may be formed of a combination of linear lines extending in two different directions.

However, the present disclosure is not limited thereto. For example, the shapes and/or mutual arrangement relationship of the first and second electrodes ELT1 and ELT2 may be changed in various suitable ways.

Referring to FIG. 8, a first partition wall PW1 may be disposed under the first electrode ELT1 and may overlap one area (or a portion) of the first electrode ELT1. A second partition wall PW2 may be disposed under the second electrode ELT2 and ma overlap one area (or a portion) of the second electrode ELT2. The first and second partition walls PW1 and PW2 may be disposed in the emission area EMA at positions spaced apart from each other and protrude upwardly to make corresponding areas of the first and second electrode ELT1 and ELT2 protrude upwardly. For example, the first electrode ELT1 may be disposed on the first partition wall PW1 and may protrude in a height direction (or a thickness direction) of the base layer SUB1 due to the first partition wall PW1. The second electrode ELT2 may be disposed on the second partition wall PW2 and may protrude in the height direction of the base layer SUB1 due to the second partition wall PW2. The first partition wall PW1 and the second partition wall PW2 may also have bent portions corresponding to the shapes of the first electrode ELT1 and the second electrode ELT2 that overlap the first and second partitions walls PW1 and PW2.

In an embodiment, at least one light emitting element LD (e.g., a plurality of light emitting elements LD) may be arranged between the first and second electrodes ELT1 and ELT2. A plurality of light emitting elements LD may be connected to each other in parallel in the emission area EMA in which the first electrode ELT1 and the second electrode ELT2 are disposed to face each other.

Although the embodiment illustrated in FIG. 8 has light emitting elements LD that are aligned in a normal direction with respect to the direction in which the first and the second electrodes ELT1 and ELT2 extend (e.g., the longitudinal direction of the light emitting elements LD are aligned in the normal direction with respect to the direction in which the first and second electrodes ELT1 and ELT2 extend), the alignment direction of the light emitting elements LD is not limited thereto. For example, at least one of the light emitting elements LD may be aligned in a diagonal direction with respect to the extension direction of the first and second electrodes ELT1 and ELT2 and the normal direction.

Each of the light emitting elements LD may be electrically connected between the first electrode ELT1 and the second electrode ELT2. For example, the respective first ends EP1 of the light emitting elements LD may be electrically connected to the first electrode ELT1. The respective second ends EP2 of the light emitting elements LD may be electrically connected to the second electrode ELT2.

In an embodiment, the first end of each of the light emitting elements LD may be electrically connected to the first electrode ELT1 through at least one contact electrode (e.g., a first contact electrode CNE1) rather than being directly disposed on the first electrode ELT1. However, the present disclosure is not limited thereto. For example, in another embodiment of the present disclosure, the first ends of the light emitting elements LD may directly contact the first electrode ELT1 and may be electrically connected to the first electrode ELT1.

Similarly, the second end of each of the light emitting elements LD may be electrically connected to the second electrode ELT2 through at least one contact electrode (e.g., a second contact electrode CNE2) rather than being directly disposed on the second electrode ELT2. However, the present disclosure is not limited thereto. For example, in another embodiment of the present disclosure, the second end of each of the light emitting elements LD may directly contact the second electrode ELT2 and may be electrically connected to the second electrode ELT2.

In an embodiment, each of the light emitting elements LD may be formed of a light emitting diode including (or made of) a material having an inorganic crystal structure and may have a subminiature size (e.g., ranging from the nanoscale to the microscale). For example, each of the light emitting elements LD may be a subminiature light emitting diode having a size ranging from the nanoscale to the microscale as illustrated in any one of FIGS. 1A to 3B. However, the type of light emitting elements LD which may be applied to the present disclosure is not limited thereto. For example, the light emitting element LD may be formed by a growth scheme and may be, for example, a light emitting diode having a core-shell structure having a size ranging from the nanoscale to the microscale.

In an embodiment, the light emitting elements LD may be prepared in a diffused form in a solution (e.g., a predetermined solution) and then supplied to the emission area EMA of each sub-pixel SPX by an inkjet printing process or a slit coating process. Furthermore, the light emitting elements LD may be concurrently (or simultaneously) supplied into the emission area EMA. For example, the light emitting elements LD may be mixed with a volatile solvent and supplied to the emission area EMA. When a voltage (e.g., a predetermined voltage) is supplied to the first and second electrodes ELT1 and ELT2 of the sub-pixel SPX, an electric field is formed between the first and second electrodes ELT1 and ELT2, causing the light emitting elements LD to be self-aligned between the first and second electrodes ELT1 and ELT2. After the light emitting elements LD have been aligned, the solvent may be removed (e.g., evaporated) by a volatilization process or other process. In this way, the light emitting elements LD may be reliably arranged between the first and second electrodes ELT1 and ELT2. Furthermore, because the first contact electrode CNE1 and the second contact electrode CNE2 are formed on the first ends and the second ends of the light emitting elements LD, the light emitting elements LD may be reliably connected between the first and second electrodes ELT1 and ELT2.

Because a separate circuit element, a line, or the like is not disposed between the first and second electrodes ELT1 and ELT2 and the base layer SUB1, interference resulting from a circuit element, a conductive pattern, etc. may be prevented from occurring during the step of forming the electric field between the first and second electrodes ELT1 and ELT2. Thus, the alignment efficiency of the light emitting elements LD may be enhanced.

In an embodiment, the first contact electrode CNE1 may be formed on the first ends of the light emitting elements LD and at least one area of the first electrode ELT1 corresponding to the first ends through which the first ends of the light emitting elements LD may be physically and/or electrically connected to the first electrode ELT1 (see, e.g., FIGS. 9A-9D). Similarly, the second contact electrode CNE2 may be formed on the second ends EP2 of the light emitting elements LD and at least one area of the second electrode ELT2 corresponding to the second ends through which the second ends of the light emitting elements LD may be physically and/or electrically connected to the second electrode ELT2.

The light emitting elements LD disposed in the emission area EMA may be grouped to form a light source of the corresponding unit pixel (and the sub-pixel SPX). When driving current flows through at least one sub-pixel SPX during each frame period, the light emitting elements LD that are connected in the forward direction between the first and second electrodes ELT1 and ELT2 of the sub-pixel SPX may emit light having a luminance corresponding to the driving current.

Light emitted from each light emitting element LD may have directionality (e.g., light may be emitted from the light emitting elements LD in certain directions). The first and second electrodes ELT1 and ELT2 may have bent portions rather than extending in only one direction. Hence, the light emitting elements LD that are aligned in the normal direction with respect to the direction in which the first and second electrodes ELT1 and ELT2 extend may be oriented in various directions depending on aligned positions. Thus, the viewing angle of the display device may be improved.

FIGS. 9A to 9D are sectional views illustrating examples of the unit pixel taken along the line I-I' of FIG. 8. FIGS. 9A to 9D each illustrates any one sub-pixel area SPA (e.g., the first sub-pixel area SPA1) formed in the display panel PNL. In an embodiment, the cross-sectional structures of the first, second, and third sub-pixels SPX1, SPX2, and SPX3 described above may be substantially identical or similar to each other. Therefore, for the sake of explanation, the structures of the first, second, and third sub-pixels SPX1, SPX2, and SPX3 will be collectively described based on the first sub-pixel SPX1 in FIGS. 9A to 9D.

Figure 9A:
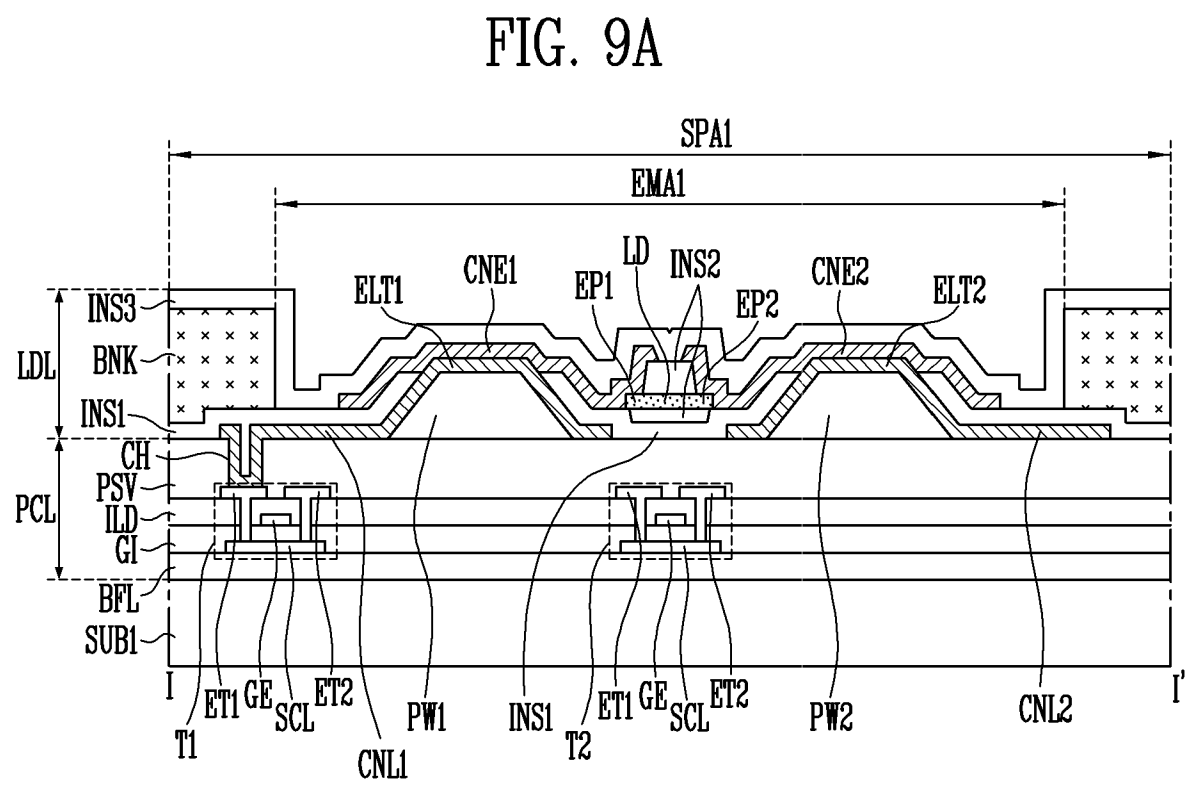

Referring to FIG. 9A, the pixel circuit layer PCL and the display element layer LDL may be successively (e.g., sequentially) disposed in each sub-pixel area SPA on the base layer SUB1. In an embodiment, the pixel circuit layer PCL and the display element layer LDL may be formed in the entirety of the display area DA of the display panel PNL.

In an embodiment, the pixel circuit layer PCL may include circuit elements that constitute the pixel circuits PXC of the sub-pixels SPX. The display element layer LDL may include light emitting elements LD of the sub-pixels SPX (or the unit pixels SSPX).

For example, in the first sub-pixel area SPA1 on the base layer SUB1, the pixel circuit layer PCL including circuit elements forming (or constituting) the pixel circuit PXC of the corresponding first sub-pixel SPX1, and the display element layer LDL including at least one light emitting element LD (e.g., a plurality of first light emitting elements LD1) provided in the first sub-pixel SPX1 may be successively disposed on one surface of the base layer SUB1.

In an embodiment, the pixel circuit layer PCL may include a plurality of circuit elements formed in the first sub-pixel area SPA1 and which form the pixel circuit PXC of the first sub-pixel SPX1 (or the first unit pixel SSPX1). For example, the pixel circuit layer PCL may include a plurality of transistors disposed in the first sub-pixel area SPA1 (e.g., the first and second transistors T1 and T2 shown in FIG. 6A). The pixel circuit layer PCL may include a storage capacitor Cst disposed in the sub-pixel area SPA, various signal lines (e.g., the scan line Si and the data line Dj illustrated in FIG. 5) connected to the pixel circuit PXC, and various power lines (e.g., a first power line and a second power line PL configured to respectively transmit a voltage of the first power supply VDD and a voltage of the second power supply VSS) connected to the pixel circuit PXC and/or the light emitting elements LD.

In an embodiment, a plurality of transistors (e.g., the first and second transistors T1 and T2) provided in the pixel circuit PXC may have a substantially identical or similar cross-sectional structure. However, the present disclosure is not limited thereto. In an embodiment, at least some of the plurality of transistors may have different types and/or structures.

In addition, the pixel circuit layer PCL may include a plurality of insulating layers. For example, the pixel circuit layer PCL may include a buffer layer BFL, a gate insulating layer GI, an interlayer insulating layer ILD, and a passivation layer PSV, which are successively stacked on one surface of the base layer SUB1.

In an embodiment, the buffer layer BFL may prevent or substantially prevent impurities from diffusing into the circuit elements. The buffer layer BFL may be a single layer or may be formed of multiple layers having at least two or more layers. In an embodiment in which the buffer layer BFL has the multi-layer structure, the respective layers may be formed of the same material or different materials. In an embodiment, the buffer layer BFL may be omitted.

In an embodiment, each of the first and second transistors T1 and T2 may include a semiconductor layer SCL, a gate electrode GE, a first transistor electrode ET1, and a second transistor electrode ET2. Although FIG. each of the first and second transistors T1 and T2 in the embodiment illustrated in FIG. 9A includes the first transistor electrode ET1 and the second transistor electrode ET2 that are formed separately from the semiconductor layer SCL, the present disclosure is not limited thereto. For example, in an embodiment of the present disclosure, the first and/or second electrode ET1 and/or ET2 provided in at least one transistor disposed in each sub-pixel area SPA may be integrally formed with the corresponding semiconductor layer SCL.

The semiconductor layer SCL may be disposed on the buffer layer BFL. For example, the semiconductor layer SCL may be disposed between the gate insulating layer GI and the base layer SUB1 on which the buffer layer BFL is formed. The semiconductor layer SCL may include a first area which contacts a first transistor electrode ET1, a second area which contacts a second transistor electrode ET2, and a channel area disposed between the first and second areas. In an embodiment, one of the first and second areas may be a source area and the other may be a drain area.

In an embodiment, the semiconductor layer SCL may be a semiconductor pattern formed of polysilicon, amorphous silicon, an oxide semiconductor, etc. The channel area of the semiconductor layer SCL may be an intrinsic semiconductor, which is an undoped semiconductor pattern. Each of the first and second areas of the semiconductor layer SCL may be a semiconductor pattern doped with an impurity (e.g., a predetermined impurity).

The gate electrode GE may be disposed on the semiconductor layer SCL with the gate insulating layer GI interposed therebetween. For example, the gate electrode GE may be disposed between the gate insulating layer GI and the interlayer insulating layer ILD and may overlap at least one area of the semiconductor layer SCL.

The first and second transistor electrodes ET1 and ET2 may be disposed over the semiconductor layer SCL and the gate electrode GE with at least one interlayer insulating layer ILD interposed therebetween. For example, the first and second transistor electrodes ET1 and ET2 may be disposed between the interlayer insulating layer ILD and the passivation layer PSV. The first and second transistor electrodes ET1 and ET2 may be electrically connected to the semiconductor layer SCL. For example, the first and second transistor electrodes ET1 and ET2 may be respectively connected to the first area and the second area of the semiconductor layer SCL through contact holes (e.g., contact openings) that pass through the gate insulating layer GI and the interlayer insulating layer ILD.

In an embodiment, any one of the first and second transistor electrodes ET1 and ET2 of at least one transistor (e.g., the first transistor T1 shown in FIG. 6A) provided on the pixel circuit PXC may be electrically connected, through a contact hole (e.g., a contact opening) CH passing through the passivation layer PSV, to the first electrode ELT1 of the light source unit LSU disposed over the passivation layer PSV.

In an embodiment, at least one signal line and/or power line that is connected to the sub-pixel SPX may be disposed on the same layer as that of one electrode of each of the circuit elements that form the pixel circuit PXC. For example, the second power line PL may be disposed on the same layer as that of the gate electrode GE of each of the first and second transistors T1 and T2. However, the structures and/or positions of the second power line PL, etc. may be changed in various ways.

The display element layer LDL may include first and second partition walls PW1 and PW2, first and second electrodes ELT1 and ELT2, a first insulating layer INS1, light emitting elements LD, a second insulating layer INS2, first and second contact electrodes CNE1 and CNE2, and a third insulating layer INS3, which are successively disposed and/or formed on the pixel circuit layer PCL.

The first and second partition walls PW1 and PW2 may be disposed on the pixel circuit layer PCL. The first and second partition walls PW1 and PW2 may be disposed at positions spaced apart from each other in the emission area EMA. The first and second partition walls PW1 and PW2 may protrude in a height direction on the pixel circuit layer PCL. In an embodiment, the first and second partition walls PW1 and PW2 may have substantially the same height, but the present disclosure is not limited thereto.

In an embodiment, the first partition wall PW1 may be disposed between the pixel circuit layer PCL and the first electrode ETL1. The first partition wall PW1 may be disposed adjacent to the first ends EP1 of the light emitting elements LD. For example, one sidewall of the first partition wall PW1 may be positioned adjacent to the first ends EP1 of the light emitting elements LD and may be disposed to face the first ends EP1.

In an embodiment, the second partition wall PW2 may be disposed between the pixel circuit layer PCL and the second electrode ETL2. The second partition wall PW2 may be disposed adjacent to the second ends EP2 of the light emitting elements LD. For example, one sidewall of the second partition wall PW2 may be positioned adjacent to the second ends EP2 of the light emitting elements LD and may be disposed to face the second ends EP2.

Figure 9B:
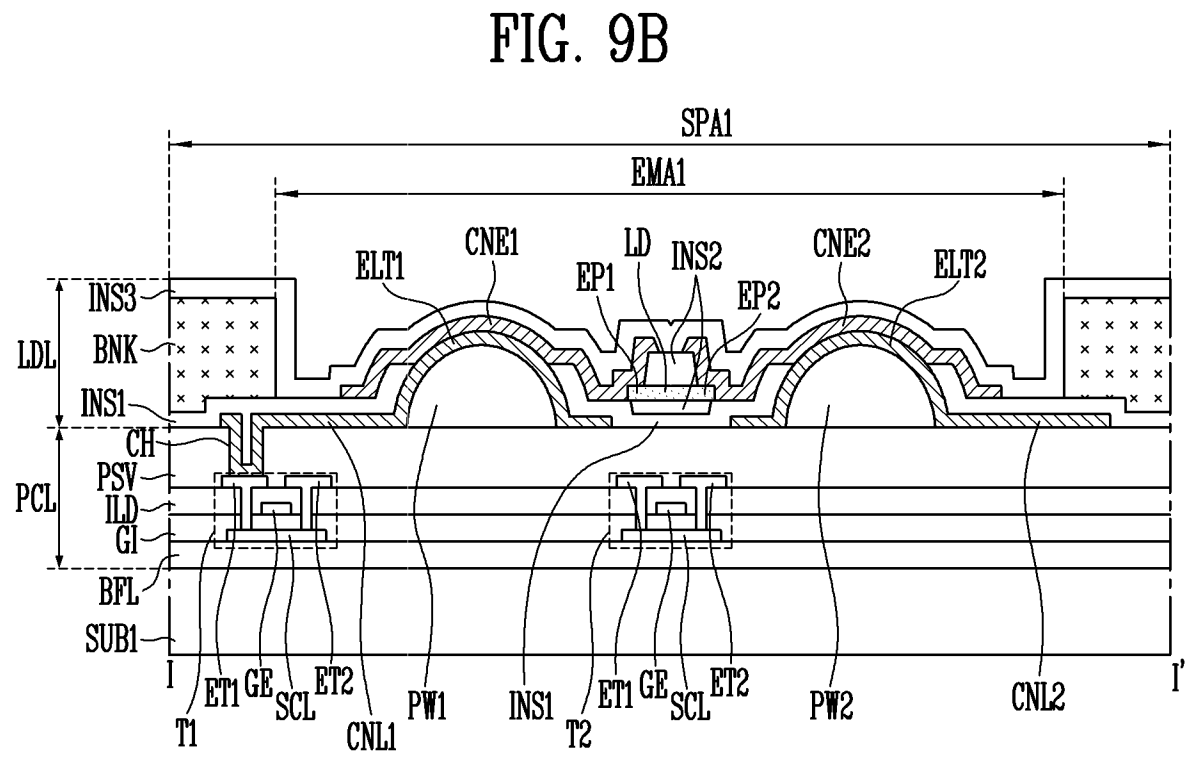

In an embodiment, each of the first and second partition walls PW1 and PW2 may have various shapes. For example, as illustrated in FIG. 9A, each of the first and second partition walls PW1 and PW2 may have a cross-sectional shape of a trapezoid with a greater width at a base thereof than at a top thereof (e.g., a trapezoid that is reduced in width from a bottom to a top thereof). In such an embodiment, each of the first and second partition walls PW1 and PW2 may have an inclined surface on at least one side. In another embodiment, as illustrated in FIG. 9B, each of the first and second partition walls PW1 and PW2 may have a semicircular or a semielliptical cross-section that is reduced in width from a bottom to a top thereof. In such an embodiment, each of the first and second partition walls PW1 and PW2 may have a curved surface on at least one side. In other words, the shape of each of the first and second partition walls PW1 and PW2 may be changed in various ways and is not particularly limited. In an embodiment, at least one of the first and second partition walls PW1 and PW2 may be omitted or changed in position.

Each of the first and second partition walls PW1 and PW2 may include inorganic insulating material and/or organic insulating material. For example, the first and second partition walls PW1 and PW2 may include at least one inorganic layer including one or more various inorganic insulating materials that are known to those skilled in the art, such as $SiN_x$ or $SiO_x$. In other embodiments, the first and second partition walls PW1 and PW2 may include at least one organic layer and/or a photoresist layer including (or containing) various known organic insulating materials, or may form a single- or multi-layer insulator including (or containing) organic/inorganic materials in combination. In other words, the constituent materials of the first and second partition walls PW1 and PW2 may be variously changed.

In an embodiment, each of the first and second partition walls PW1 and PW21 may act as a reflective member. For example, the first and second partition walls PW1 and PW2, along with the first and second electrodes ETL1 and ETL2 provided thereon, may act as reflectors that guide (e.g., reflect) light emitted from each light emitting element LD in a desired direction, thus enhancing the light efficiency (e.g., the light emission efficiency) of the pixel PXL.

The first and second electrodes ETL1 and ETL2 may be respectively disposed over the first and second partition walls PW1 and PW2. The first and second electrodes ELT1 and ELT2 may be disposed at positions spaced apart from each other in the emission area EMA.

In an embodiment, the first and second electrodes ETL1 and ETL2 that are respectively disposed over the first and second partition walls PW1 and PW2 may have shapes corresponding to the respective shapes of the first and second partition walls PW1 and PW2. For example, the first and second electrodes ETL1 and ETL2 may have inclined surfaces or curved surfaces corresponding to the first and second partition walls PW1 and PW2, respectively, and may protrude in a height direction (or a thickness direction) of the display element layer LDL.

Each of the first and second electrodes ELT1 and ELT2 may include at least one conductive material. For example, each of the first and second electrodes ELT1 and ELT2 may include at least one of a metal, such as Ag, Mg, Al, Pt, Pd, Au, Ni, Nd, Ir, Cr, Ti, or an alloy thereof, a conductive oxide, such as ITO, IZO, ZnO, or ITZO, and a conductive polymer, such as PEDOT; however, they are not limited thereto.

Each of the first and second electrodes ELT1 and ELT2 may have a single-layer or multi-layer structure. For example, each of the first and second electrodes ELT1 and ELT2 may include at least one reflective electrode layer. Each of the first and second electrodes ETL1 and ETL2 may further include (e.g., may selectively further include) at least one transparent electrode layer disposed on an upper portion and/or a lower portion of the reflective electrode layer and/or at least one conductive capping layer that covers an upper portion of the reflective electrode layer and/or the transparent electrode layer.

In an embodiment, the reflective electrode layer of each of the first and second electrodes ETL1 and ETL2 may be formed of conductive material having a uniform (or substantially uniform) reflectivity. For example, the reflective electrode layer may include at least one of a metal, such as Ag, Mg, Al, Pt, Pd, Au, Ni, Nd, Ir, Cr, and an alloy thereof; however, the present disclosure is not limited thereto. In other words, the reflective electrode layer may be formed of various reflective conductive materials. Each of the first and second electrodes ELT1 and ELT2 that includes the reflective electrode layer may enable light emitted from the opposite ends of each of the light emitting elements LD (e.g., the first and second ends EP1 and EP2) to more reliably travel in a direction (e.g., in a frontal direction) in which an image is displayed. For example, when the first and second electrodes ELT1 and ELT2 have inclined or curved surfaces corresponding to the shapes of the first and second partition walls PW1 and PW2, respectively, and are disposed to face the first and second ends EP1 and EP2 of the light emitting elements LD, respectively, light emitted from the first and second ends EP1 and EP2 of each light emitting elements LD may be reflected by the first and second electrodes ELT1 and ELT2 and, thus, more reliably travel in the frontal direction of the display panel PNL (e.g., in an upward direction of the base layer SUB1). Thus, the efficiency of light emitted from the light emitting elements LD (e.g., the light emission efficiency) may be enhanced.

Furthermore, the transparent electrode layer of each of the first and second electrodes ETL1 and ETL2 may be formed of various transparent electrode materials. For example, the transparent electrode layer may include ITO, IZO or ITZO, but the present disclosure is not limited thereto. In an embodiment, each of the first and second electrodes ELT1 and ELT2 may have a triple-layer structure having a stacked structure of ITO/Ag/ITO. As such, when the first and second electrodes ETL1 and ETL2 each have a multilayer structure of at least two or more layers, voltage drop due to signal delay (e.g., RC delay) may be reduced or minimized. Thus, a desired voltage can be effectively transmitted to the light emitting elements LD.

In addition, when each of the first and second electrodes ETL1 and ETL2 includes the conductive capping layer that covers the reflective electrode layer and/or the transparent electrode layer, it is possible to prevent (or substantially prevent) the reflective electrode layer of the first and second electrodes ETL1 and ETL2 from being damaged due to defects caused during a process of manufacturing the pixel PXL. However, the conductive capping layer may be selectively included on the first and second electrodes ETL1 and ETL2 and may be omitted depending on embodiments. Furthermore, the conductive capping layer may be considered as a component of each of the first and second electrodes ETL1 and ETL2 or considered as a separate component disposed on the first and second electrodes ETL1 and ETL2.

The first insulating layer INS1 may be disposed on one area of each of the first and second electrode ELT1 and ELT2. For example, the first insulating layer INS1 may be formed to cover one area of each of the first and second electrodes ETL1 and ETL2 and may include an opening which exposes another area of each of the first and second electrodes ETL1 and ETL2.

In an embodiment, the first insulating layer INS1 may be primarily formed to cover the overall surfaces of the first and second electrodes ELT1 and ELT2. After the light emitting elements LD are supplied and aligned on the first insulating layer INS1, the first insulating layer INS1 may be partially open (e.g., partially removed or may not be completely formed) to expose the first and second electrodes ELT1 and ELT2 on the first and second contact electrodes CNE1 and CNE2, as illustrated in FIG. 9A. In other embodiments, the first insulating layer INS1 may be patterned in the form of an individual pattern that is sectionally disposed under the light emitting elements LD after the supply and alignment of the light emitting elements LD have been completed.

For example, the first insulating layer INS1 may be interposed between the first and second electrodes ETL1 and ETL2 and the light emitting elements LD and may expose at least one area of each of the first and second electrodes ETL1 and ETL2. After the first and second electrodes ETL1 and ETL2 are formed, the first insulating layer INS1 may be formed to cover the first and second electrodes ETL1 and ETL2 so that the first and second electrodes ETL1 and ETL2 may not be damaged and/or to prevent metal from being precipitated in a subsequent process. Furthermore, the first insulating layer INS1 may stably support each light emitting element LD. In an embodiment, the first insulating layer INS1 may be omitted.

The light emitting elements LD may be supplied to and aligned in the emission area EMA on which the first insulating layer INS1 is formed. For example, a plurality of light emitting elements LD may be supplied to the emission area EMA through an inkjet method or the like, and the light emitting elements LD may be aligned between the first and second electrodes ETL1 and ETL2 by alignment voltages (or alignment signals) applied to the first and second electrodes ETL1 and ETL2.

The bank BNK may be disposed on the first insulating layer INS1. For example, the bank BNK may be formed between other sub-pixels to enclose (e.g., to define) the emission area EMA of the sub-pixel SPX so that a pixel defining layer for defining the emission area EMA of the sub-pixel SPX may be formed.

In an embodiment, the bank BNK may be formed to have a second height greater than a first height of the first and second partition walls PW1 and PW2. In such an embodiment, at the step of supplying the light emitting elements LD to each emission area EMA, the bank BNK may act as a dam structure to prevent a solution mixed with the light emitting elements LD from being drawn into (or flowing into) the emission area EMA of an adjacent sub-pixel SPX and/or to control the amount of solution such that a constant (or consistent) amount of solution is supplied to each emission area EMA.

The bank BNK may be formed to prevent light emitted from each emission area EMA from entering an adjacent emission area EMA and causing optical interference. To this end, the bank BNK may be formed to prevent light emitted from the light emitting elements LD of each sub-pixel SPX from passing through the bank BNK.

In some embodiments, the bank BNK may not be disposed between the sub-emission areas EMA_S1 and EMA_S2 (see, e.g., FIG. 7), but the present disclosure is not limited thereto.

The second insulating layer INS2 may be disposed over the light emitting elements LD, that is, the light emitting elements LD aligned between the first and second electrodes ETL1 and ETL2, and may expose the first and second ends EP1 and EP2 of the light emitting elements LD. For example, the second insulating layer INS2 may be partially disposed only over some areas of the light emitting elements LD without covering the first and second ends EP1 and EP2 of the light emitting elements LD. The second insulating layer INS2 may be formed in an independent pattern in each emission area EMA, but the present disclosure is not limited thereto. Furthermore, as illustrated in FIG. 9A, when space is present between the first insulating layer INS1 and the light emitting elements LD before the second insulating layer INS2 is formed, the space may be filled with the second insulating layer INS2. Thus, the light emitting elements LD may be more stably supported.

The first and second contact electrodes CNE1 and CNE2 may be disposed on the first and second electrodes ETL1 and ETL2 and the first and second ends EP1 and EP2 of the light emitting elements LD. In an embodiment, the first and second contact electrodes CNE1 and CNE2 may be disposed on the same layer, as illustrated in FIG. 9A. In such an embodiment, although the first and second contact electrodes CNE1 and CNE2 are formed through the same process using the same conductive material, the present disclosure is not limited thereto.

The first and second contact electrodes CNE1 and CNE2 may respectively electrically connect the first and second ends EP1 and EP2 of the light emitting elements LD to the first and second electrodes ELT1 and ELT2.

For example, the first contact electrode CNE1 may be disposed on the first electrode ELT1 to contact the first electrode ELT1. For example, the first contact electrode CNE1 may be disposed to contact the first electrode ETL1 on one area of the first electrode ETL1 that is not covered by the first insulating layer INS1. Furthermore, the first contact electrode CNE1 may be disposed on the first end EP1 of at least one light emitting element adjacent to the first electrode ELT1, for example, on the respective first ends EP1 of a plurality of light emitting elements LD, so that the first contact electrode CNE1 contacts the first ends EP1. For example, the first contact electrode CNE1 may be disposed to cover the first ends EP1 of the light emitting elements LD and at least one area of the corresponding first electrode ETL1. Hence, the first ends EP1 of the light emitting elements LD may be electrically connected to the first electrode ELT1.

Similarly, the second contact electrode CNE2 may be disposed on the second electrode ELT2 to contact the second electrode ELT2. For example, the second contact electrode CNE2 may be disposed to contact the second electrode ETL2 on one area of the second electrode ETL2 that is not covered by the first insulating layer INS1. Furthermore, the second contact electrode CNE2 may be disposed on the second end EP2 of at least one light emitting element adjacent to the second electrode ELT2, for example, on the second ends EP2 of a plurality of light emitting elements LD, so that the second contact electrode CNE2 contacts the second ends EP2. For example, the second contact electrode CNE2 may be disposed to cover the second ends EP2 of the light emitting elements LD and at least one area of the corresponding second electrode ETL2. Hence, the second ends EP2 of the light emitting elements LD may be electrically connected to the second electrode ELT2.

The third insulating layer INS3 may be formed and/or disposed on one surface of the base layer SUB1 on which the first and second partition walls PW1 and PW2, the first and second electrodes ETL1 and ETL2, the light emitting elements LD, the first and second contact electrodes CNE1 and CNE2, and the bank BNK are formed so that the third insulating layer INS3 may cover the first and second partition walls PW1 and PW2, the first and second electrodes ETL1 and ETL2, the light emitting elements LD, the first and second contact electrodes CNE1 and CNE2, and the bank BNK. The third insulating layer INS3 may include a thin-film encapsulation layer including at least one inorganic layer and/or organic layer, but the present disclosure is not limited thereto. In some embodiments, at least one overcoat layer may be further disposed over (or on) the third insulating layer INS3.

In an embodiment, each of the first to third insulating layers INS1, INS2, and INS3 may have a single-layer or multi-layer structure and may include at least one inorganic insulating material and/or organic insulating material. For example, each of the first to third insulating layers INS1, INS2, and INS3 may include various well-known organic/inorganic insulating materials as well as SiN$_x$, and the constituent material of each of the first to third insulating layers INS1, INS2, and INS3 is not particularly limited. The first to third insulating layers INS1, INS2, and INS3 may include different insulating materials, but at least some of the first to third insulating layers INS1, INS2, and INS3 may include the same insulating material.

In embodiments, the first and second contact electrodes CNE1 and CNE2 may be disposed on different layers.

Figure 9C:
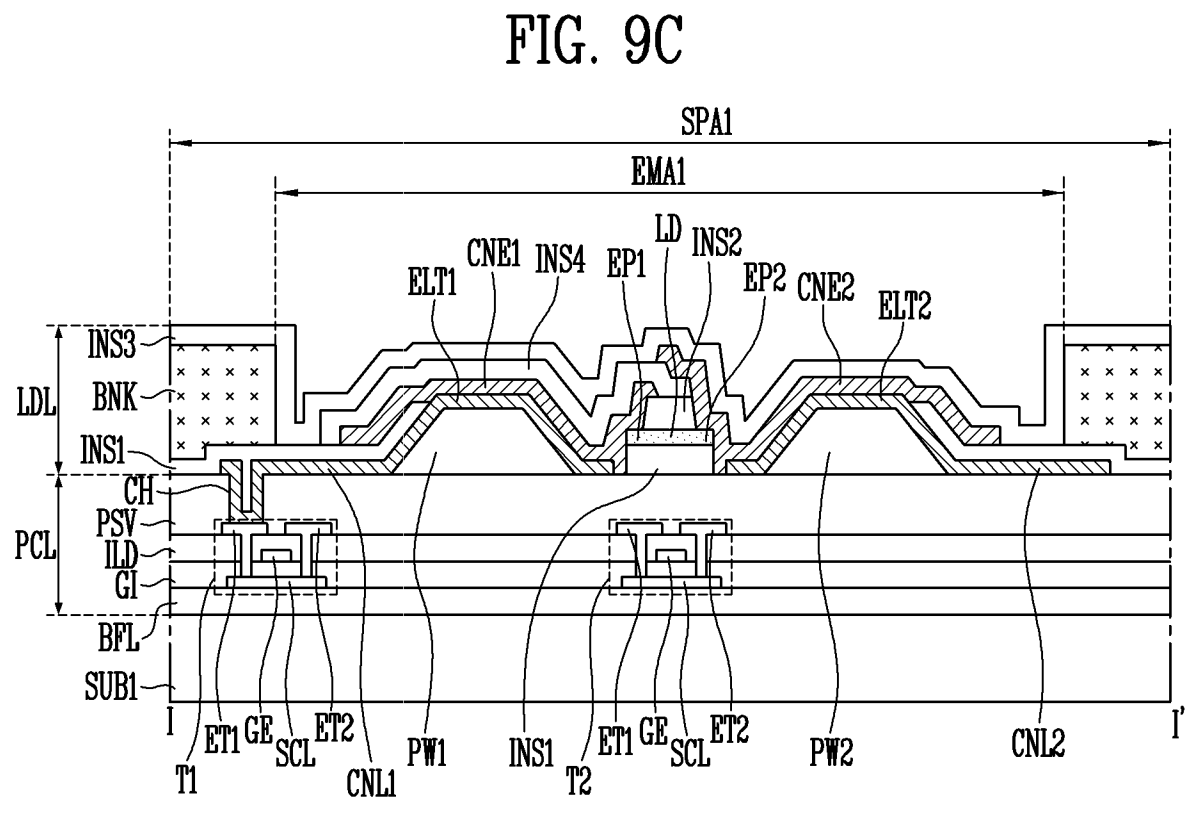

Referring to FIG. 9C, the first contact electrode CNE1 may be disposed in the sub-pixel area SPA in which the second insulating layer INS2 is disposed. In an embodiment, the first contact electrode CNE1 may be disposed on the first electrode ELT1 in the corresponding sub-pixel area SPA such that the first contact electrode CNE1 contacts one area of the first electrode ELT1. Furthermore, the first contact electrode CNE1 may be disposed on the first end EP1 of at least one light emitting element LD disposed in the corresponding sub-pixel area SPA such that that the first contact electrode CNE1 contacts the first end EP1. The first end EP1 of at least one light emitting element LD disposed in the sub-pixel area SPA may be electrically connected to the first electrode ELT1 disposed in the corresponding sub-pixel area SPA through the first contact electrode CNE1.

A fourth insulating layer INS4 may be disposed in the sub-pixel area SPA in which the first contact electrode CNE1 is disposed. In an embodiment, the fourth insulating layer INS4 may cover the second insulating layer INS2 and the first contact electrode CNE1 that are disposed in the corresponding sub-pixel area SPA.

In an embodiment, the fourth insulating layer INS4 may have a single-layer or multi-layer structure and may include at least one inorganic insulating material and/or organic insulating material similar to that of the first to third insulating layers INS1, INS2, and INS3. For example, the fourth insulating layer INS4 may include various well-known organic/inorganic insulating materials including SiN$_x$. Furthermore, the fourth insulating layer INS4 may include insulating material different from that of the first to third insulating layers INS1, INS2, and INS3 but may include the same insulating material as that of at least some of the first to third insulating layers INS1, INS2, and INS3.

The second contact electrode CNE2 may be disposed in each sub-pixel area SPA in which the fourth insulating layer INS4 is disposed. In an embodiment, the second contact electrode CNE2 may be disposed on the second electrode ELT2 disposed in the corresponding sub-pixel area SPA such that the second contact electrode CNE2 contacts one area of the second electrode ELT2. Furthermore, the second contact electrode CNE2 may be disposed on the second end EP2 of at least one light emitting element LD disposed in the corresponding sub-pixel area SPA such that that the second contact electrode CNE2 contacts the second end EP2. The second end EP2 of at least one light emitting element LD disposed in each sub-pixel area SPA may be electrically connected to the second electrode ELT2 disposed in the corresponding sub-pixel area SPA through the second contact electrode CNE2.

Figure 9D:
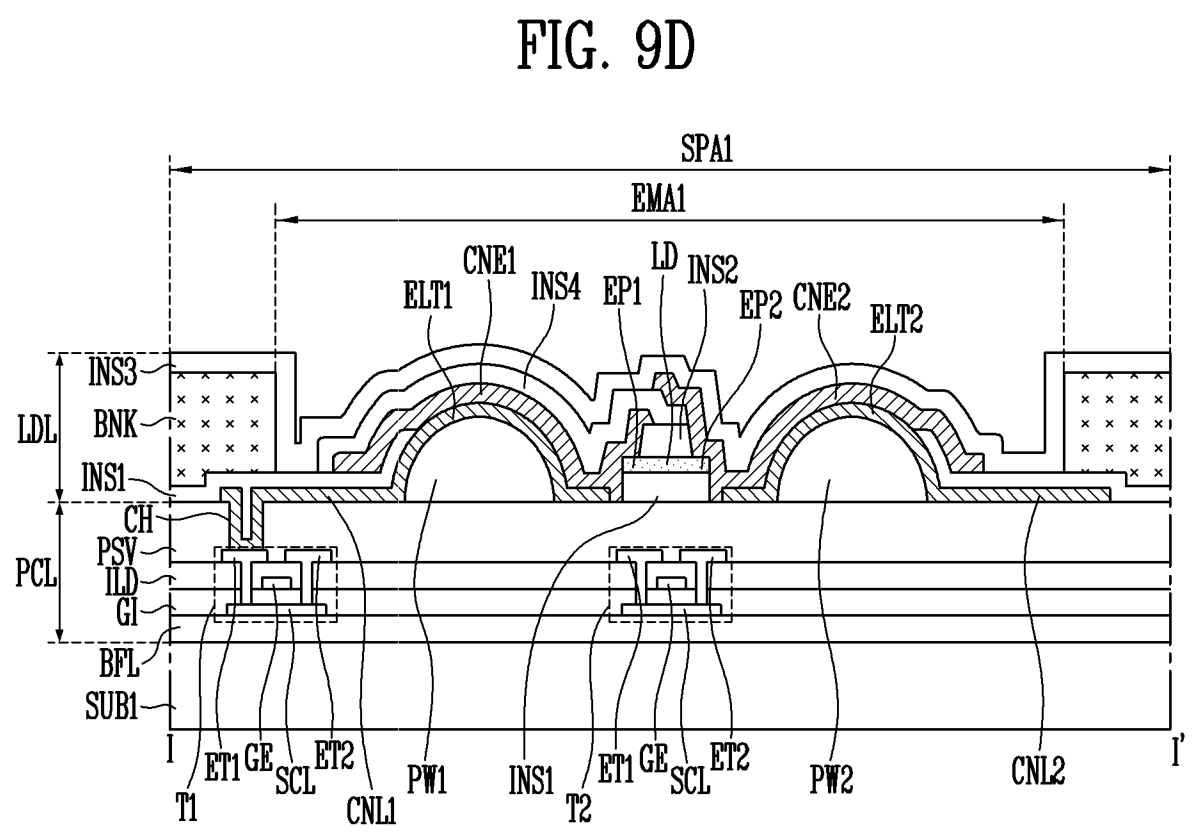

In an embodiment, each of the first and second partition walls PW1 and PW2 may have various shapes. For example, as illustrated in FIG. 9C, each of the first and second partition walls PW1 and PW2 may have a cross-sectional shape of a trapezoid that is reduced in width from a bottom to a top thereof. In another embodiment, as illustrated in FIG. 9D, each of the first and second partition walls PW1 and PW2 may have a semicircular or a semielliptical cross-section that is reduced in width from a bottom to a top thereof.

Next, a display device according to another embodiment will be described. Hereinafter, description of the light source unit LSU will be made with reference to the first sub-pixel SPX1. Furthermore, duplicate description of components shown in FIGS. 1A to 9D will be omitted herein, and the same or similar reference numerals are used.

Figure 10:
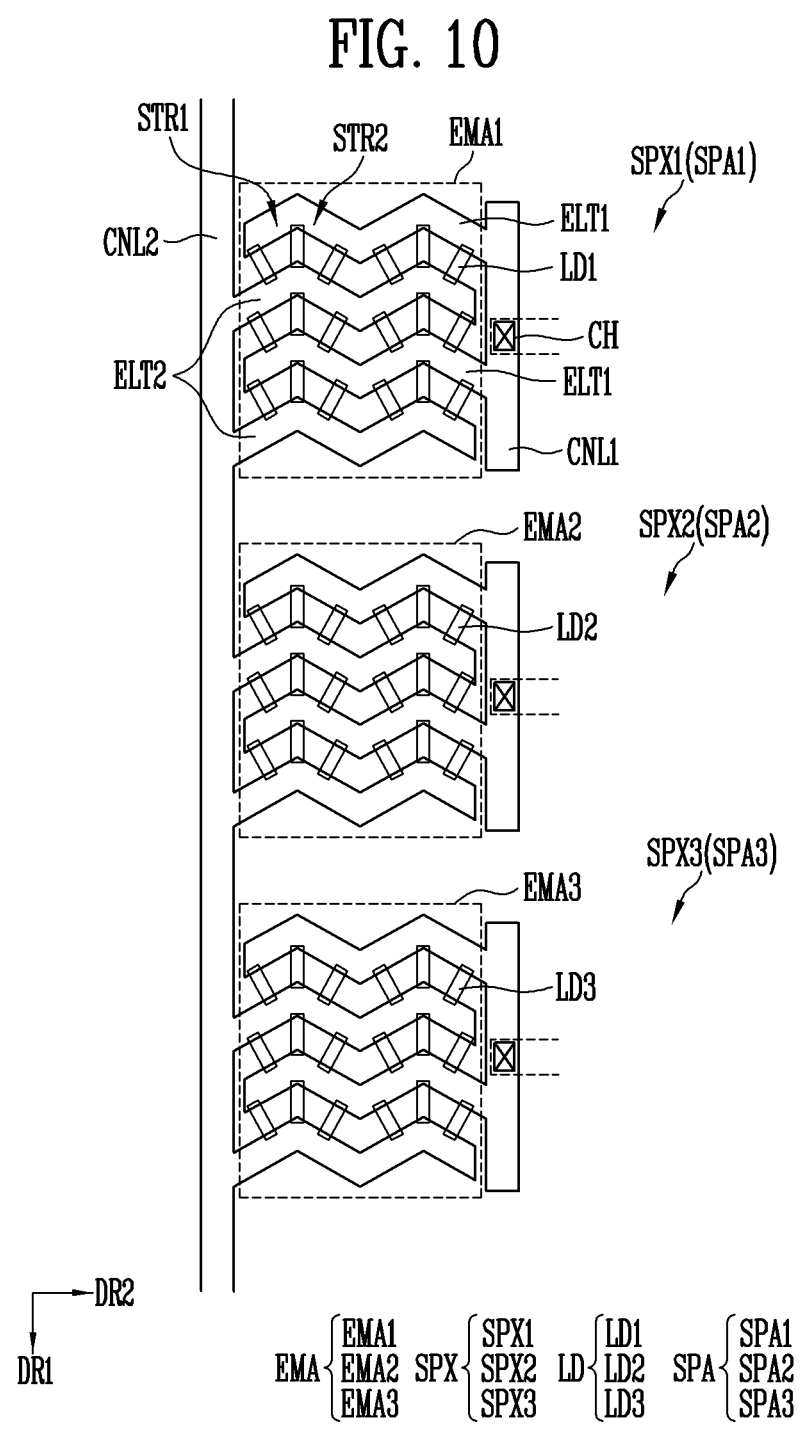

FIG. 10 is a plan view illustrating another example of the sub-pixel included in the display device shown in FIG. 4. A first sub-pixel SPX1 shown in FIG. 10, other than an emission area EMA, may be substantially the same as the first sub-pixel SPX1 shown in FIG. 7. Therefore, repetitive explanation thereof will be omitted.

Referring to FIG. 10, a first electrode ELT1 and a second electrode ELT2 according to an embodiment may each have a zigzag shape. The first electrode ELT1 and the second electrode ELT2 may each include linear portions STR1 and STR2 extending in diagonal directions with respect to the first direction DR1 and the second direction DR2. The first electrode ELT1 and the second electrode ELT2 may include the linear portions STR1 and STR2 extending in different directions. Two adjacent linear portions STR1 and STR2, extending in different directions, may meet to form a bent portion.

The light emitting elements LD may each be aligned in a normal direction with respect to a direction in which the first electrode ELT1 and the second electrode ELT2 extend, and the alignment direction thereof may be changed depending on the aligned position thereof. Consequently, the viewing angle of the display device may be improved.

Figure 11:
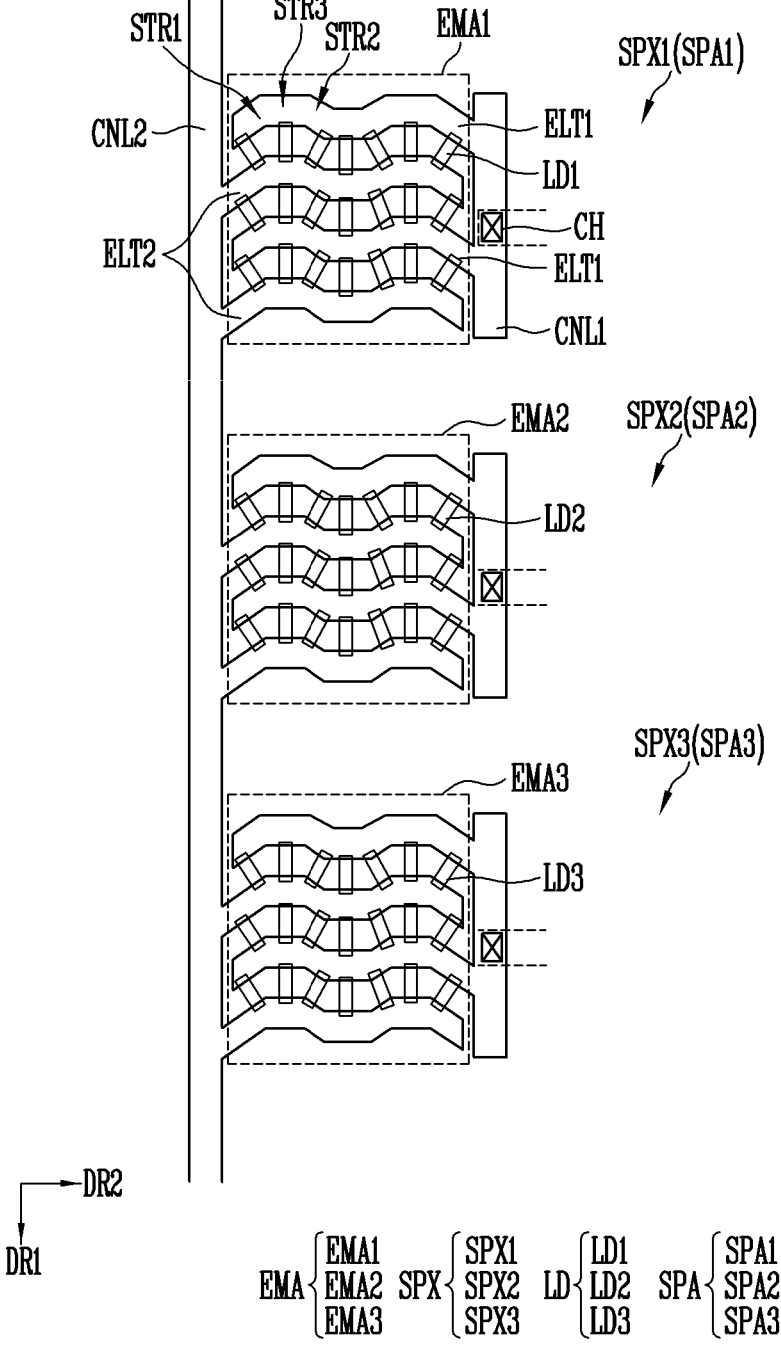
FIG. 11 is a plan view illustrating an example of the sub-pixel included in the display device shown in FIG. 4.

FIG. 11 is a plan view illustrating another example of the sub-pixel included in the display device shown in FIG. 4.

Referring to FIG. 11, a first electrode ELT1 and a second electrode ELT2 according to an embodiment may each include linear portions STR1 and STR2 extending in diagonal directions with respect to the first direction DR1 and the second direction DR2 and linear portions STR3 extending in the second direction DR2. The first electrode ELT1 and the second electrode ELT2 may each include the linear portions STR3, each of which extends in the second direction DR2 between two linear portions STR1 and STR2 extending in the diagonal directions.

The alignment directions of the light emitting elements LD may be changed depending on the aligned positions thereof. Consequently, the viewing angle of the display device may be improved in the same manner as that of the previous embodiments.

Figure 12:
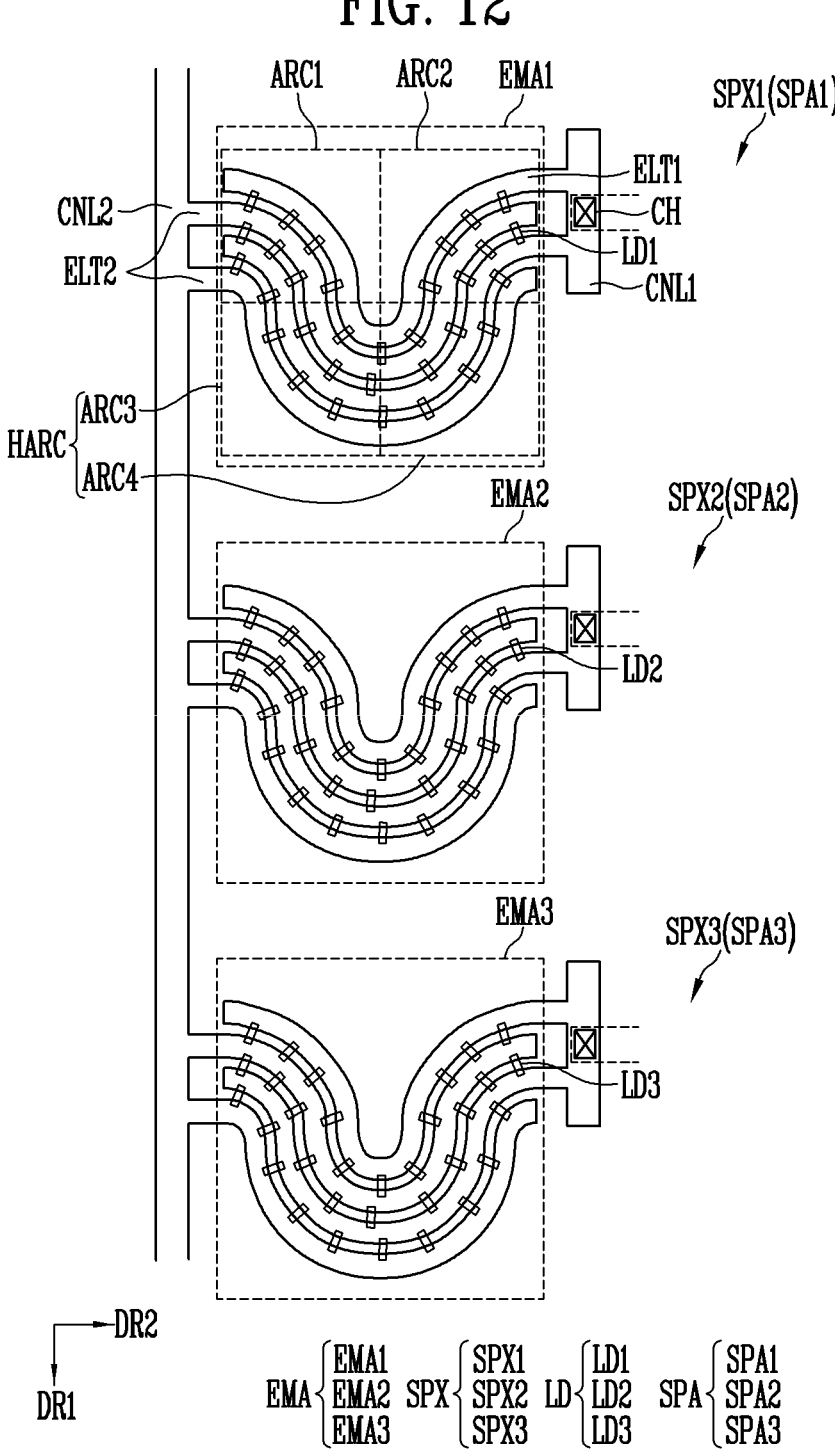
FIG. 12 is a plan view illustrating an example of the sub-pixel included in the display device shown in FIG. 4.
Figure 13:
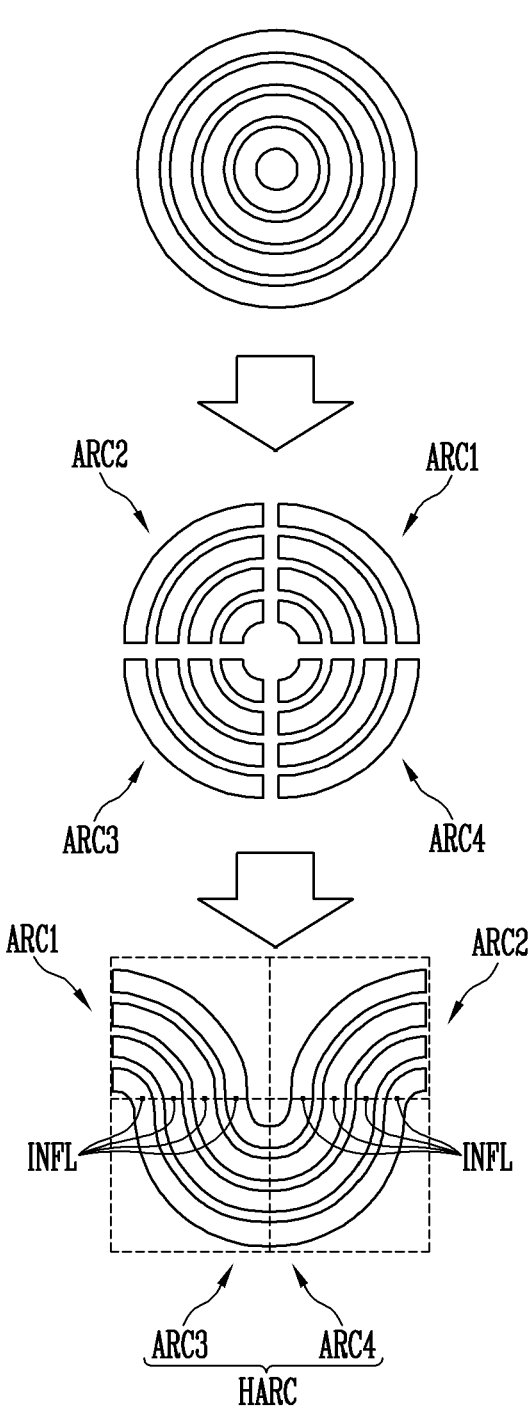
FIG. 13 is a view for describing shapes of a first electrode and a second electrode shown in FIG. 12.

FIG. 12 is a plan view illustrating another example of the sub-pixel included in the display device shown in FIG. 4, and FIG. 13 is a diagram for describing shapes of a first electrode and a second electrode shown in FIG. 12.

Referring to FIGS. 12 and 13, a first electrode ELT1 and a second electrode ELT2 according to an embodiment may each have a curved shape including an inflection point INFL. In the first electrode ELT1 and the second electrode ELT2, curved portions between adjacent inflection points INFL may each have a circular arc shape. For example, each of the first electrode ELT1 and the second electrode ELT2 may have a shape formed by dividing an electrode having a circular ring shape into two or four equal parts and recombining the divided parts. A part HARC (e.g., ARC3 and ARC4) of each of the first electrode ELT1 and the second electrode ELT2 may have a semicircular arc shape, and remaining parts ARC1 and ARC2 thereof may each have a quadrant arc shape. Each of the first electrode ELT1 and the second electrode ELT2 may have a shape in which opposite ends thereof are respectively formed of the parts ARC1 and ARC2, each having a quadrant arc shape, and the part HARC (e.g., ARC3 and ARC4) having a semicircular arc shape is connected between the parts ARC1 and ARC2.

The alignment directions of the light emitting elements LD may be changed depending on the aligned positions thereof. Consequently, the viewing angle of the display device may be improved in the same manner as that of the previous embodiments.

Figure 14:
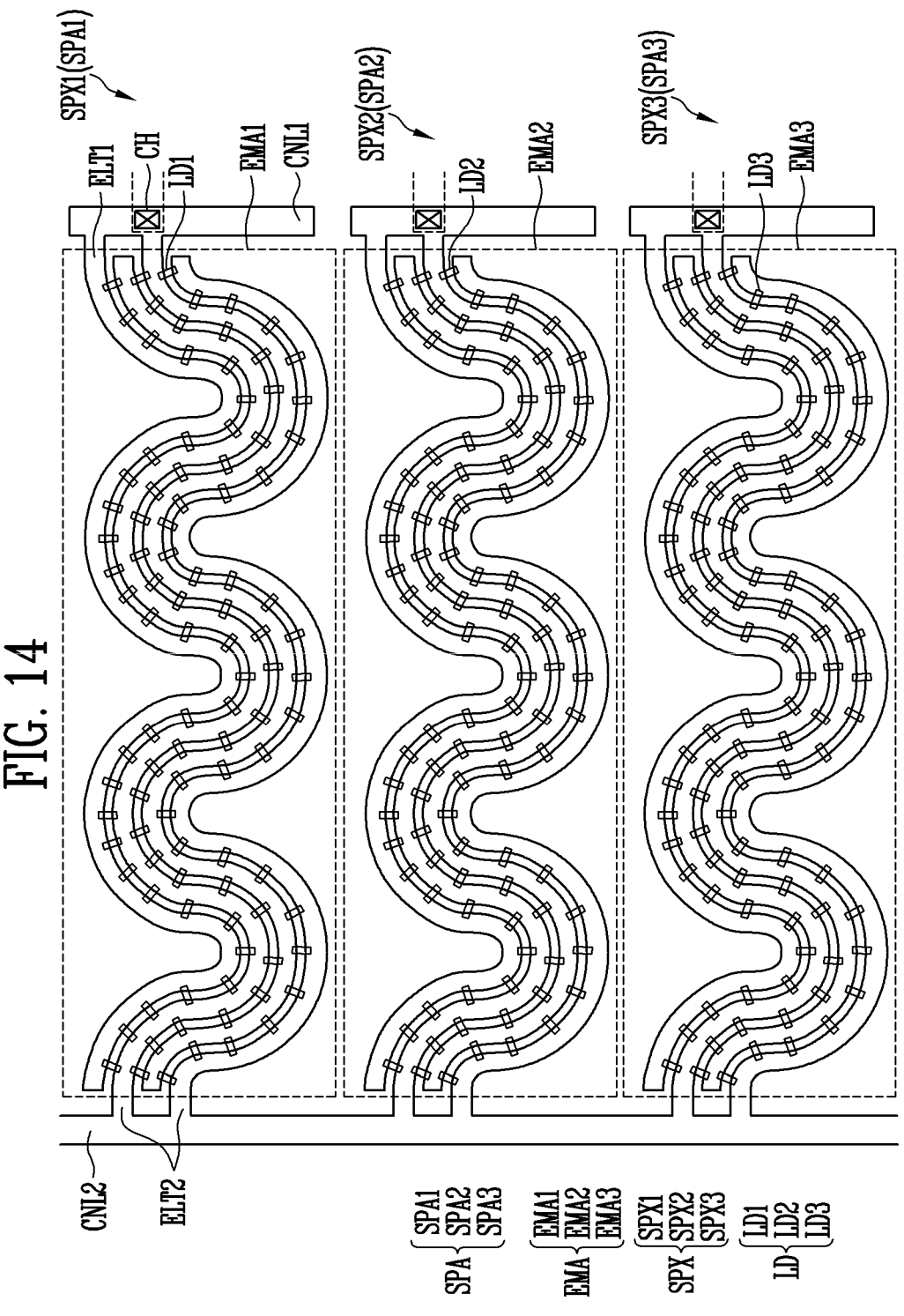
FIG. 14 is a plan view illustrating an example of the sub-pixel included in the display device shown in FIG. 4.

FIG. 14 is a plan view illustrating another example of the sub-pixel included in the display device shown in FIG. 4.

Referring to FIG. 14, each of a first electrode ELT1 and a second electrode ELT2 according to an embodiment is different from that of the embodiment shown in FIG. 12 in that each of the opposite ends thereof is formed of a quadrant arc-shaped part and a plurality of semicircular arc-shaped parts are connected between the opposite ends.

The first electrode ELT1 and the second electrode ELT2 according to an embodiment may respectively have shapes formed by repeatedly connecting the first electrodes ELT1 and the second electrodes ELT2 of FIG. 12 in the second directions DR2.

The alignment directions of the light emitting elements LD may be changed depending on the aligned positions thereof. Consequently, the viewing angle of the display device may be improved in the same manner as that of the previous embodiments. In embodiment shown in FIG. 14, the size of the emission area of the sub-pixel may be adjusted.

Figure 15:
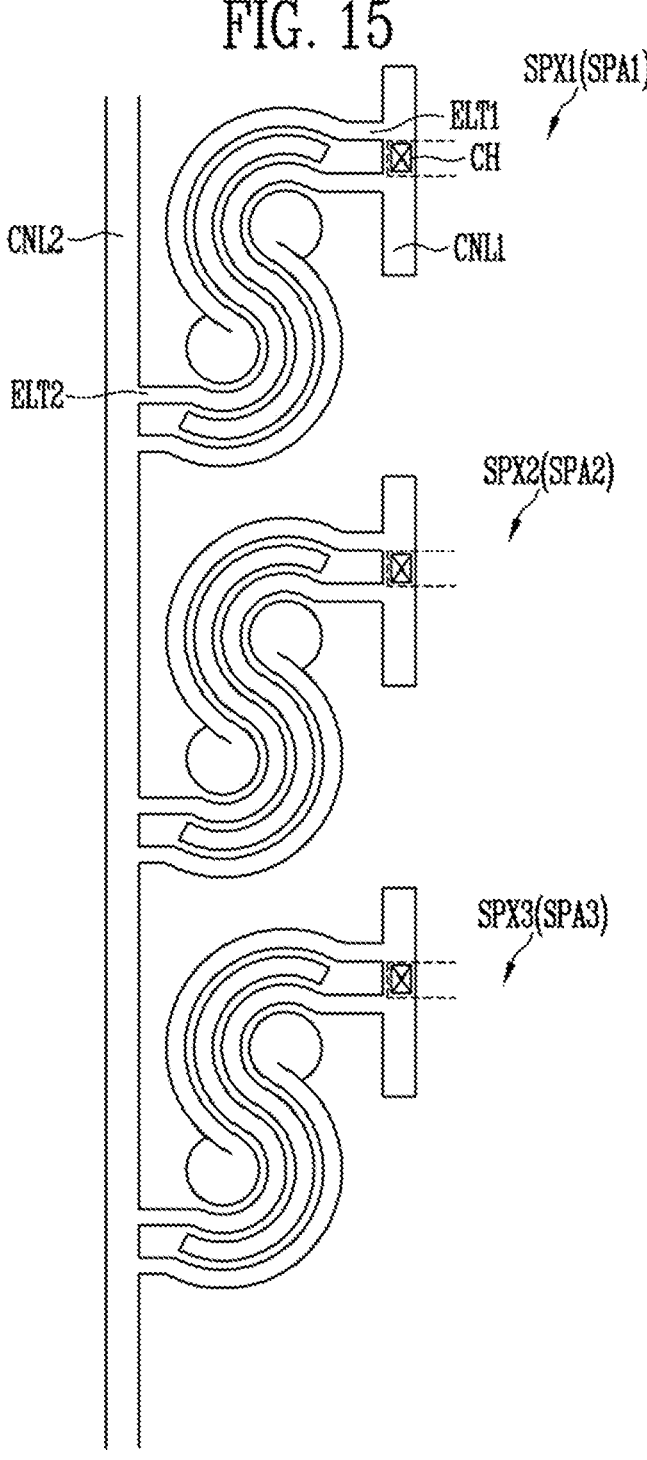
FIGS. 15 to 17 are plan views illustrating other examples of the sub-pixel included in the display device shown in FIG. 4.
Figure 16:
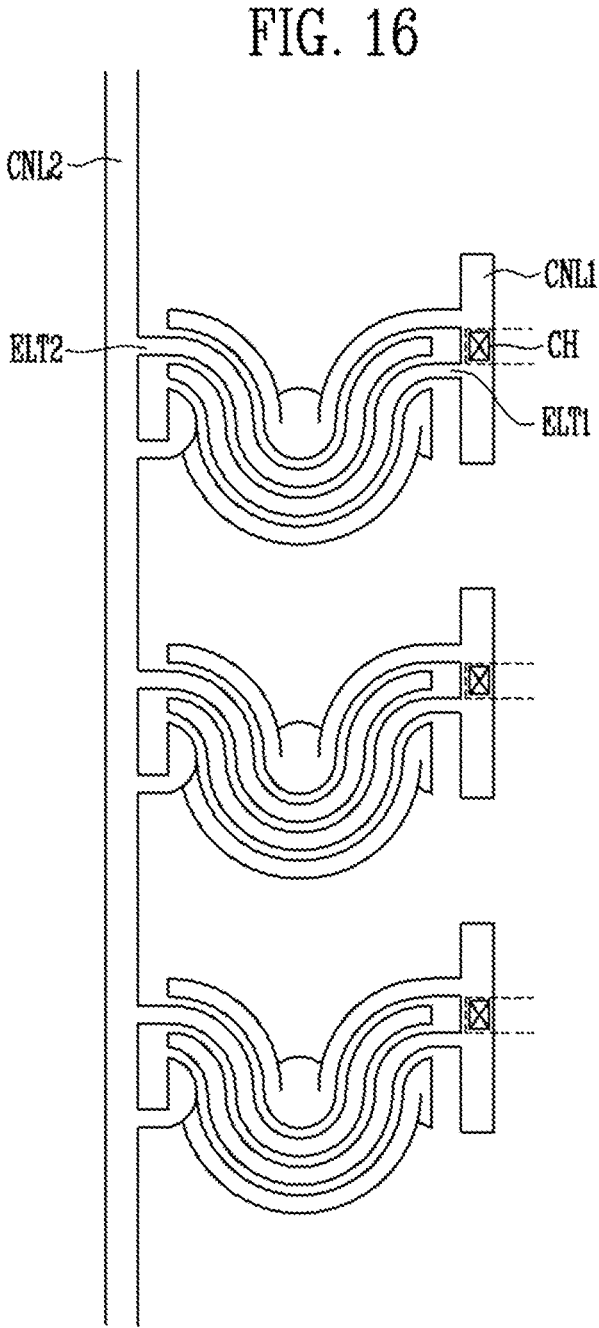
Figure 17:
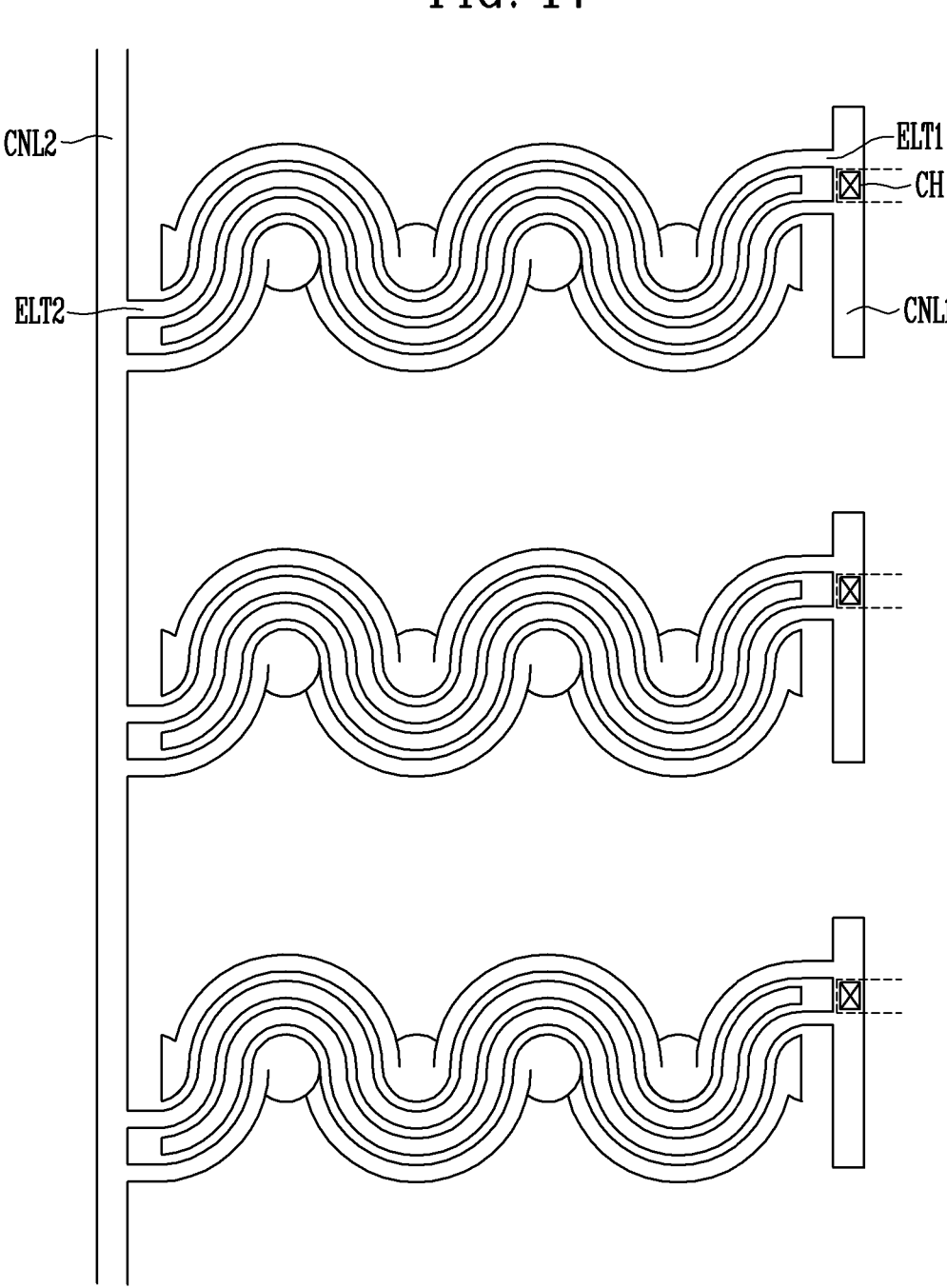

FIGS. 15 to 17 are plan views illustrating other examples of a sub-pixel included in the display device shown in FIG. 4. In the drawings, the light emitting elements are omitted for clarity.

Referring to FIGS. 15 and 17, according to embodiments, a first electrode ELT1 and a second electrode ELT2 may each have a portion having a different width. For example, opposite ends of each of the first electrode ELT1 and the second electrode ELT2 and/or a portion thereof in which an inflection point is formed may be greater in width than adjacent portions thereof.

The alignment directions of the light emitting elements may be changed depending on the aligned positions thereof. Consequently, the viewing angle of the display device may be improved in the same manner as that of the previous embodiments. As illustrated in the embodiment shown in FIG. 17, the size of the emission area of the sub-pixel may be adjusted by repeatedly connecting (e.g., extending) ones of the first electrodes ELT1 and the second electrodes ELT2.

Figure 18:
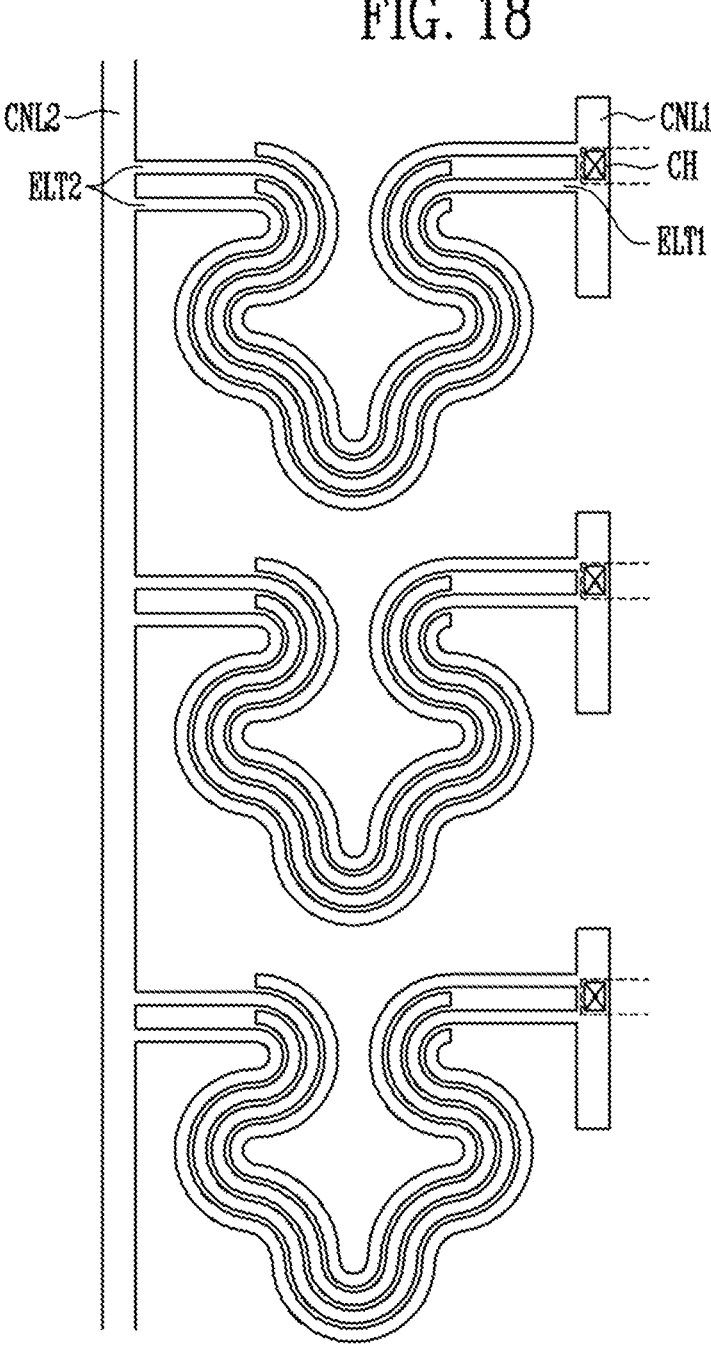
FIGS. 18 and 19 are plan views illustrating other examples of the sub-pixel included in the display device shown in FIG. 4.
Figure 19:
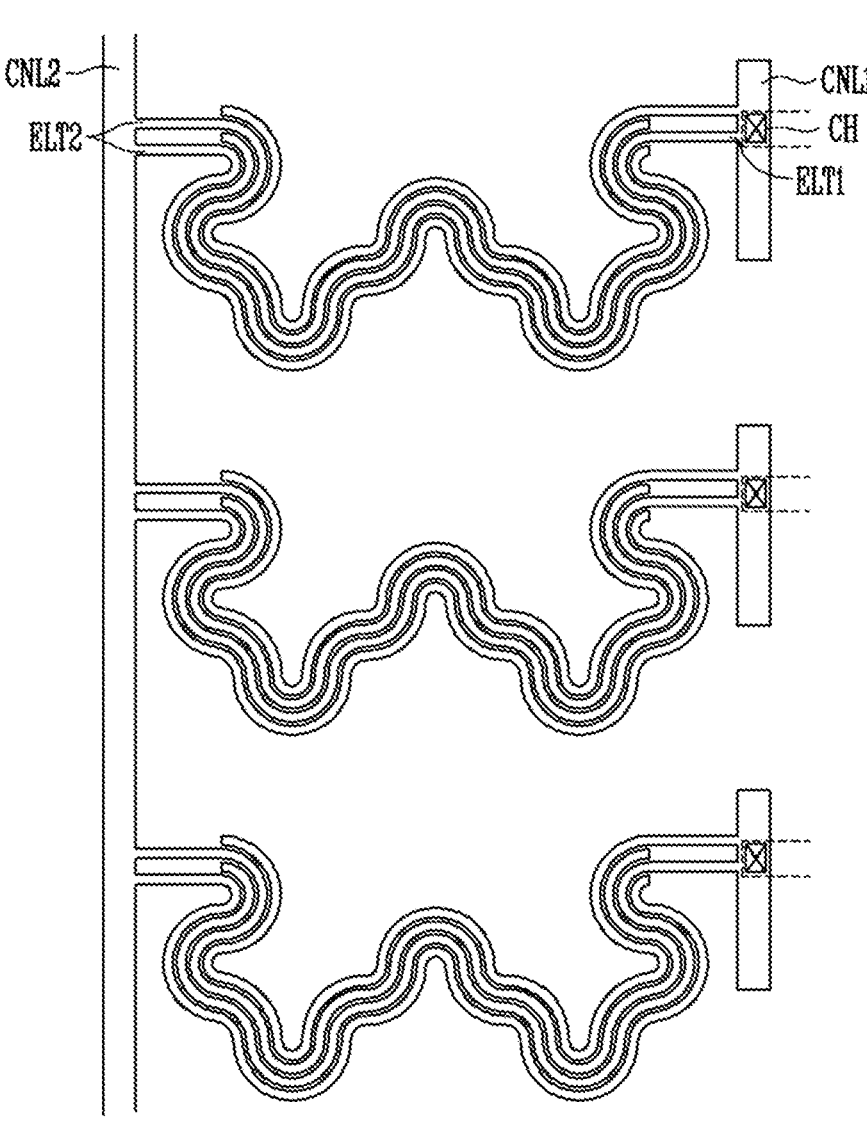
Figure 20A:
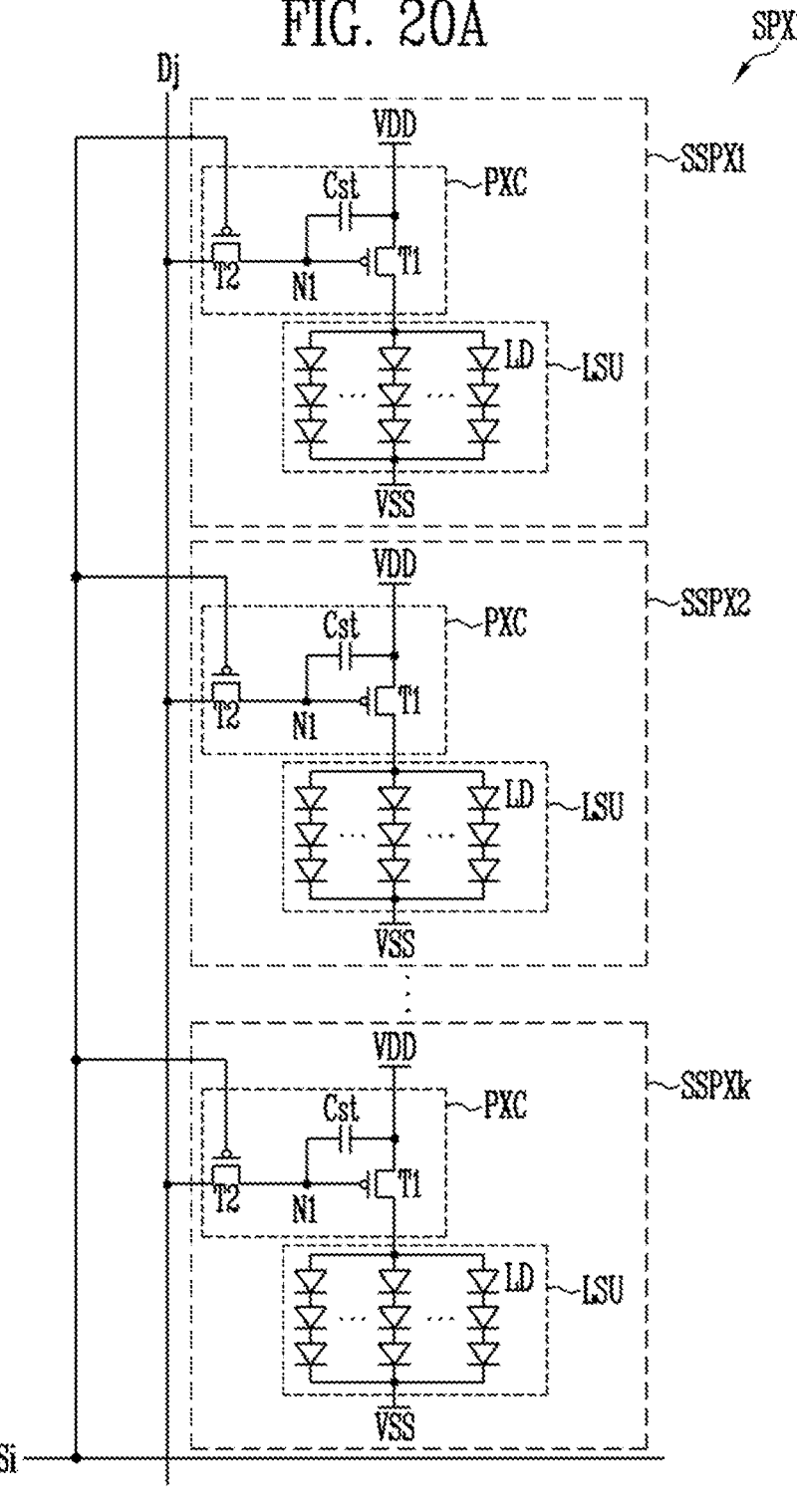
Figure 20C:
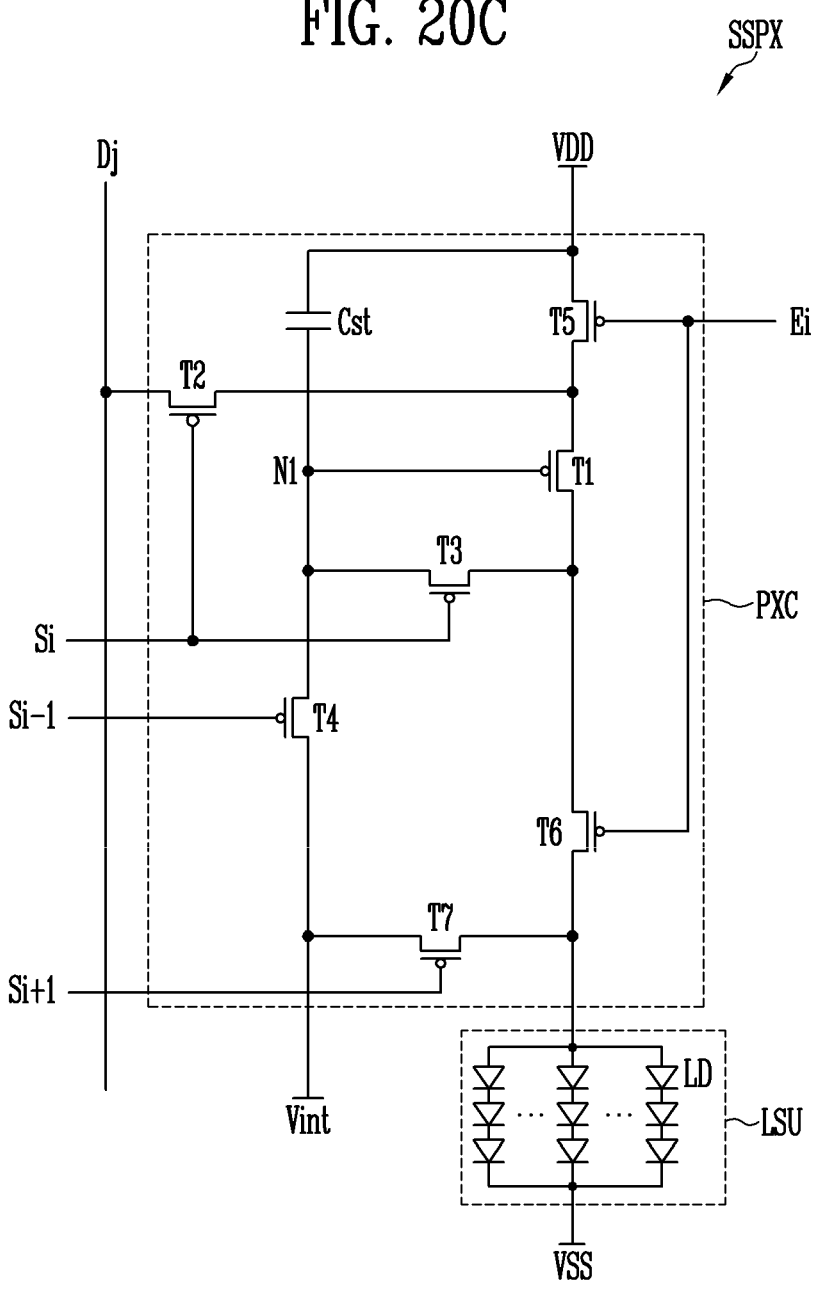
Figure 20D:
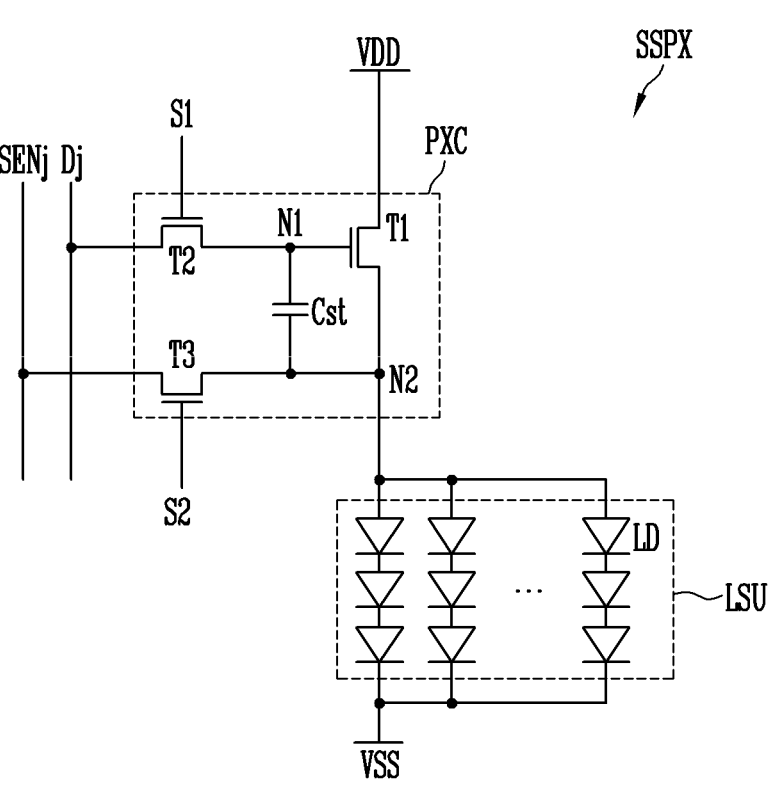
Figure 21:
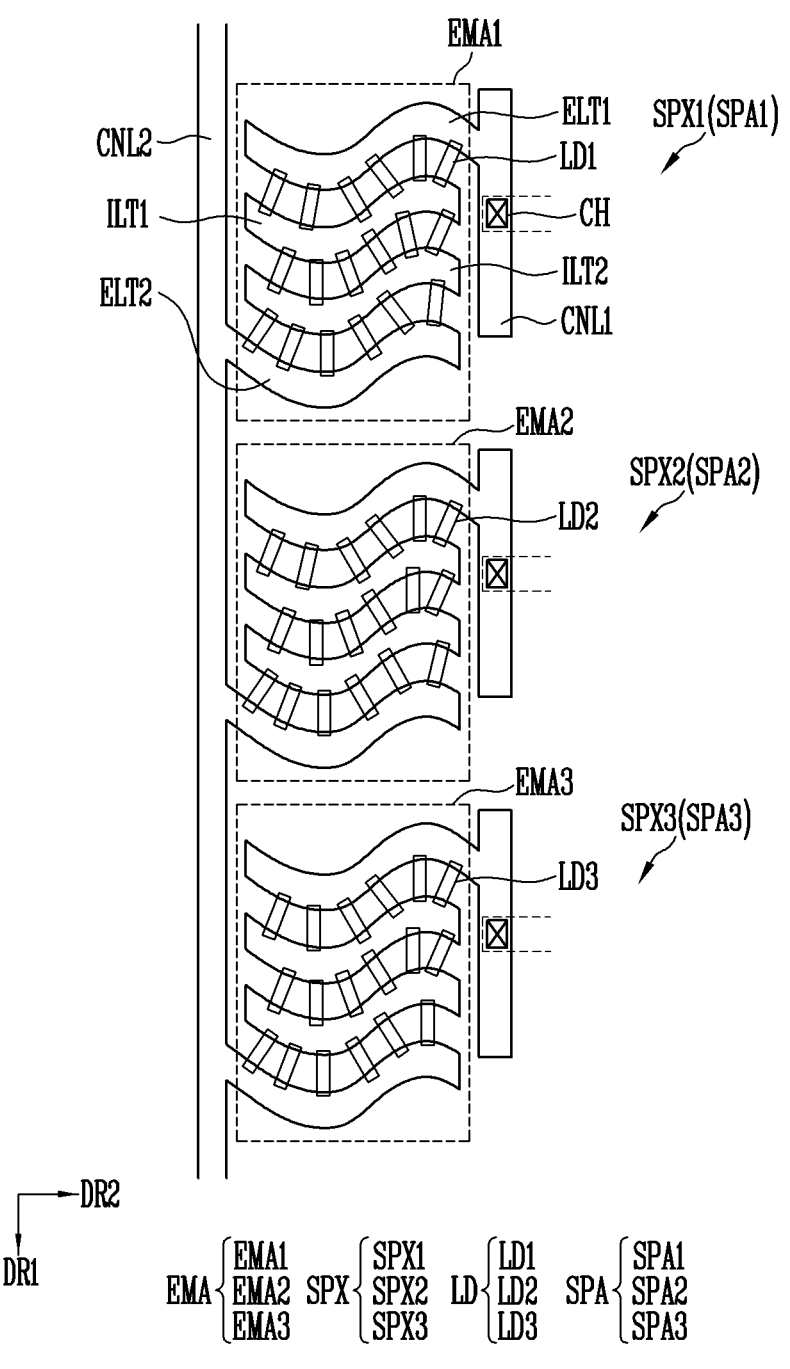
Figure 22:
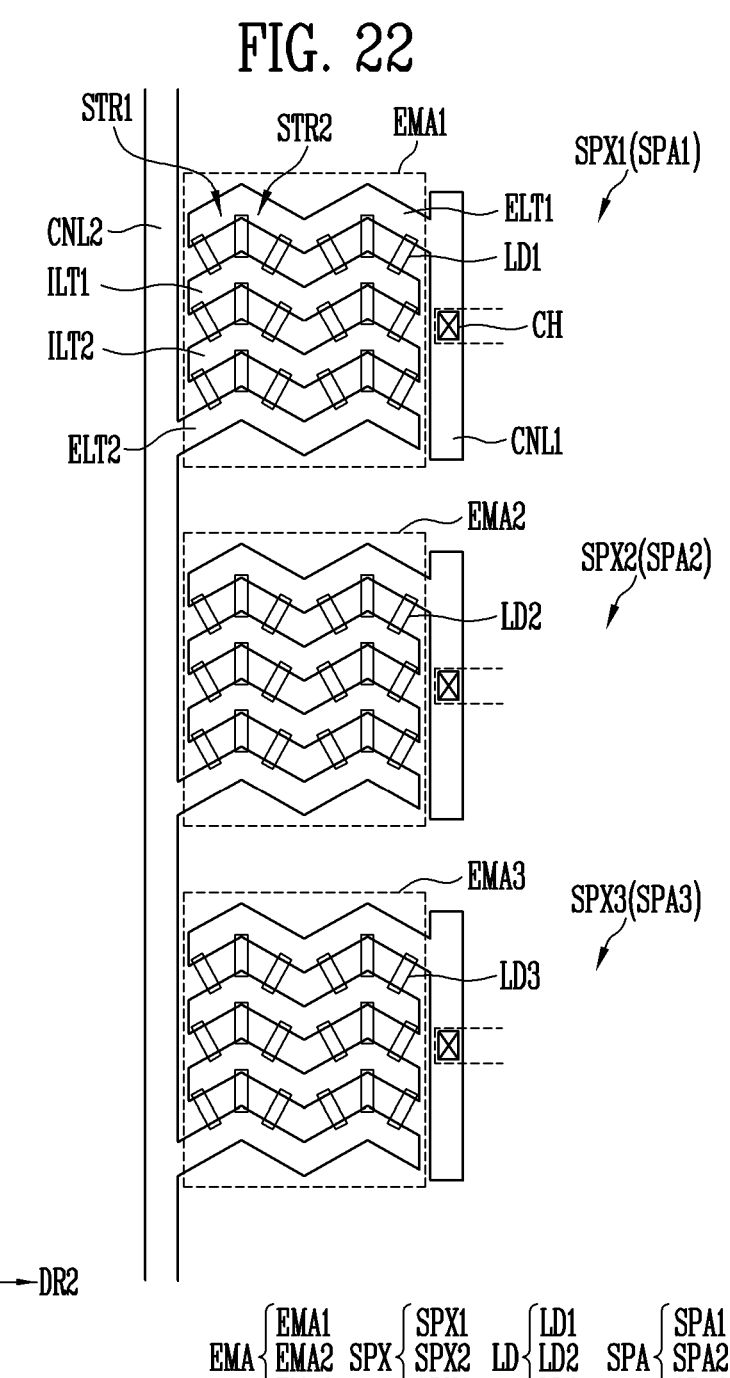
Figure 24:
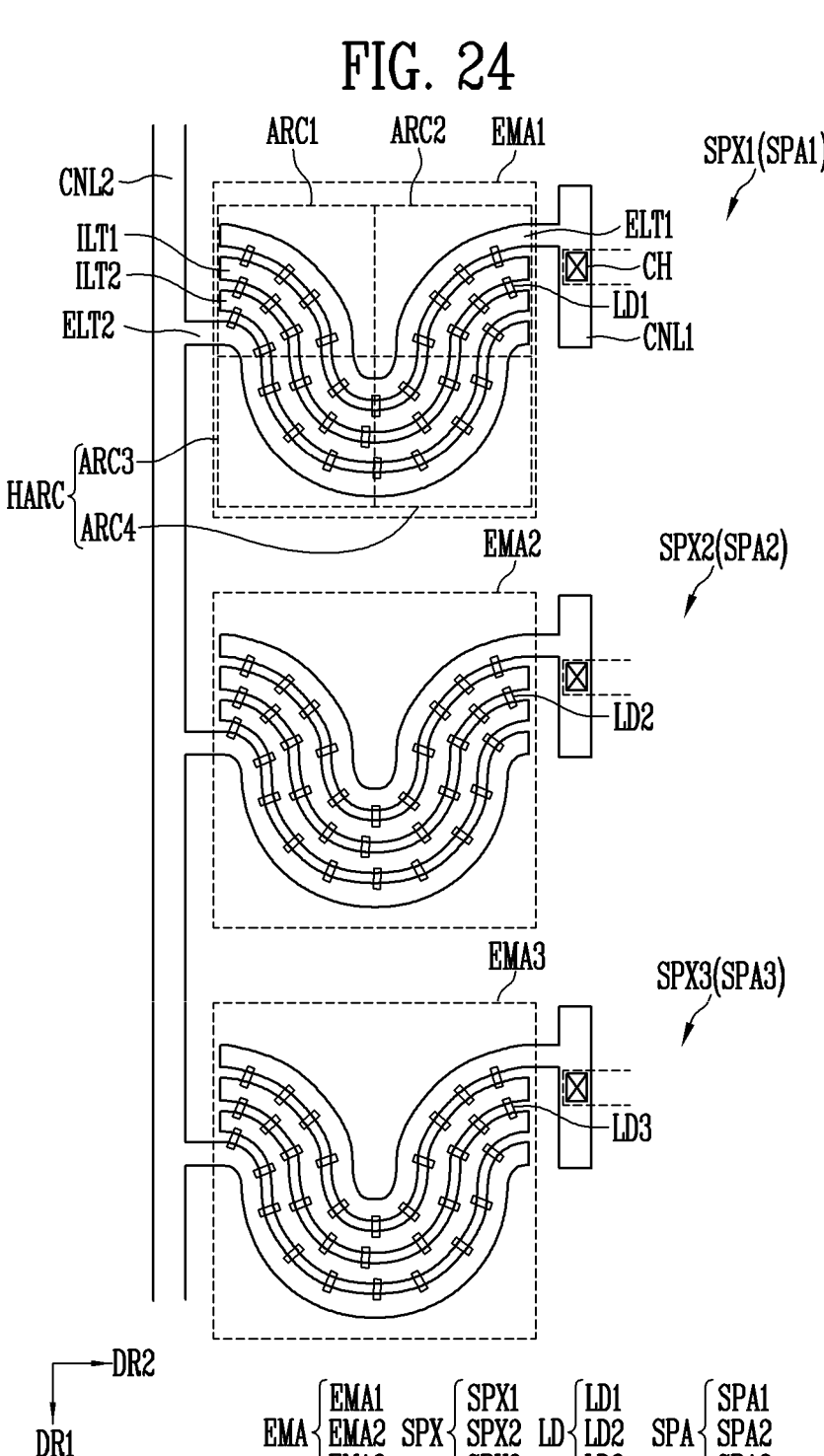
Figure 25:
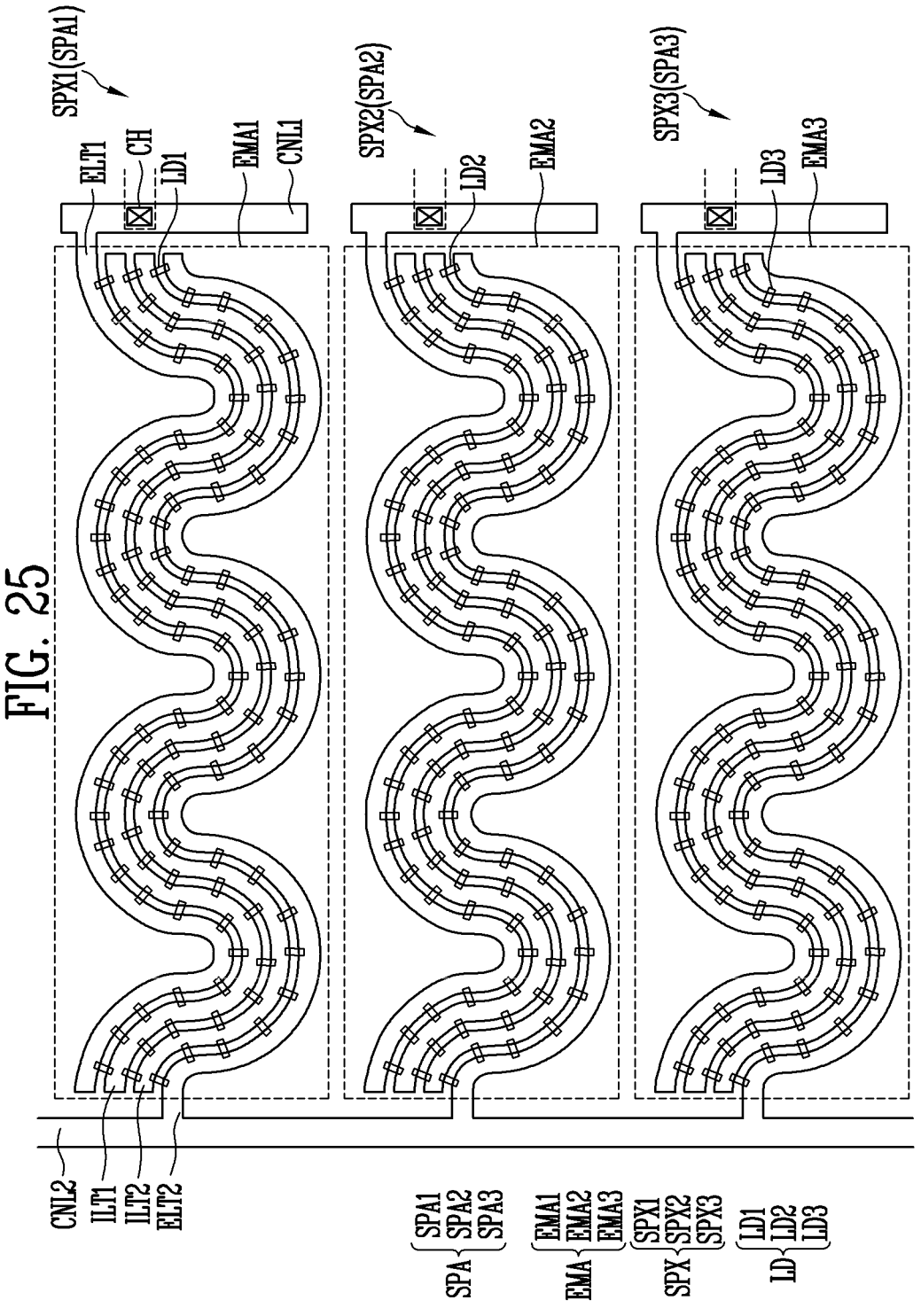
Figure 26:
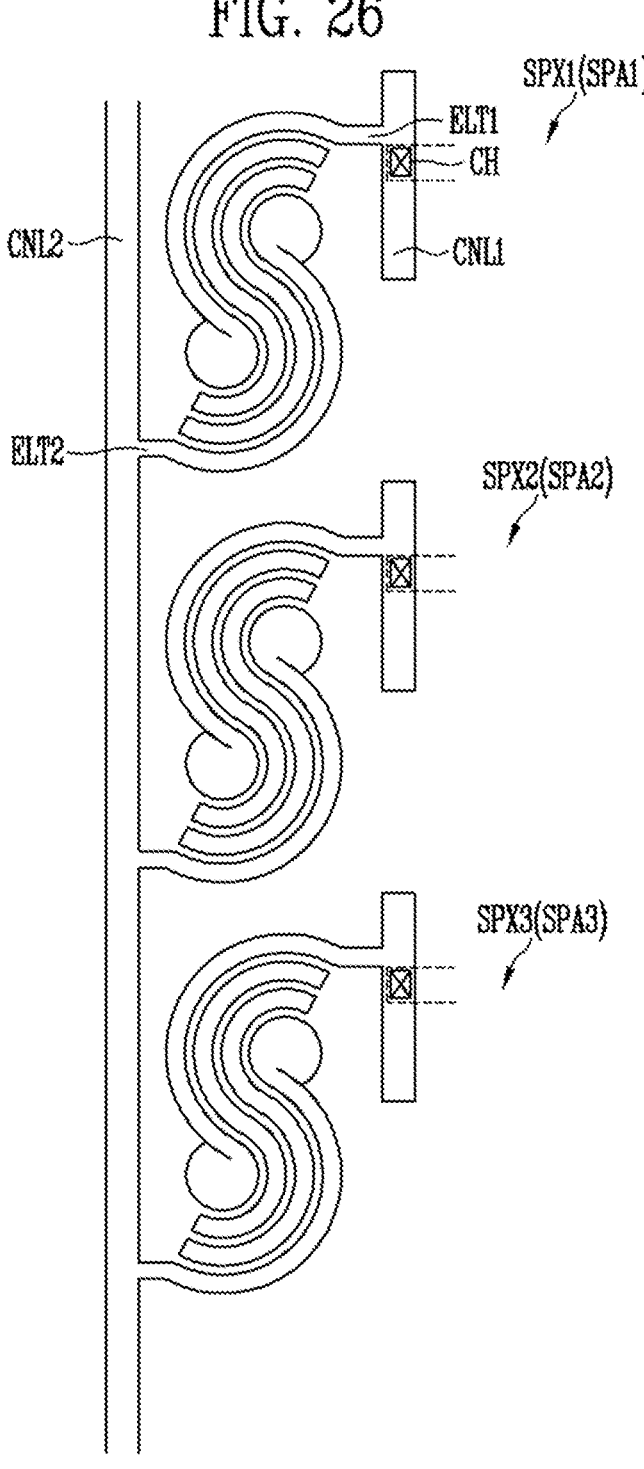
Figure 27:
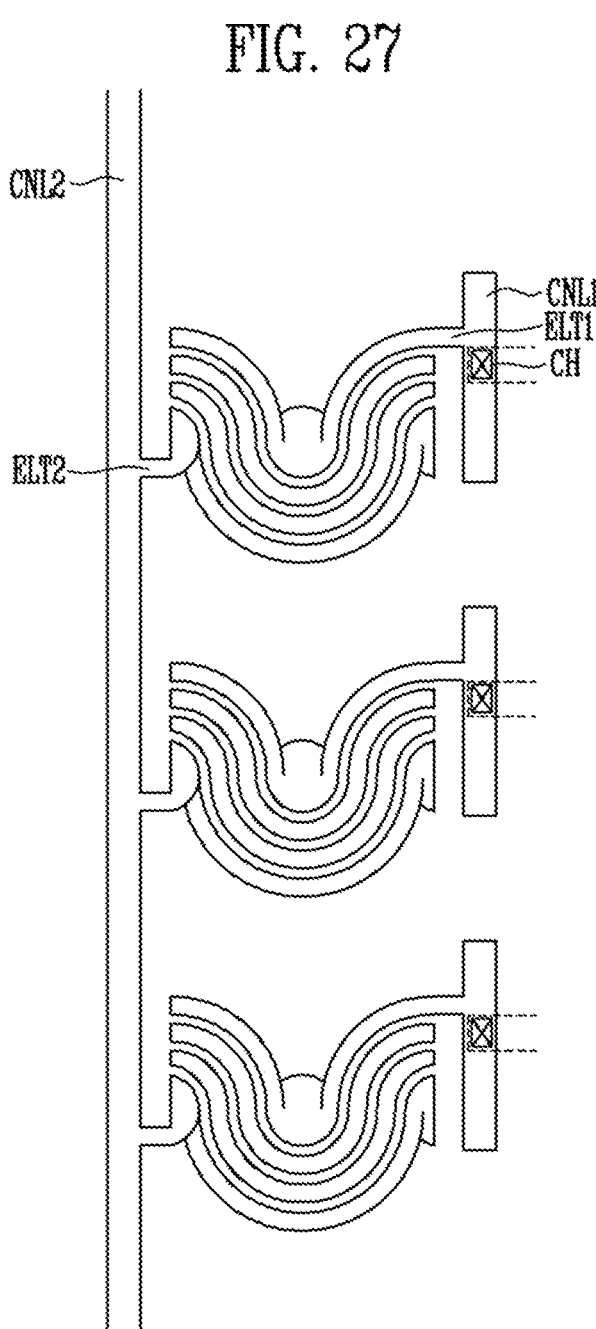
Figure 28:
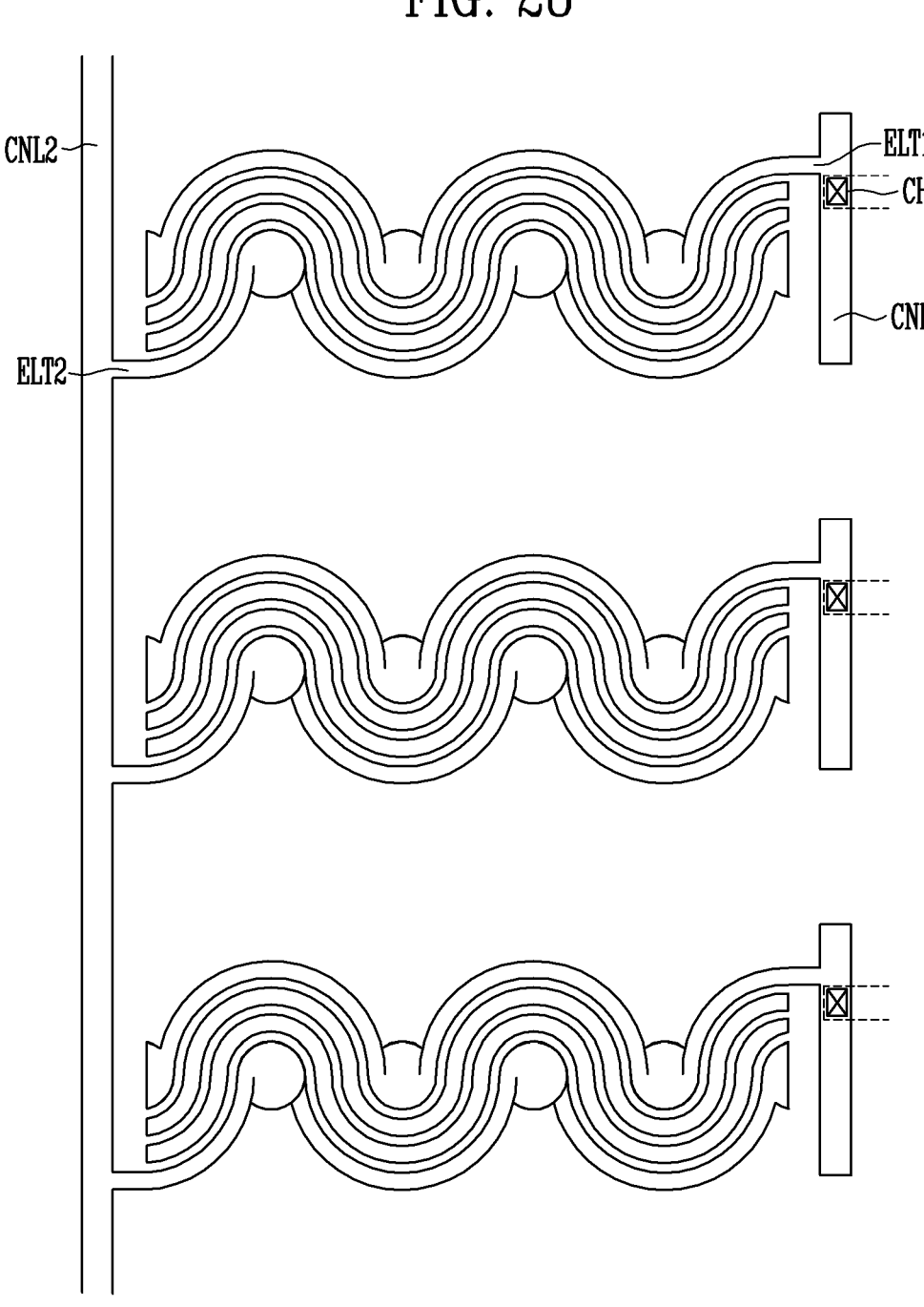
Figure 29:
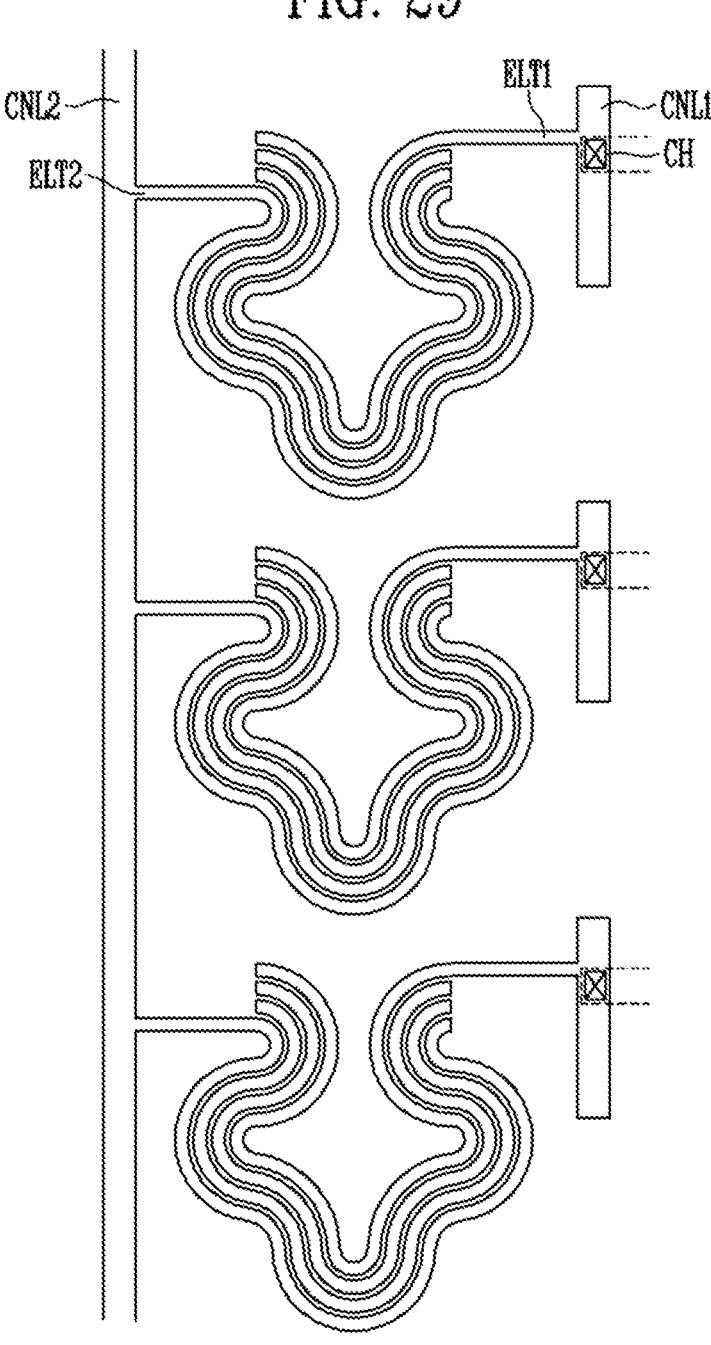
Figure 30:
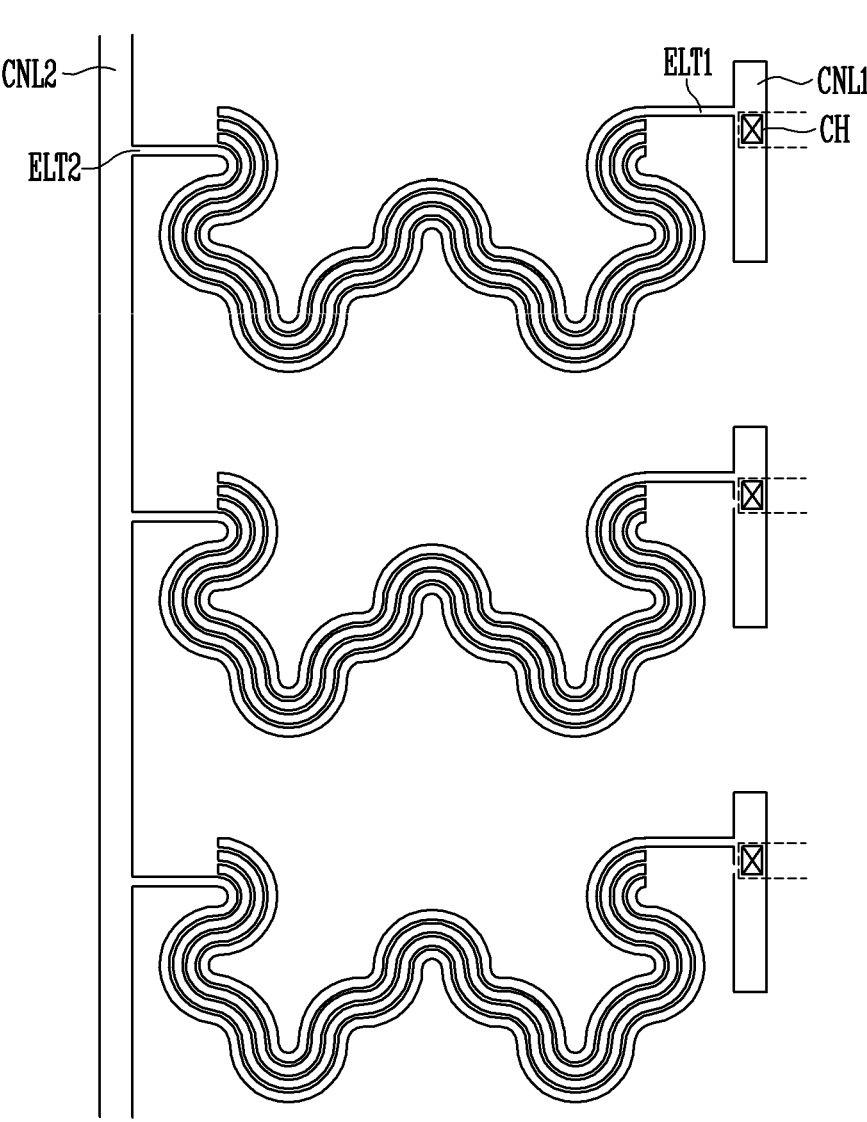

FIGS. 18 and 19 are plan views illustrating other examples of the sub-pixel included in the display device shown in FIG. 4. In the drawings, the light emitting elements are omitted for clarity.

A first electrode ELT1 and a second electrode ELT2 according to an embodiment may each have various shapes by connecting quadrant arc-shaped parts similar to the embodiment shown in FIGS. 12 and 13. The shapes illustrated in FIGS. 18 and 19 are only for illustrative purposes, and the present disclosure is not limited to the illustrated shapes.

FIGS. 20A to 20D are circuit diagrams illustrating another example of the unit pixel included in the sub-pixel shown in FIG. 5.

Referring to FIGS. 20A to 20D, disposition of the light source unit LSU differs from that of the circuit diagram shown in FIGS. 6A to 6D. Light emitting elements LD in each light source unit LSU may be connected in a series/parallel combination structure.

Each light source unit LSU may include light emitting elements LD connected to each other in series. Because the light emitting elements LD are connected to each other in series, voltage distribution efficiency may be improved and capacity design of the first transistor (or driving transistor) T1 may be facilitated. Furthermore, because the light emitting elements LD may be connected in a series/parallel combination configuration, power loss attributable to line resistance may be mitigated. Although an example in which three light emitting elements LD are connected to each other in series is shown, the number of light emitting elements LD is not limited thereto.

Hereinafter, the shapes of electrodes in the emission area to which the circuit diagrams of FIGS. 20A to 20D can be applied will be described. In the following embodiments, there will be described examples in which each of the sub-pixels includes one unit pixel.

FIGS. 21 to 30 are plan views illustrating various examples of the sub-pixel (or the unit pixel) to which the examples shown in FIGS. 20A to 20D may be applied. The shape of a first electrode and a second electrode shown in FIGS. 21 to 30 may have the same shape(s) as that shown in FIGS. 7, 10 to 12, and 14 to 19 so that repetitive explanation thereof will be omitted.

In the embodiments shown in FIGS. 21 to 30, the first electrode ELT1 and the second electrode ELT2 may be respectively defined as electrodes that extend from or are directly connected to the first connection electrode CNL1 and the second connection electrode CNL2, respectively.

The first electrode ELT1 and the second electrode ELT2 may be spaced apart from each other by a distance (e.g., a predetermined distance) and disposed in parallel to each other. At least one island electrode ILT1, ILT2 may be disposed between the first electrode ELT1 and the second electrode ELT2. An example will be described in which two island electrodes ILT1 and ILT2 (e.g., a first island electrode ILT1 and a second island electrode ILT2) are disposed between the first electrode ELT1 and the second electrode ELT2. The present disclosure, however, is not limited to the number or shape of the island electrodes ILT1 and ILT2.

The first island electrode ILT1 and the second island electrode ILT2 may be disposed between the first electrode ELT1 and the second electrode ELT2 such that the first electrode ELT1, the second electrode ELT2, the first island electrode ILT1, and the second island electrode ILT2 are spaced apart from each other by distances (e.g., predetermined distances) and are parallel to each other.

In an embodiment, the distances between the first electrode ELT1, the second electrode ELT2, the first island electrode ILT1, and the second island electrode ILT2 may be the same as each other.

In an embodiment, the first island electrode ILT1 and the second island electrode ILT2 may be disposed on the same layer as that of the first electrode ELT1 and the second electrode ELT2. The first island electrode ILT1 and the second island electrode ILT2 may be patterned along with the first electrode ELT1 and the second electrode ELT2.

The first island electrode ILT1 and the second island electrode ILT2 are not directly connected to the first connection electrode CNL1 and the second connection electrode CNL2 and may be electrically connected to the first connection electrode CNL1 and the second connection electrode CNL2 by light emitting elements LD disposed between the first electrode ELT1 and the second electrode ELT2.

The alignment directions of the light emitting elements LD may be changed depending on the aligned positions thereof. Consequently, the viewing angle of the display device may be improved in the same manner as that of the previous embodiments. Furthermore, the display device may have the above-stated improvements that are obtained by connecting the light emitting elements LD in a series/parallel combination configuration.

Figure 31:
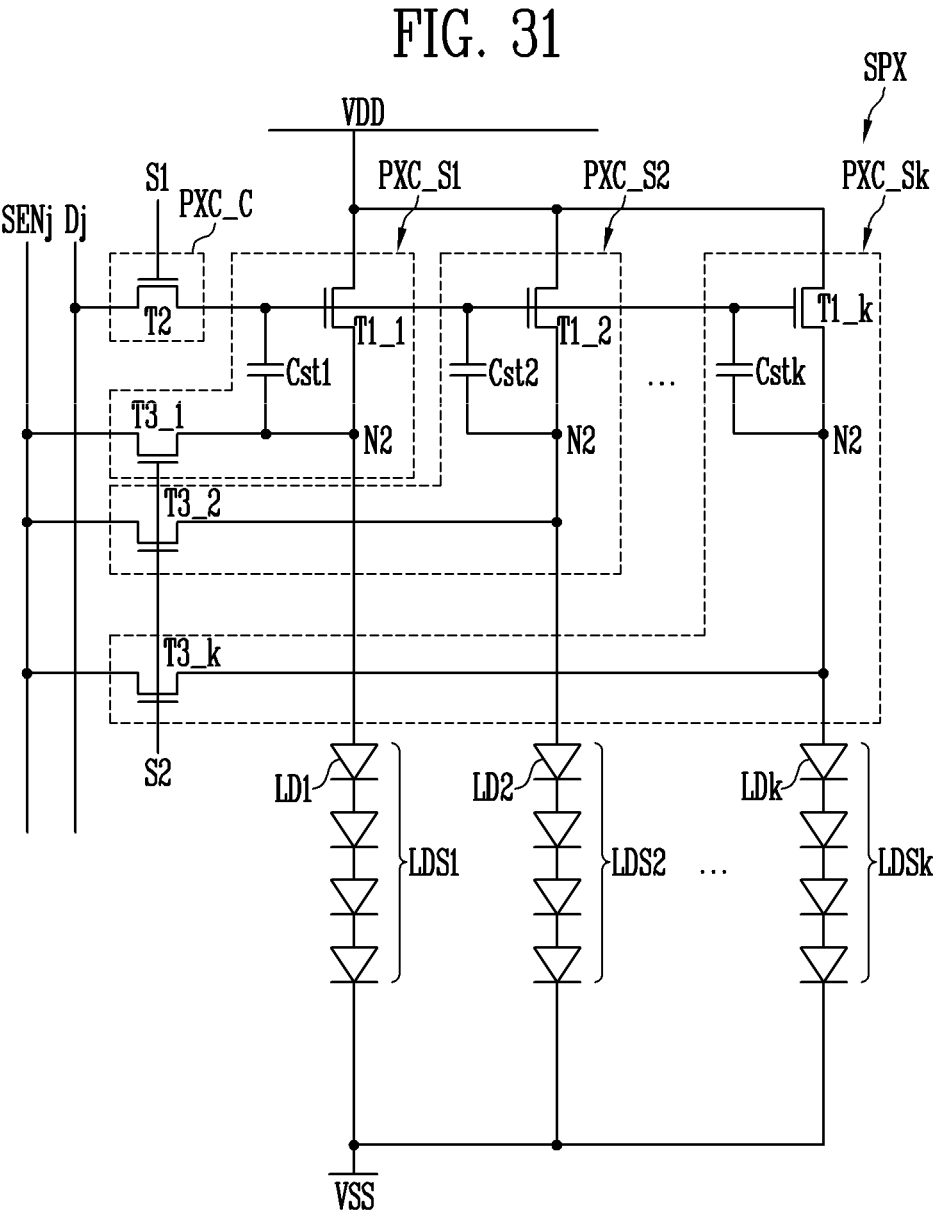
FIG. 31 is a circuit diagram illustrating an example of the unit pixel included in the sub-pixel shown in FIG. 5.
Figure 32:
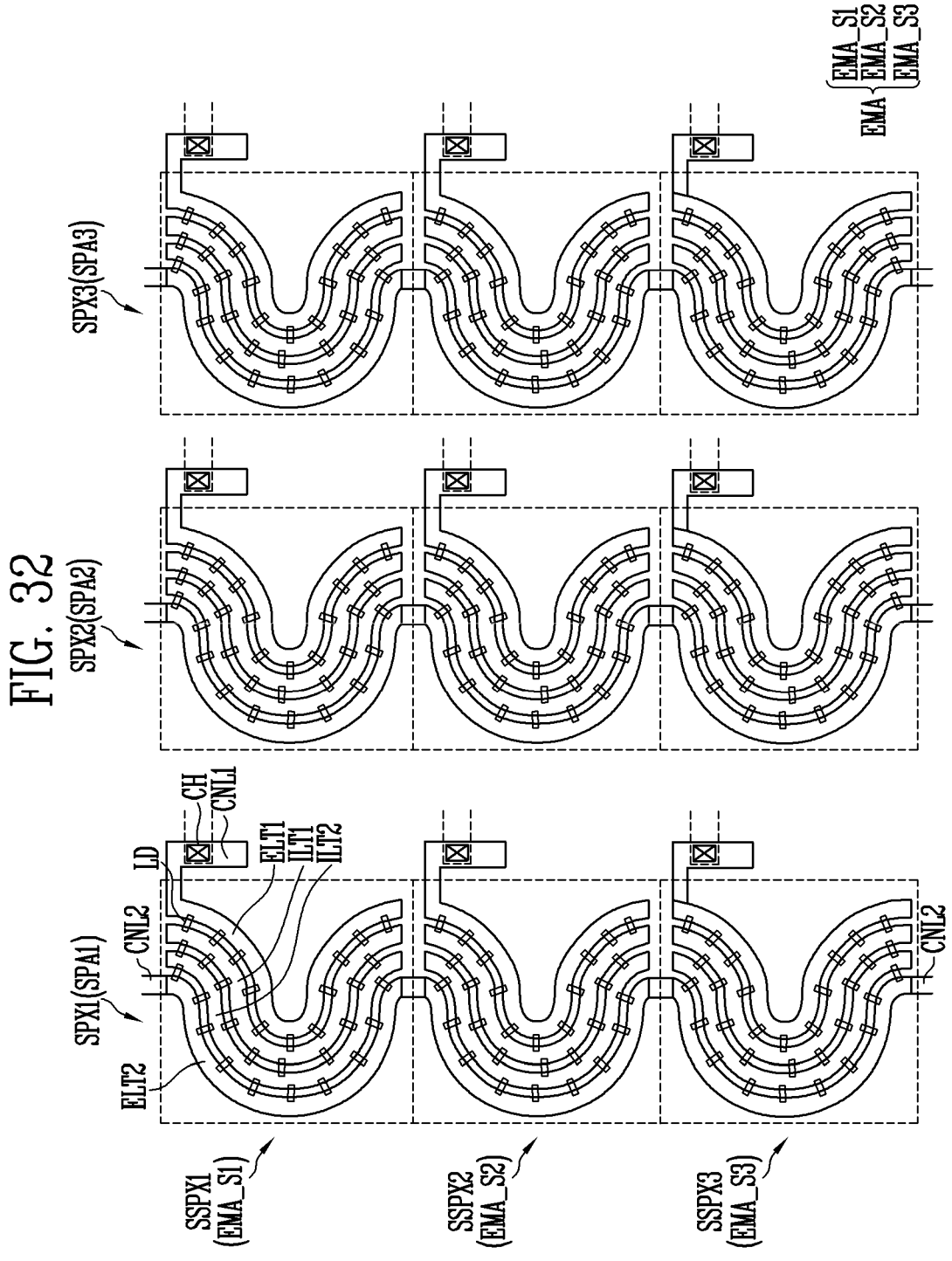
FIG. 32 is a plan view illustrating an example of the sub-pixel shown in FIG. 31.

FIG. 31 is a circuit diagram illustrating another example of the unit pixel included in the sub-pixel shown in FIG. 5, and FIG. 32 is a plan view illustrating an example of the sub-pixel shown in FIG. 31. In Examples will be described in which each of the sub-pixels includes three unit pixels.

Referring to FIG. 31, the sub-pixel SPX may include light emitting elements LD1 to LDk configured to emit light at a luminance corresponding to a data signal. Furthermore, the sub-pixel SPX may include a common circuit PXC_C and sub-pixel circuits PXC_S1 to PXC_Sk configured to independently drive the respective light emitting elements LD1 to LDk.

The common circuit PXC_C of the sub-pixel SPX may provide, to the sub-pixel circuits PXC_S1 to PXC_Sk, a data signal provided from the data line Dj in response to a scan signal provided from the scan line Si.

The common circuit PXC_C may include a second transistor T2.

Each of the sub-pixel circuits PXC_S1 to PXC_Sk may store a data signal provided from the common circuit PXC_C and may provide driving current corresponding to the stored data signal to the corresponding light emitting element (e.g., to one of the light emitting elements LD1 to LDk).

In an embodiment, the sub-pixel circuits PXC_S1 to PXC_Sk may include the first transistor T1, the third transistor T3, and the storage capacitor Cst that are described above with reference to FIG. 6D.

For example, the first sub-pixel circuit PXC_S1 may provide, to a first light emitting element string LDS1 (or a first sub-light source unit), a first driving current corresponding to a data signal provided from the common circuit PXC_C. Similarly, the second sub-pixel circuit PXC_S2 may provide, to a second light emitting element string LDS2, a second driving current corresponding to a data signal provided from the common circuit PXC_C. The k-th sub-pixel circuit PXC_Sk may provide, to a k-th light emitting element string LDSk, a k-th driving current corresponding to a data signal provided from the common circuit PXC_C. In the illustrated embodiment, each light emitting element string includes three light emitting elements connected to each other in series.

Each of the sub-pixel circuits PXC_S1 to PXC_Sk may store a data signal in the storage capacitor Cst and may provide driving current corresponding to the corresponding data signal to the corresponding light emitting element (e.g., the corresponding light emitting element of the light emitting elements LD1 to LDk). Therefore, the light emitting elements LD1 to LDk may more uniformly emit light.

Referring to FIG. 32, the emission area EMA may be divided into first to third sub-emission areas EMA.

In embodiments, the first electrode ELT1 may be disposed in each of the sub-emission areas EMA_S1, EMA_S2, and EMA_S3. The second electrode ELT2 may be disposed in the entirety of the emission area EMA, for example, across the sub-emission areas. The first island electrode ILT1 and the second island electrode ILT2 may be disposed between the first and second electrodes ELT1 and ELT2 in the corresponding sub-emission area (e.g., in the first sub-emission area EMA_S1).

The first electrode ELT1, the second electrode ELT2, and the island electrodes ILT1 and ILT2 may each be a single-layer or may have multi-layer structure. Furthermore, each of the first electrode ELT1, the second electrode ELT2, and the island electrodes ILT1 and ILT2 may protrude in an upward direction (e.g., a height-wise direction or a thickness-wise direction of the base layer SUB1) by a partition wall that is disposed to overlap with the corresponding electrode.

The light emitting elements LD may each be disposed between two adjacent electrodes of the first electrode ELT1, the second electrode ELT2, and the island electrodes ILT1 and ILT2 and may be electrically connected to each of the two adjacent electrodes. For example, a light emitting element LD may be disposed between the first electrode ELT1 and the first island electrode ILT1 adjacent to the first electrode ELT1. A first end of the light emitting element LD may be electrically connected to the first electrode ELT1, and a second end of the light emitting element LD may be electrically connected to the first island electrode ILT1. Similarly, a light emitting element LD may be disposed between the first island electrode ILT1 and the second island electrode ILT2 adjacent to the first island electrode ILT1. A first end of the light emitting element LD may be electrically connected to the first island electrode ILT1, and a second end of the light emitting element LD may be electrically connected to the second island electrode ILT2. Similarly, a light emitting element LD may be disposed between the second island electrode ILT2 and the second electrode ELT2 adjacent to the second island electrode ILT2. A first end of the light emitting element LD may be electrically connected to the second island electrode ILT2, and a second end of the light emitting element LD may be electrically connected to the second electrode ELT2. In this way, the light emitting elements LD in the first sub-emission area EMA_S1 may be connected in series between the first and second electrodes ELT1 and ELT2.

The first electrode ELT1, the second electrode ELT2, and the island electrodes ILT1 and ILT2 may each extend with a bent portion. Each of the first electrode ELT1, the second electrode ELT2, and the island electrodes ILT1 and ILT2 may have various shapes in the same manner as that of the above-described embodiments.

Although the embodiment illustrated in FIG. 32 has light emitting elements LD that are connected to each other in series in one sub-emission area (e.g., the first sub-emission area EMA_S1), the light emitting elements LD are not limited thereto. For example, in the one sub-emission area, at least some of the light emitting elements LD may be connected to other light emitting elements in parallel. For example, in FIG. 32, the light emitting elements LD in the one sub-emission area may be arranged in a series/parallel combined connection configuration.

Although embodiments of the present disclose have been disclosed, those skilled in the art will appreciate that the present disclosure can be implemented in other forms without departing from the scope and spirit of the present disclosure. Therefore, it should be understood that the embodiments described herein are for illustrative purposes and do not limit the present disclosure.

The invention claimed is:

1. A display device comprising:
   a first power line configured to transmit a first power supply;
   a second power line configured to transmit a second power supply;
   a first connection electrode extending in a first direction and electrically connected to the first power line;
   a second connection electrode spaced apart from the first connection electrode and electrically connected to the second power line;
   a first electrode extending from the first connection electrode;
   a second electrode extending from the second connection electrode and parallel to the first electrode with a distance therebetween; and
   a plurality of light emitting elements, each of the plurality of light emitting elements having a first end electrically connected to the first electrode and a second end electrically connected to the second electrode,
   wherein each of the first electrode and the second electrode has a bent portion.

2. The display device according to claim 1, wherein the first electrode and the second electrode extend from the first connection electrode and the second connection electrode, respectively, in a second direction, the second direction crossing the first direction.

3. The display device according to claim 2, wherein the bent portion has a shape protruding in the first direction.

4. The display device according to claim 3, wherein each of the first electrode and the second electrode has a curved shape or a zigzag shape.

5. The display device according to claim 4, wherein each of the first electrode and the second electrode has a shape formed by connecting a plurality of quadrant arcs.

6. The display device according to claim 4, wherein each of the first electrode and the second electrode has a connection portion having a shape formed by connecting a plurality of quadrant arcs, and
   wherein an inflection point is in the connection portion.

7. The display device according to claim 1, wherein each of the light emitting elements comprises a rod-shaped light emitting diode having a size ranging from a nanoscale to a microscale.

8. The display device according to claim 7, wherein at least some of the plurality of light emitting elements are aligned such that a longitudinal direction thereof corresponds to a normal direction with respect to a direction in which the first electrode and the second electrode extend.

9. The display device according to claim 1, wherein the first electrode or the second electrode has a portion having a different width.

10. The display device according to claim 1, further comprising an island electrode between the first electrode and the second electrode spaced apart from the first connection electrode and the second connection electrode.

11. The display device according to claim 10, wherein some of the plurality of light emitting elements are between the first electrode and the island electrode, and
   wherein others of the plurality of light emitting elements are between the second electrode and the island electrode.

12. The display device according to claim 11, wherein the island electrode is parallel to the first electrode and the second electrode and is spaced apart from the first electrode and the second electrode.

13. The display device according to claim 12, wherein the island electrode has a bent portion.

14. The display device according to claim 10, wherein the plurality of light emitting elements are connected to each other in series and parallel.

15. The display device according to claim 1, wherein each of the first electrode and the second electrode has a linear portion extending in a second direction, the second direction crossing the first direction.

16. A display device comprising:
   a substrate having an emission area,
   a first connection electrode in the emission area of the substrate, the first connection electrode being electrically connected to a first power line configured to transmit a first power supply;
   a second connection electrode in the emission area of the substrate, the second connection electrode being electrically connected to a second power line configured to transmit a second power supply;
   a first electrode in the emission area of the substrate, the first electrode being electrically connected to the first connection electrode;
   a second electrode in the emission area of the substrate on a same layer as the first electrode, facing the first electrode, and spaced apart from the first electrode, the second electrode being electrically connected to the second connection electrode; and
   a plurality of light emitting elements between the first electrode and the second electrode in a plan view,
   wherein each of the first electrode and the second electrode has a bent portion in a plan view.

17. The display device according to claim 16, further comprising:

a first contact electrode connecting a first end of each of the light emitting elements to the first electrode; and a second contact electrode connecting a second end of each of the light emitting elements to the second electrode.

18. The display device according to claim 16, further comprising a first island electrode and a second island electrode between the first electrode and the second electrode, wherein distances between the first electrode, the first island electrode, the second island electrode, and the second electrode are equal to each other.

19. The display device according to claim 18, wherein the first electrode, the first island electrode, the second island electrode, and the second electrode are parallel with each other.

20. The display device according to claim 19, wherein each of the first island electrode and the second island electrode has a bent portion.

\* \* \* \* \*